US006178139B1

United States Patent
Hirobe et al.

(10) Patent No.: US 6,178,139 B1
(45) Date of Patent: Jan. 23, 2001

(54) SEMICONDUCTOR MEMORY DEVICE COMPRISED OF A DOUBLE DATA RATE-SYNCHRONOUS DYNAMIC RANDOM ACCESS MEMORY

(75) Inventors: Atsunori Hirobe; Kyoichi Nagata, both of Tokyo (JP)

(73) Assignee: NEC Corporation (JP)

(*) Notice: Under 35 U.S.C. 154(b), the term of this patent shall be extended for 0 days.

(21) Appl. No.: 09/427,955

(22) Filed: Oct. 27, 1999

(30) Foreign Application Priority Data

Oct. 28, 1998 (JP) .................................................. 10-307645

(51) Int. Cl.[7] ....................................................... G11C 8/00
(52) U.S. Cl. ................ 365/233; 365/230.04; 365/230.08
(58) Field of Search ............................... 365/233, 230.04, 365/230.08

(56) References Cited

U.S. PATENT DOCUMENTS 5,973,911 * 10/1999 Tsuchida et al. ..................... 365/233
5,990,730 * 11/1999 Shinozaki .............................. 327/544

FOREIGN PATENT DOCUMENTS 10-140128  5/1998 (JP) ............................. G11C/11/401

* cited by examiner

Primary Examiner—David Nelms
Assistant Examiner—Connie C. Yoha
(74) Attorney, Agent, or Firm—Hayes, Soloway,Hennessey, Grossman & Hage, P.C.

(57) ABSTRACT

A semiconductor memory device which enables holding of two or more addresses and selecting of an address output corresponding to kinds of commands with a sufficient operational margin. The semiconductor memory device of the present invention is so configured that a command decoder generates a first controlling signal after a first period following the inputting of a read command, a second controlling signal after a second period following the inputting of a write command, and an operation instructing signal to be fed to a column control circuit in response to first and second controlling signals, and a burst counter makes an input address delayed by first and second periods and outputs the address delayed by the first period as a read address in response to a first controlling signal and the address delayed by the second period as a write address in response to a second controlling signal.

38 Claims, 52 Drawing Sheets

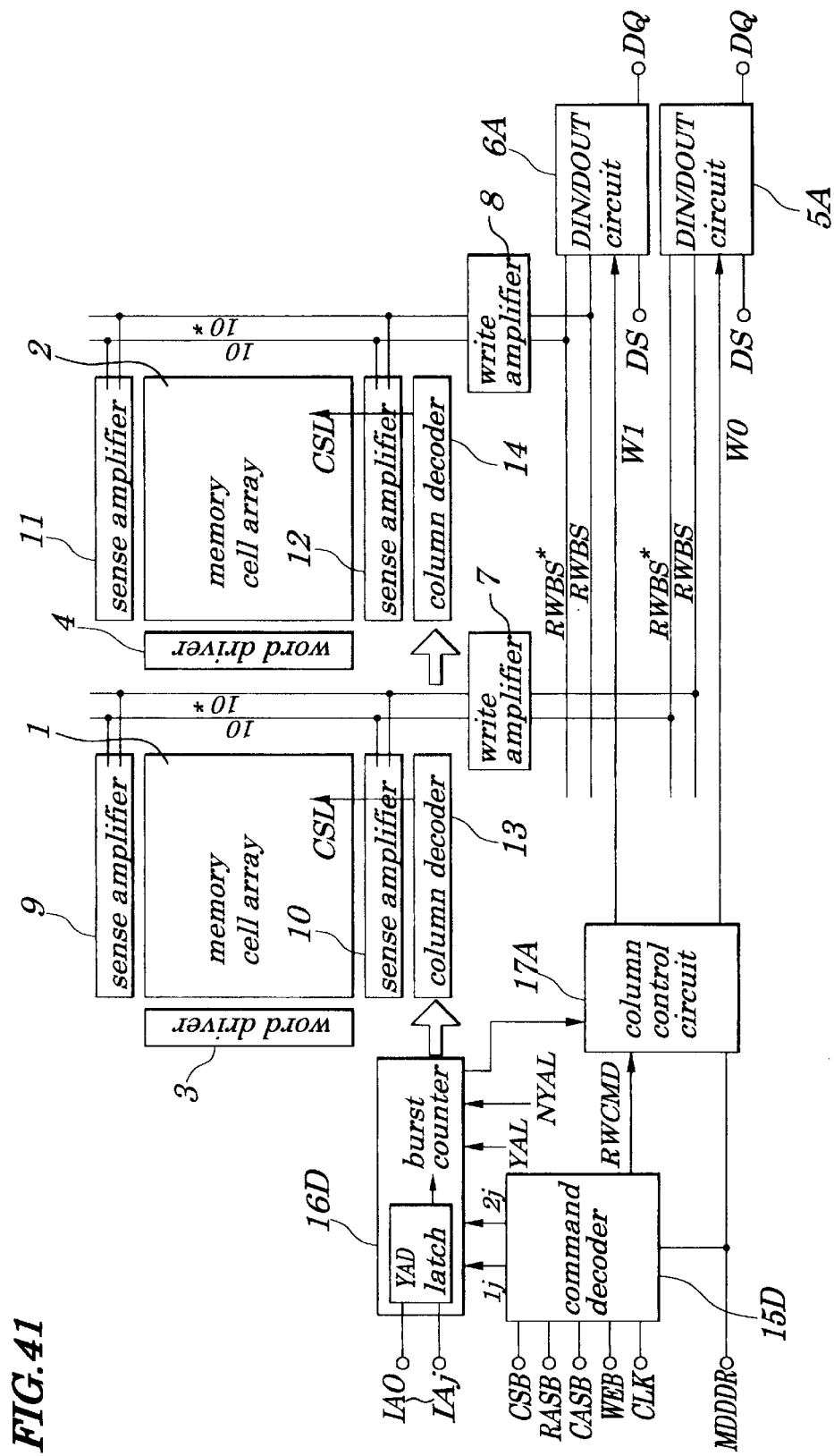

SEMICONDUCTOR MEMORY DEVICE COMPRISED OF A DOUBLE DATA RATE-SYNCHRONOUS DYNAMIC RANDOM ACCESS MEMORY

BACKGROUND OF THE INVENTION

1. Field of the Invention

The present invention relates to a semiconductor memory device and more particularly to a semiconductor memory device comprised of a DDR-SDRAM (Double Data Rate-Synchronous Dynamic Random Access Memory).

2. Description of the Related Art

As a CPU (central processing unit) to control operations of a computer is becoming increasingly faster, a SDRAM (synchronous dynamic random access memory) adapted to operate in synchronization with a clock is used widely. In order to achieve further faster CPUs, 2 bit prefetch-type SDRAMs have come into use which allow simultaneous writing and reading of 2 bits of data.

FIG. 50 is a block diagram showing an example of configurations of a conventional semiconductor memory device comprised of 2 bit prefetch-type SDRAMs. FIG. 51 is a timing chart explaining operations of the conventional semiconductor memory device at the time of writing of data. FIG. 52 is a timing chart showing operations of the conventional semiconductor memory device at the time of reading of data.

As depicted in FIG. 50, the conventional semiconductor memory device is provided approximately with memory cell arrays 1 and 2, word drivers 3 and 4, DIN/DOUT (Data In/Data Out) circuits 5 and 6, write amplifiers 7 and 8, sense amplifiers 9, 10, 11 and 12, column decoders 13 and 14, a command decoder 15, a burst counter 16 and a column control circuit 17.

The memory cell arrays 1 and 2 contain two or more memory cells arranged in a matrix form. Word drivers 3 and 4 are used to drive each word line for the memory arrays 1 and 2. The DIN/DOUT circuits 5 and 6 are adapted to output, in response to write operation controlling signals W0 and W1, data outputs RWBS and RWBS* (the symbol * representing an inversion signal) composed of complementary signals to respond to data inputs DQ fed through even-numbered and odd-numbered data buses respectively. They are also adapted to output data outputs DQ to even-numbered and odd-numbered data buses in response to read operation controlling signals R0 and R1 when receiving data inputs RWBS and RWBS* composed of complementary signals. The write amplifiers 7 and 8 are used to amplify data outputs RWBS and RWBS* and to output writing inputs IO and IO* composed of complementary signals. The sense amplifiers 9 and 10 are used to amplify a writing voltage to be applied to memory cells connected to each bit line constituting the memory cell array 1 as well as a reading voltage to be supplied from the memory cell. The sense amplifiers 11 and 12 are used to amplify the writing voltage to be applied to memory cells connected to each bit line constituting the memory cell array 1 as well as the reading voltage to be supplied from the memory cell.

The column decoders 13 and 14 are adapted to select each bit line for each of memory cell arrays 1 and 2 in response to address inputs and to drive a column selecting line CSL selected. The command decoder 15 is used to generate a read/write command RWCMD and address controlling signals YAL and NYAL, each being an internal command signal, in response to external command signals CSB (command select bar), RASB (RAS bar), CASB (CAS bar), WEB (write enable bar) and a clock signal CLK. The burst counter 16, after generating address outputs in response to address inputs composed of, for example, 8 bits with a timing defined by the address controlling signal YAL, perform repeated processing of sequentially generating an address output with 2 added at each time of the occurrence of an address controlling signal NYAL, every two clocks, for a period corresponding to a specified burst length (e.g., word length). The column control circuit 17 serves to output write operation controlling signals W0 and W1 or read operation controlling signals R0 and R1 to be fed to the DIN/DOUT circuits 5 and 6 in response to a read/write command RWCMD from the command decoder 15 and an address output from the burst counter 16.

Next, operations of the conventional semiconductor memory device at the time of writing by referring to FIGS. 50 and 51. Let it be assumed that a command input CMD is a write command W CMD and that D0, D1, D2 and D3 are inputted as data input DQ in response to a clock signal CLK. At this point, in response to the read/write command RWCMD from the command decoder 15, write operation controlling signals W0 and W1 are outputted from the column control circuit 17.

On the other hand, when address inputs IA0 to IAj are generated in response to designated address signals A0 to Aj from the CPU (not shown), address signals YP0 to YPj are outputted from the burst counter 16 in response to an address controlling signal from the command decoder, and then 2 clocks later, in response to the address controlling signal NYAL, an address signal obtained by adding 2 (in the case of 2 bit prefetch type) to addresses YP0 to YOj is outputted from the burst counter 16.

At this point, even-numbered data D0 and odd-numbered data D1 are outputted from the DIN/DOUT circuits 5 and 6 as data outputs RWBS and RWBS* in response to write operation controlling signals W0 and W1, and data D0 and D1 are outputted as writing data IO and IO* from the write circuits 7 and 8 and are written into memory cells of column selecting lines CSL 0 and 1 defined by addresses YP0 to YOj. Moreover, in response to subsequent write operation controlling signals W0 and W1, data D2 and D3 are outputted as data outputs RWBS and RWBS*, and data D2 and D3 are outputted as writing data IO and IO* and are written into memory cells of column selecting lines CSL 2 and 3 defined by addresses YP0 to YPj (+2) as well.

Next, operations of the conventional semiconductor memory device at the time of reading of data by referring to FIGS. 50 and 52 are hereafter described.

When the command input CMD is a read command R CMD and address inputs IA0 to IAj are generated in response to designated address signals A0 to Aj from the CPU, address signals YP0 to YPj are outputted from the burst counter 16 in response to an address controlling signal YAL from the command decoder 15, and then an address obtained by adding 2 to address signals YP0 to YPj is outputted from the burst counter 16 in response to the address controlling signal NYAL. This causes Q0 and Q1 as read data IO and IO* read out from column selecting lines CSL0 and 1 defined by address signals YP0 to YPj to be outputted and Q2 and Q3 to be outputted from column selecting lines CSL 2 and 3 defined by address signals YP0 to YPj (+2).

On the other hand, the column control circuit 17 is used to output, every 2 clocks, read operation controlling signals R0 and R1 in response to the read/write command RWCMD, causing data Q0, Q1, Q2 and Q3 as read data RWBS and RWBS* to be outputted and, as a result, the DIN/DOUT circuits 5 and 6 output, 5 clocks later (CLT=5) which is a specified output timing, data Q0, Q1, Q2 and Q3, every one clock, as read data DQ.

As described above, in the conventional semiconductor memory device composed of the 2 bit prefetch-type SDRAM, in order to have it operate in synchronization with a clock signal and to build up its operational speed, it is necessary to make the transmission of a clock signal faster. However, in a computer using the SDRAM, when the transmission of the clock signal is made faster, a problem of timing skew arises between the clock signal and data input signal, causing a limit to speeding-up of clock signals.

To solve this problem, the DDR-SDRAM is proposed in which capturing of a data input signal is carried out by a data strobe signal and a clock cycle is doubled compared with the data input cycle. The standardization of the DDR-SDRAM is in progress by JEDEC (Joint Electronic Device Engineering Council). The data strobe signal and data input signal are generated by the CPU at the same time. By coupling the data strobe signal and the clock signal using cables having the same length to the SDRAM, the problem of timing skew between them can be avoided and therefore the speeding-up of clock signals and the solution of the problem of timing skew can be achieved at the same time.

After the data input signal is captured by the data strobe signal, to make a conversion so that operations can be controlled by a clock signal, it is necessary to provide full timing margin. To solve this problem, a method is disclosed in Japanese Patent Application No. Hei10-140128.

On the other hand, in the case of the DDR-SDRAM, there is a great difference in operations of internal address signals between writing and reading operations. In the reading cycle, reading operations are made immediately after inputting of address signals captured by a command input, while, in the writing cycle, an address input signal captured by a command is held for a specified period before writing operations are made. If a new command is inputted while the address is held, an address has to be selected depending on types of the command.

SUMMARY OF THE INVENTION

In view of the above, it is an object of the present invention to provide a semiconductor memory device incorporating a DDR-SDRAM which enables holding of two or more addresses and selecting of an address output corresponding to kinds of commands with a sufficient operational margin.

According to a first aspect of the present invention, there is provided a semiconductor memory device comprising:

a controlling means to control the timing of operating a memory section and supplying an address to the memory section in response to an external command;

an address outputting means to generate an address output using an external address input to be outputted to the memory section in accordance with a controlling signal fed from the controlling means; and a column control means to start outputting a write operation controlling signal and a read operation controlling signal to be fed to the memory section in response to an operation instructing signal given by the controlling means;

Whereby the controlling means generates a first controlling signal after a first period following the inputting of a read command, a second controlling signal after a second period following the inputting of a write command and an operation instructing signal to be fed to the column control means in response to the first and second controlling signals; and the address outputting means makes an input address delayed by the first and second periods and outputs the address delayed by the first period as a read address in accordance with the first controlling signal and the address delayed by the second period as a write address in accordance with the second controlling signal.

In the foregoing, a preferable mode is one wherein the controlling means has a first signal generating means to generate the first controlling signal after the first period following the inputting of a read command in accordance with an external command and a second signal generating means to generate the second controlling signal after the second period following the inputting of a write command in accordance with an external command.

Also, a preferable mode is one wherein the controlling means is so configured that, when a collision occurs between the first and second controlling signals, the first controlling signal only is outputted preferentially.

Also, a preferable mode is one wherein the address outputting means is so configured that it has one or more delaying means to make an input address delayed and it makes an input address delayed by the first or second period and selects an output of the delaying means used to make the input address delayed by the first period to read and output it as a read address in accordance with the first controlling signal while selecting an output of the delaying means used to make the input address delayed by the second period to read and output it as a write address in accordance with the second controlling signal.

Also, a preferable mode is one wherein the address outputting means is so configured that it has a delaying means used to make an input address delayed by the first or second period and it makes an input address delayed by the first period and selects a signal in accordance with a first controlling signal to output it as a read address while making an address input delayed by the second period and selecting a signal in accordance with the second controlling signal to output it as a write address.

Also, a preferable mode is one wherein the first period is an arbitrary clock period including zero and the second period is an arbitrary clock period being longer by a specified clock period than the first period.

Also, a preferable mode is one wherein the delaying means is comprised of register circuits holding a signal for one clock period which are connected, in series, by the number of circuits corresponding to the first or second period including zero.

Also, a preferable mode is one wherein the controlling means is so configured that, when a collision occurs between the first and second controlling signals, the second controlling signal only is outputted preferentially.

Furthermore, a preferable mode is one wherein the controlling means is so configured that, when a collision occurs between another controlling signal generated in response to a command other than the read command and write command and the first or second controlling signal, said another controlling signal only is outputted preferentially.

According to a second aspect of the present invention, there is provided a semiconductor memory device comprising:

a controlling means to control the timing of operating a memory section and supplying an address to the memory section in response to an external command;

an address outputting means to generate an address output using an external address input to be outputted to the memory section in accordance with a controlling signal fed from the controlling means; and a column control means to start outputting a write operation controlling signal and a read operation controlling signal to be fed to the memory section in response to an operation instructing signal given by the controlling means;

whereby the controlling means generates a controlling signal after the first period following inputting of a read command and after the second period following the inputting of a read command, a selecting signal which reverses in sign between at the time of inputting of the read command and at the time of inputting of the write command and an operation instructing signal to be fed to said column controlling means in accordance with the controlling signal; and the address outputting means makes an input address delayed by first and second periods, selects the address delayed by the first period or second period in accordance with the selecting signal and outputs it as a read address or write address with a timing defined by the controlling signal.

In the foregoing, it is preferable that the controlling means has a controlling signal generating means to generate the controlling signal after the first period following the inputting of a read command in accordance with an external command and after the second period following the inputting of a write command in accordance with an external command and a selecting signal generating means to generate a selecting signal which reverses in sign between at the time of inputting of a read command and at the time of inputting of a write command.

Also, it is preferable that the controlling means is so configured that, when a collision occurs between a controlling signal generated in accordance with the write command and a controlling signal generated in accordance with the read command, the controlling signal only is preferentially outputted in accordance with the read command.

Also, it is preferable that the address outputting means is provided with one or more the delaying means to make an input address delayed by the first period or by second period and wherein it outputs a signal selected out of outputs including an output of the delaying means used to make the input address delayed by the first period and an output of the delaying means used to make the input address delayed by the second period in accordance with the selecting signal as a read address or a write address with a timing of the controlling signal.

Also, it is preferable that the address outputting means is provided with a delaying means used to make an input address delayed by the first period and by the second period and wherein it generates an output selected, in accordance with the controlling signal, out of signals including the signal obtained by making the input address delayed by the first period or the signal obtained by making the input address delayed by the second period, as a read address or as a write address with a timing of the controlling signal.

Also, it is preferable that the first period is an arbitrary clock period including zero and the second period is an arbitrary clock period being longer by a specified clock period than the first period.

Also, it is preferable that each of the delaying means is comprised of register circuits to hold a signal for one clock period which are connected, in series, by the number of circuits corresponding to the first or second period including zero.

Also, it is preferable that the controlling means is so configured that, when a collision occurs between the first and second controlling signals, the second controlling signal only is outputted preferentially.

Also, it is preferable that the controlling means is so configured that, when a collision occurs between another controlling signal generated in response to a command other than the read command and the write command and the first and second controlling signals, said another controlling signal only is outputted preferentially.

According to a third aspect of the present invention, there is provided a semiconductor memory device comprising:

a controlling means to control the timing of operating a memory section and supplying an address to the memory section in response to an external command;

an address outputting means to generate an address output using an external address input to be outputted to the memory section in accordance with a controlling signal fed from the controlling means; and a column control means to start outputting a write operation controlling signal and a read operation controlling signal to be fed to the memory section in response to an operation instructing signal given by the controlling means;

whereby the controlling means is used to generate a first controlling signal at the time of the occurrence of a read command, a second controlling signal after a first period following the occurrence of the read command, a third controlling signal at the time of the occurrence of a write command, a fourth controlling signal after a second period following the occurrence of the write command, and an operation instructing signal to be fed to the column control means in accordance with the second controlling signal and the fourth controlling signal;

the address outputting means is used to latch an input address in accordance with the first controlling signal, to output the latched signal as a read address in accordance with the second controlling signal, to latch an input address in accordance with the third controlling signal and to output the latched signal as a write address in accordance with a fourth controlling signal.

In the foregoing, a preferable mode is one wherein the controlling means has a first signal generating means to generate the first controlling signal at the time of inputting of a write command in response to an external command, a second signal generating means to generate the second controlling signal after the first period following the occurrence of the read command in response to an external command, a third signal generating means to generate the third controlling signal at the time of inputting of a write command in response to an external command, and a fourth signal generating means to generate the fourth controlling signal after the second period following the occurrence of the write command in response to an external command.

Also, a preferable mode is one wherein the controlling means is so configured that, when a collision occurs between the second and fourth controlling signals, the second controlling signal only is outputted preferentially.

Also, a preferable mode is one wherein the address outputting means contains a first delaying means used to latch an input address in accordance with the first controlling signal and to output the latched signal as a read address in accordance with the second controlling signal and a second delaying means used to latch an input address in accordance with the third controlling signal and to output the latched signal as a write address in accordance with the fourth controlling signal.

Also, a preferable mode is one wherein the address outputting means is so configured that it is provided with one or more of the first delaying means and the second delaying means so as to output a read address and/or write address by using an output of an arbitrary delaying means.

Also, a preferable mode is one wherein the address outputting means is provided with the first delaying means and the second delaying means used to latch an input address at each time of the occurrence of the input address so as to output a read address or a write address in accordance with the second controlling signal or the fourth controlling signal.

Also, a preferable mode is one wherein the first period is an arbitrary clock period including zero and the second period is an arbitrary clock period being longer by a specified clock period than the first period. Also, a preferable mode is one wherein each of delaying means is comprised of a latching circuit used to latch an input signal in response to the first controlling signal or the second controlling signal or to latch an input signal at each time of the occurrence of the input signal and to output the latched signal in accordance with the third or fourth controlling signal.

Also, a preferable mode is one wherein the controlling means is so configured that, when a collision occurs between the second and fourth controlling signals, the fourth controlling signal only is outputted preferentially.

Also, a preferable mode is one wherein the controlling means is so configured that, when a collision occurs between another controlling signal generated in response to a command other than the read command and said write command and the second and fourth controlling signals, said another controlling signal only is outputted preferentially.

According to a fourth aspect of the present invention, there is provided a semiconductor memory device comprising:

a controlling means to control the timing of operating a memory section and supplying an address to the memory section in response to an external command;

an address outputting means to generate an address output using an external address input to be outputted to the memory section in accordance with a controlling signal fed from the controlling means; and a column control means to start outputting a write operation controlling signal and a read operation controlling signal to be fed to the memory section in response to an operation instructing signal given by the controlling means;

whereby the controlling means generates a first controlling means at the time of the occurrence of a read command, a second controlling signal after a first period following the occurrence of the read command, a third controlling signal at the time of the occurrence of a write command, a fourth controlling signal after a second period following the occurrence of the write command, further a fifth controlling signal at the time of the occurrence of the second and fourth controlling signals, then an operation instructing signal to be fed to the column controlling means in response to the second and fourth controlling signals;

the address outputting means latches an input address in accordance with the first controlling signal and holds the latched signal in a signal holding means in accordance with the second controlling signal, further latches an input address in accordance with the third controlling signal and holds the latched signal in the signal holding means in accordance with the fourth controlling signal, and then outputs the address held by the signal holding means in accordance with said fifth controlling signal as a read address or a write address.

In the foregoing, a preferable mode is one wherein the controlling means contains a first signal generating means to generate, in response to an external command, the first controlling signal, a second signal generating means to generate the second controlling signal after the first period following the occurrence of the read command in response to an external command, a third signal generating means to generate, in response to an external command, the third controlling signal at the time of the occurrence of a write command, a fourth signal generating means to generate, in response to an external command, the fourth controlling signal after the second period following the occurrence of the write command and a fifth signal generating means to generate a fifth controlling signal at the time of the occurrence of the second and fourth controlling signals.

Also, a preferable mode is one wherein the controlling means is so configured that, when a collision occurs between the second and fourth controlling signals, the second controlling signal only is outputted preferentially.

Also, a preferable mode is one wherein the address outputting means is provided with a first delaying means used to latch an address input in response to the first controlling signal and to output the latched signal in response to the second controlling signal and a second delaying means used to latch an input address in response to the third controlling signal and to output the latched signal in response to the fourth controlling signal so as to output a read address and a write address by using an output from the first or second delaying means with a timing of the fifth controlling signal.

Also, a preferable mode is one wherein the address outputting means is so configured that it is provided with one or more of the first delaying means and the second delaying means so as to output a read address and/or write address by using an output of an arbitrary delaying means.

Also, a preferable mode is one wherein the address outputting means is provided with the first and second delaying means used to latch an input address at each time of the occurrence of the input address so as to output a read address or a write address in accordance with the second controlling signal or the fourth controlling signal.

Also, a preferable mode is one wherein the first period is an arbitrary clock period including zero and the second period is an arbitrary clock period being longer by a specified clock period than the first period.

It is also preferable that each of delaying means is comprised of a latching circuit used to latch an input signal in response to the first controlling signal or the second controlling signal or to latch an input signal at each time of the occurrence of the input signal and to output the latched signal in accordance with the third or fourth controlling signal.

Also, it is preferable that the controlling means is so configured that, when a collision occurs between the second and fourth controlling signals, the fourth controlling signal only is outputted preferentially.

Furthermore, it is preferable that the controlling means is so configured that, when a collision occurs between another controlling signal generated in response to a command other than the read command and the write command and the second and fourth controlling signals, said another controlling signal only is outputted preferentially.

BRIEF DESCRIPTION OF THE DRAWING

The above and other objects, advantages and features of the present invention will be more apparent from the following description taken in conjunction with the accompanying drawings in which:

FIG. 41 is a block diagram showing overall configurations of a semiconductor memory device according to a fourth embodiment of the present invention;

DETAILED DESCRIPTION OF THE PREFERRED EMBODIMENTS

Best modes of carrying out the present invention will be described in further detail using various embodiments with reference to the accompanying drawings.

First Embodiment

Figure 1:
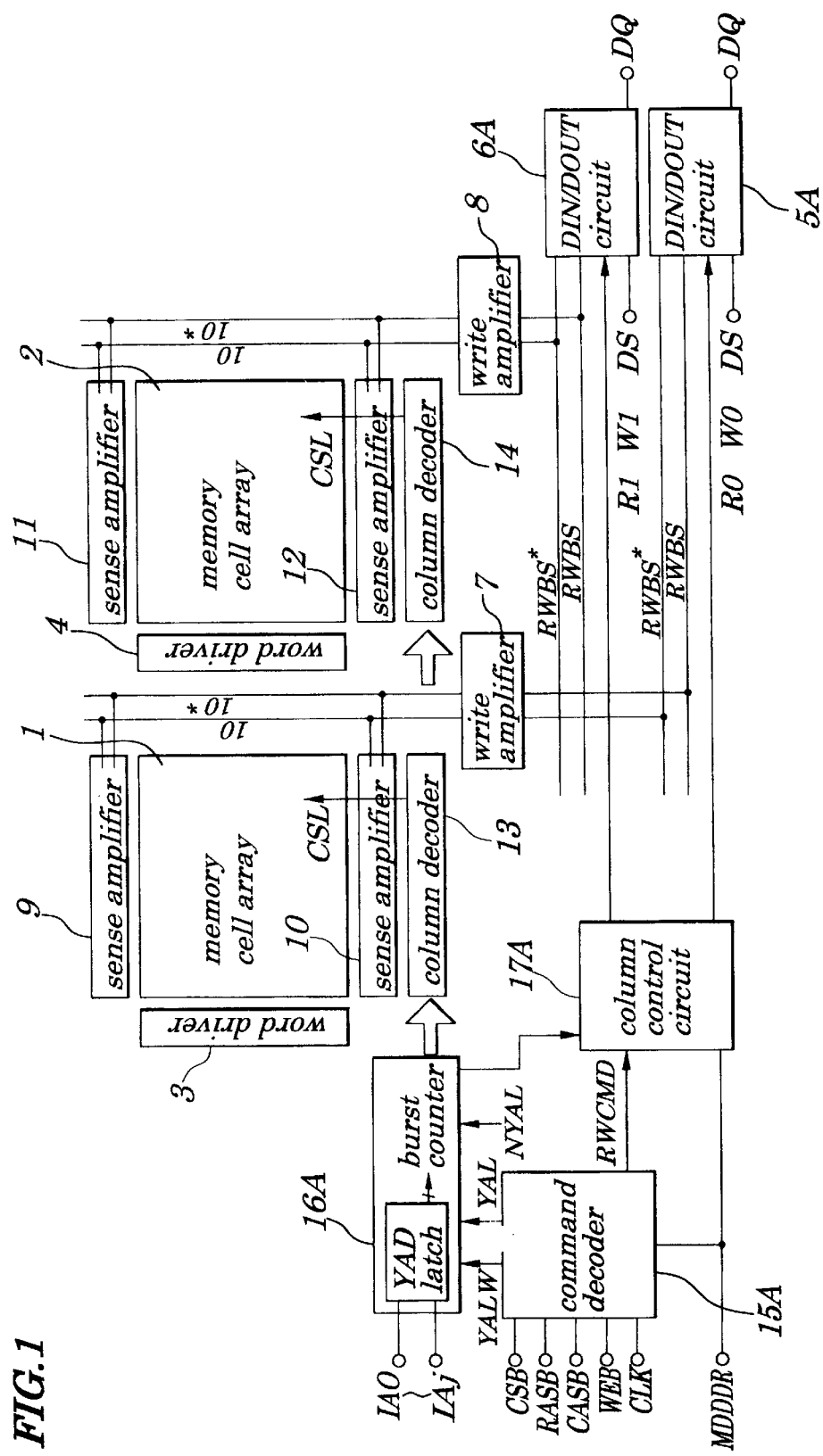
FIG. 1 is a block diagram showing an overall configuration of a semiconductor memory device according to a first embodiment of the present invention.
Figure 2:
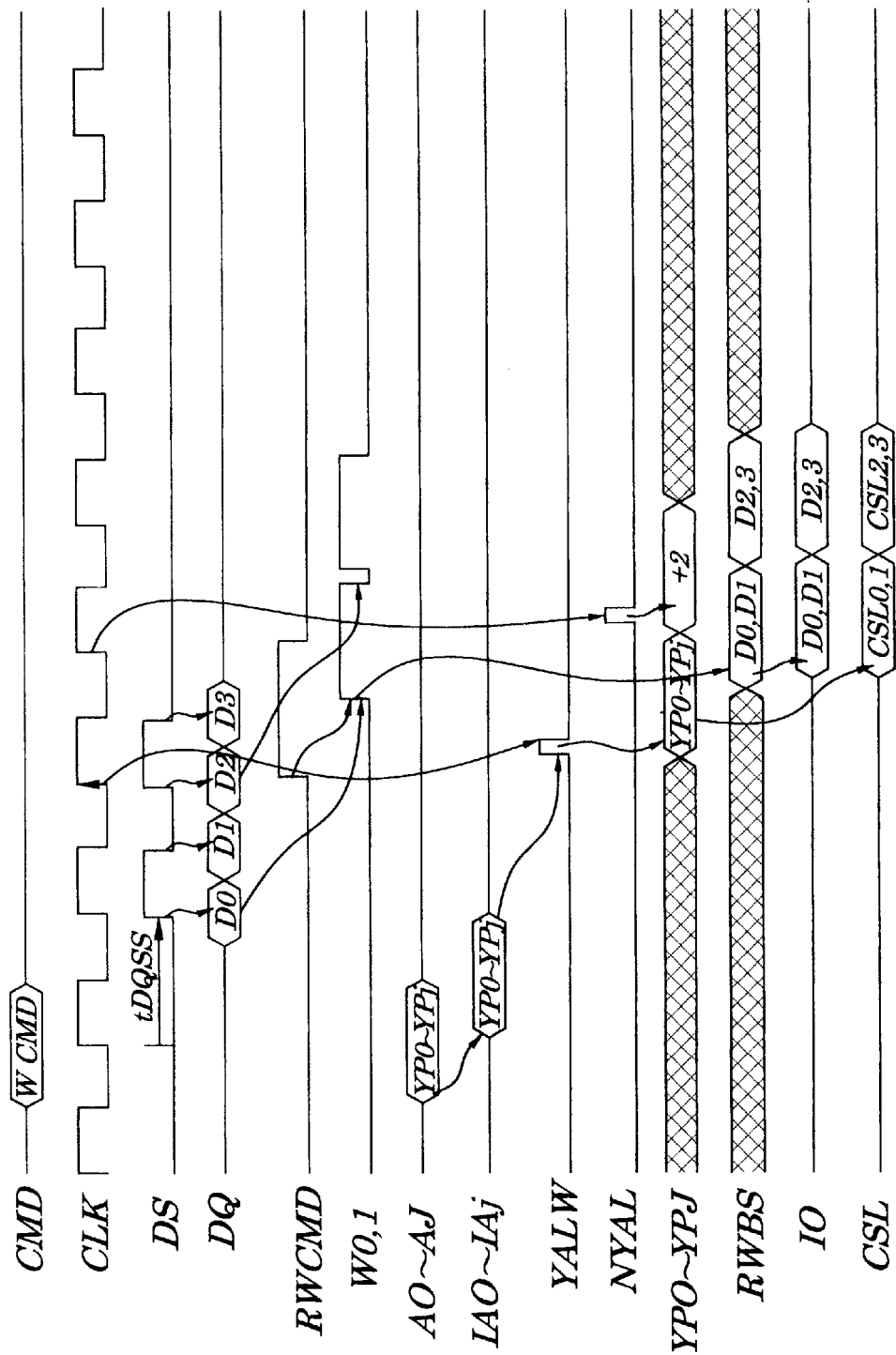
FIG. 2 is a timing chart explaining operations of the semiconductor memory device at the time of writing of data.
Figure 3:
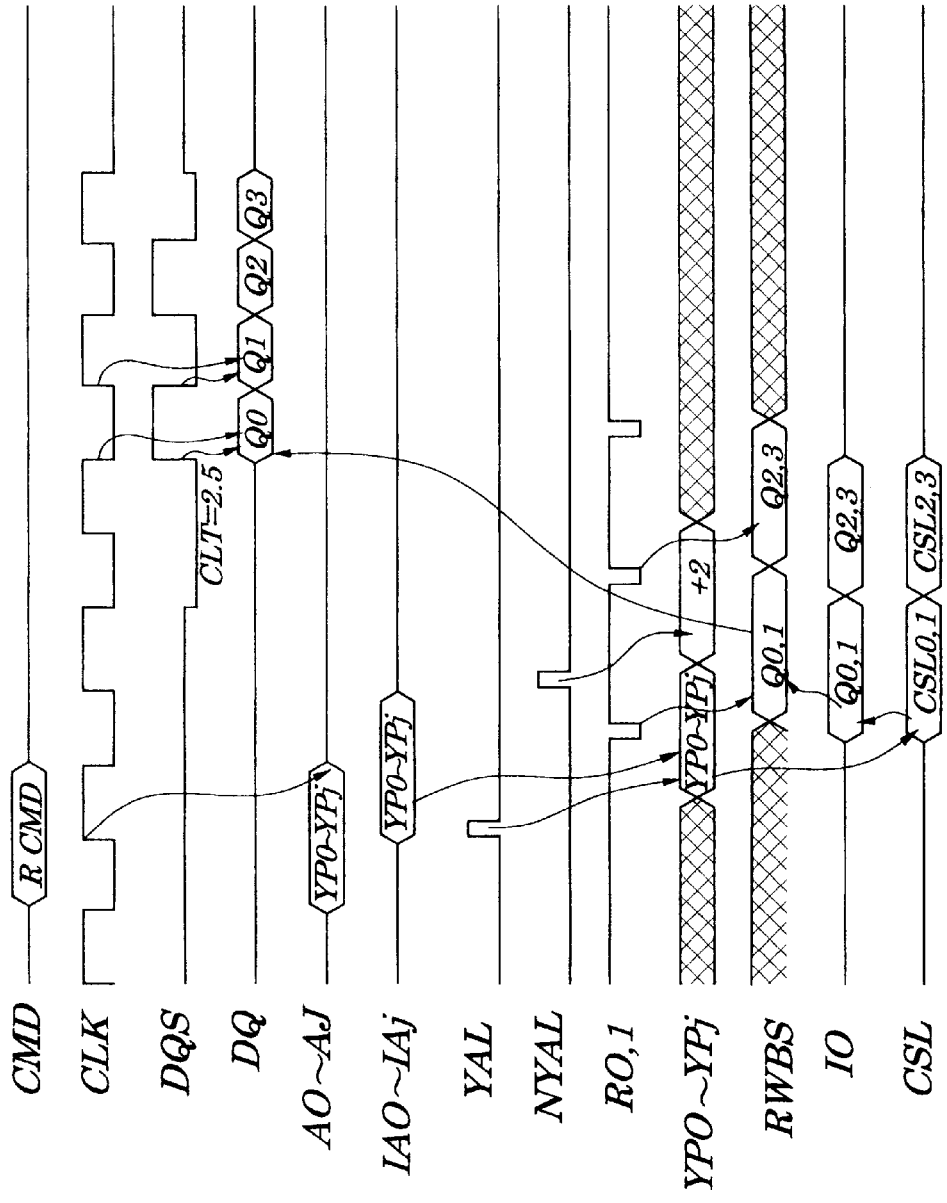
FIG. 3 is a timing chart explaining operations of the semiconductor memory device at the time of reading of data.

FIG. 1 is a block diagram showing an overall configuration of a semiconductor memory device according to a first embodiment of the present invention. FIG. 2 is a timing chart showing operations of the semiconductor memory device at the time of writing of data. FIG. 3 is a timing chart showing operations of the semiconductor memory device at the time of reading of data.

As shown in FIG. 1, the semiconductor memory device of this embodiment has memory cell arrays 1 and 2, word drivers 3 and 4, DIN/DOUT circuits 5A and 6A, write amplifiers 7 and 8, sense amplifiers 9, 10 and 12, column decoders 13 and 14, a command decoder 15A, a burst counter 16A and a column control circuit 17A.

Figure 50:
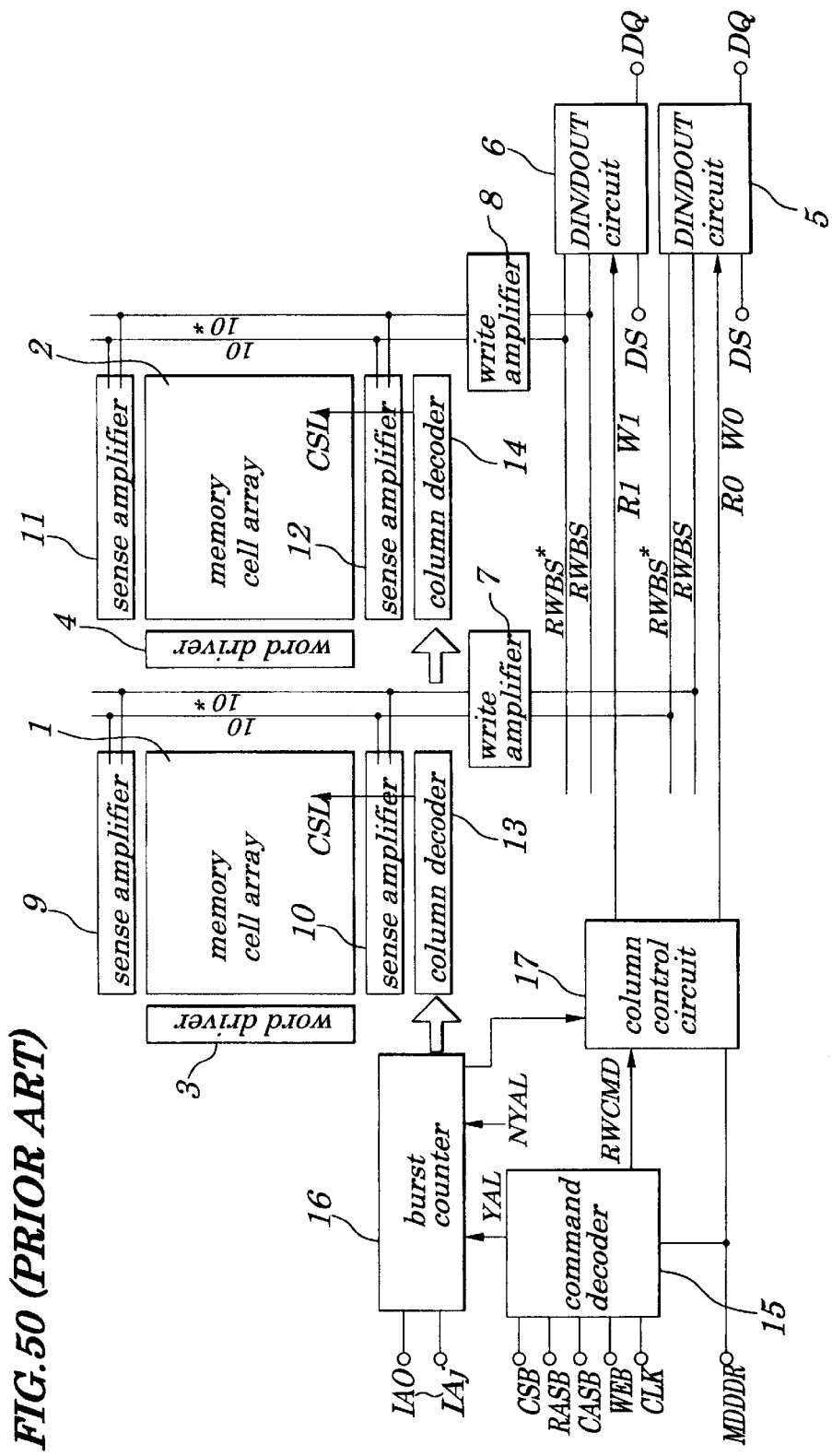
FIG. 50 is a block diagram showing an example of configurations of a conventional semiconductor memory device comprised of 2 bit prefetch-type SDRAMs.
Figure 51:
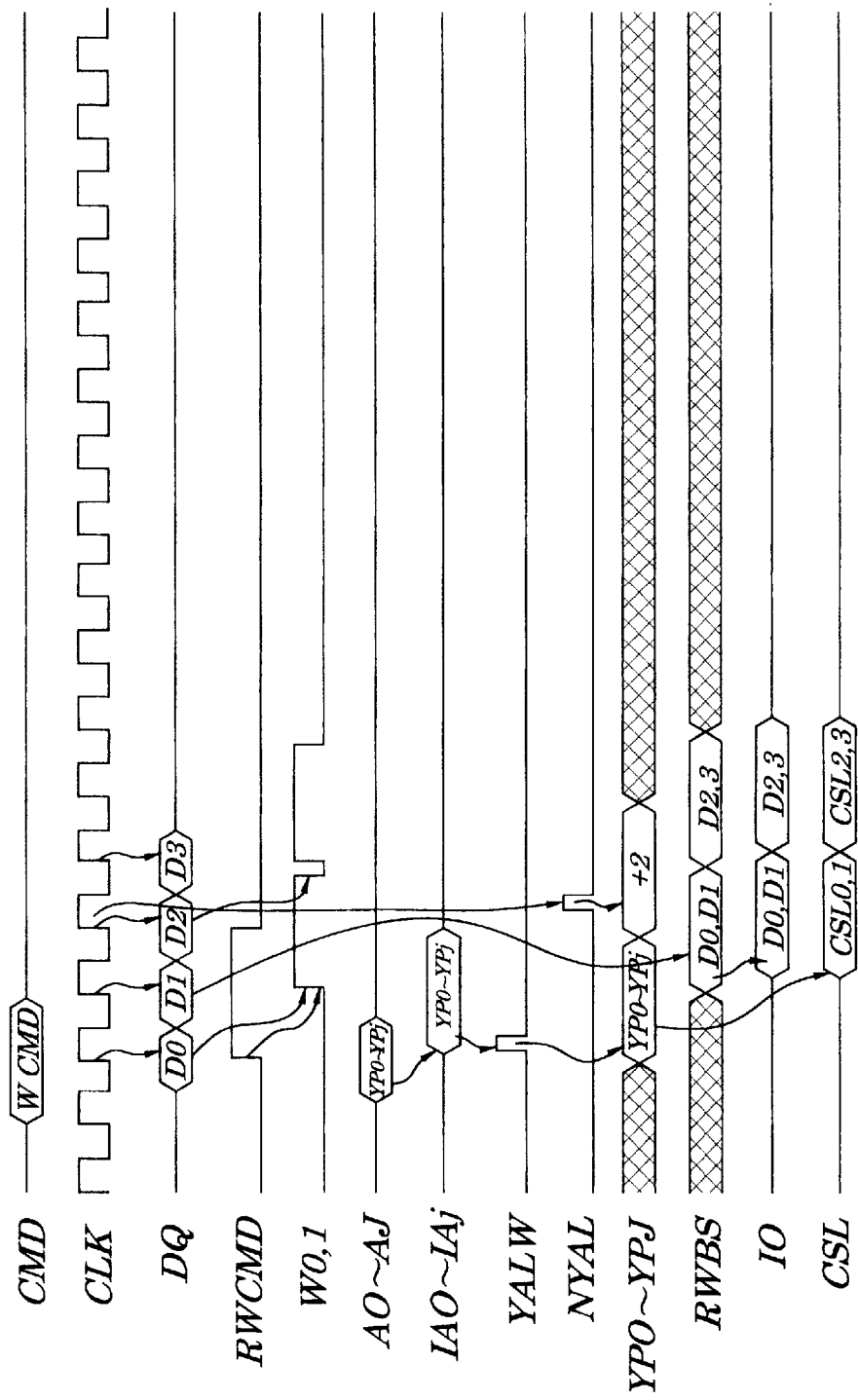
FIG. 51 is a timing chart explaining operations of the conventional semiconductor memory device at the time of writing of data.
Figure 52:
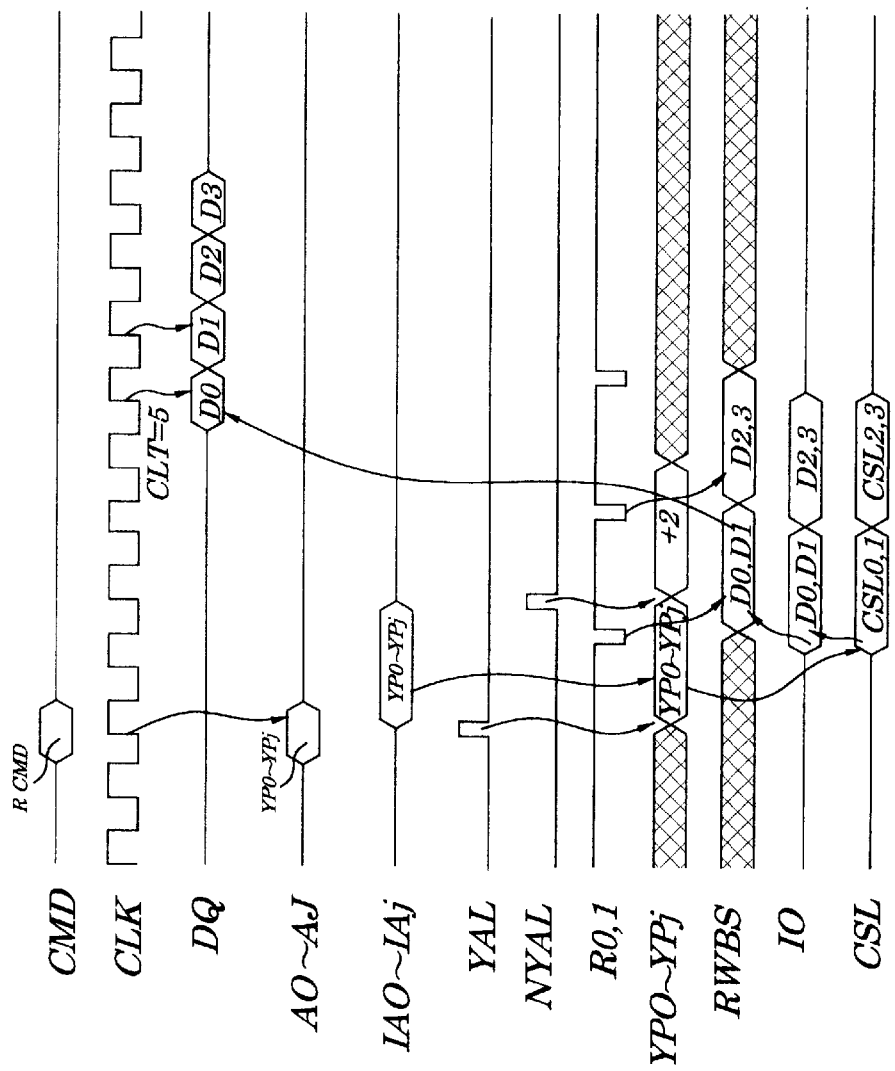
FIG. 52 is a timing chart explaining operations of the conventional semiconductor memory device at the time of reading of data.

The configurations shown in this embodiment differ greatly from those in the above conventional embodiment (FIG. 50) in that the DIN/DOUT circuits 5A and 6A have an input of a data strobe signal DS, the command decoder 15A has outputs of address control signals YAL and YALW as well as an input of a DDR mode signal MDDDR, and the column control circuit 17A has an input of a DDR mode signal MDDDR. Except these components, the configurations of this embodiment are almost the same as those of conventional embodiments. The same reference number in FIG. 1 designates corresponding components in FIG. 50, the description of which is omitted or simplified.

The DIN/DOUT circuits 5A and 6A, after having latched a data input DQ with a timing of the data strobe signal DS, is adapted to re-latch the latched data with a timing of a clock signal and to output them as data outputs RWBS and RWBS*, or after having latched data inputs RWBS and RWBS* with a timing of a clock signal, to re-latch the latched data with a timing of the data strobe signal and to output it as a data output DQ. The command decoder 15A, in the case of the DDR-SDRAM, when the DDR mode signal goes high, in response to external commands CSB, RASB, CASB and WEB, and a clock signal CLK, generates an internal read/write command RWCMD (or an operation instructing signal) and address controlling signals YAL, YALW and NYAL and, at the same time, in the case of a SDR-SDRAM (Single Data Rate-Synchronous Dynamic Random Access Memory) data input/output cycle of which is equal to a clock cycle, when DDR mode signal MDDDR goes low, performs the similar operation as in the case of the conventional embodiment shown in FIG. 50.

The burst counter 16A, after generating an address output with a timing defined by an address control signal YAL or YALW for an address input composed of 8 bits (IA0 to IAj), is used to repeatedly carry out an operation of sequentially producing address outputs with 2 added, at each time of the occurrence of the address control signal NYAL, every one clock, for a period corresponding to a specified length of bursts. The column control circuit 17A is used to output write operation controlling signals W0 and W1, or read operation controlling signals R0 and R1 to the DIN/DOUT circuits 5A and 6A, in response to the DDR mode signal MDDDR, the read/write command RWCMD fed from the command decoder 15A and an address output fed from the burst counter 16A.

Next, operations of the semiconductor memory device of this embodiment at the time of writing by referring to FIGS. 1 and 2 are hereinafter described.

When a write command W CMD is inputted to a command input port CMD, to the DIN/DOUT circuits 5A and 6A is inputted the data strobe signal DS in a cycle of a clock so that a standard tDQSS representing a difference in timing between the data strobe signal and the clock signal is within a specified range. Let it be assumed that D1, D1, D2 and D3 are inputted in accordance with rises and falls of the data strobe signal DS. At this point, in response to the read/write command RWCMD outputted by the command decoder 15A a specified period later (for example, a period of 2 clocks after the command inputting), the write operation controlling signals W0 and W1 are outputted from the column control circuit 17A.

On the other hand, when address inputs IA0 to IAj are generated in accordance with addresses A0 to Aj (8 bits) designated by a CPU, in response to the address controlling signal YALW fed from the command decoder 15A, address signals YP0 to YPj are outputted from the burst counter 16A and then one clock later, in response to the address controlling signal NYAL, an address obtained by adding 2 to addresses YP0 to YPj is outputted from the burst counter 16A. At this point, even-numbered data D0 and odd-numbered data D1 are outputted as data outputs RWBS and RWBS* from the DIN/DOUT circuits 5A and 6A in response to write operation controlling signals W0 and W1, and outputs D0 and D1 are outputted as write inputs IO and IO* from the write circuits 7 and 8 which are then written into memory cells of column selecting lines CSL0 and CSL1 defined by addresses YP0 to YPj. Moreover, data outputs D0 and D1 are outputted as data outputs RWBS and RWBS* in response to subsequent write operation controlling signals W0 and W1, and data D2 and D3 are outputted as write inputs IO and IO* which are then written into memory cells of column selecting lines CSL2 and CSL3 defined by addresses YP0 to YPj (+2).

Next, operations of the semiconductor memory device of this embodiment at the time of reading by referring to FIGS. 1 and 3 are described below.

When a read command R CMD is inputted to a command input port CMD and address inputs IA0 to IAj are generated in response to addresses A0 to Aj designated by the CPU, in response to the address control signal YAL fed from the command decoder 15A, are outputted addresses YP0 to YPj from the burst counter 16A, and then one clock later, in response to the address controlling signal NYAL, an address with 2 added to addresses YP0 to YPj are outputted from the burst counter 16A. Data Q0 and Q1 are outputted as read data IO and IO* from column selecting lines CSL0 and CSL1 defined by addresses YP0 to YPj and data Q2 and Q3 are outputted from column selecting lines CSL2 and CSL3 defined by addresses YP0 to YPj (+2).

On the other hand, the column control circuit 17A is adapted to output read operation controlling signals R0 and R1 at each time of receiving a clock in response to the read/write command RWCMD, which causes data outputs Q0, Q1, Q2 and Q3 to be outputted as read data RWBS and RWBS* and, accordingly, the DIN/DOUT circuits 5A and 6A output Q0, Q1, Q2 and Q3 as read data DQ in response to a rise and a fall of a timing signal DQS to be outputted 2.5 clocks later (CLT=2.5) which are output designating timing clocks.

Next, configurations of the command decoder 15A and its operations of this embodiment are hereafter described by referring to FIGS. 4 through 9.

Figure 4A:
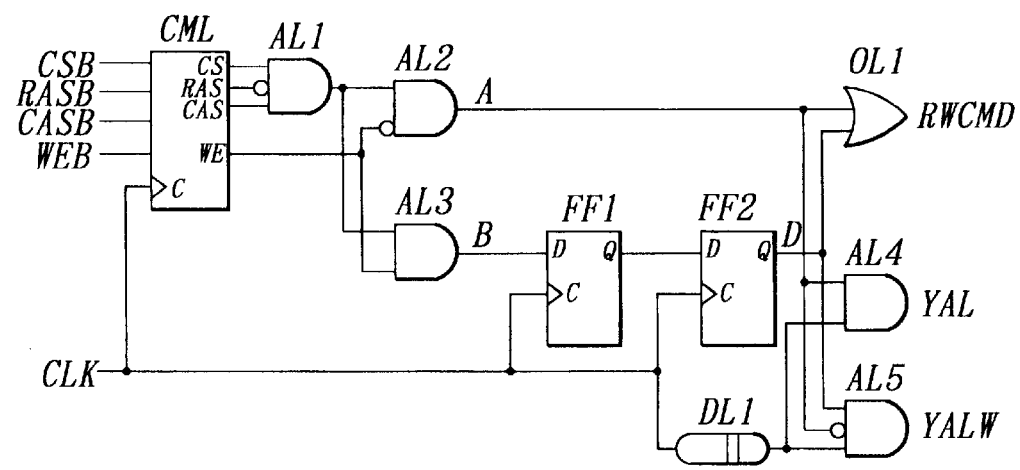
FIG. 4A is a circuit diagram of an example (1) of the configuration of the command decoder and FIG. 4B is a timing chart of operations thereof in the semiconductor device.
Figure 4B:
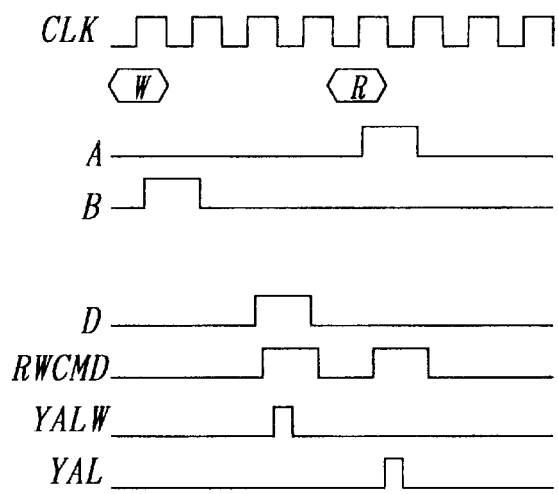

FIG. 4A is a circuit diagram of an example (1) of the configuration of the command decoder and FIG. 4B is a timing chart of operations thereof. As depicted in FIG. 4A, the command decoder is comprised of a command latching circuit CML, AND circuits AL1, AL2, AL3, AL4 and AL5, an OR circuit L1, flip-flops FF1 and FF2 and a delay device DL1.

The command latching circuit CML, after receiving external command signals CSB (command select bar), RASB, CASB and WEB and decoding them in synchronization with the clock CLK, outputs internal command signals CS (command select), RAS, CAS and WE (write enable). Since an output of the AND circuit AL1 goes high when a command selection is designated by the command CS, a row address selection is not designated by the command signal RAS and a column address selection is designated by the command RAS, an output B of the AND circuit AL3 goes high when the command signal WE becomes high (at the time of writing) and an output A of the AND circuit AL2 becomes high when the command signal WE goes low (at the time of reading of data).

This causes an address controlling signal YAL to be immediately outputted from the AND circuit AL4 and an address controlling signal YALW to be outputted from the AND circuit AL5 after the output B of the AL3 passes through the flip-flops FF1 and FF2 and with a delay of 2 clocks (corresponding to standards of DDL and SDRAM) and, at the same time, the read/write command RWCMD to be outputted when the output A of the AL2 passes through the OR circuit OL1 and in synchronization with the address controlling signals YAL and YALW. At this point, each of the address controlling signals YAL and YALW is one shot pulse to be adapted to correspond to a rise of the read/write command RWCMD by making the clock signal CLK delayed using the delay circuit DL1.

FIG. 4B shows operations of the command decoder of this embodiment. When the write command W is inputted, the output B is generated and, 2 clock later, the output D is generated, the read/write command RWCMD is outputted through the OR circuit OL1 and the address controlling signal YALW is then outputted. When the read command R is inputted, the output A is generated and immediately the read write command RWCMD is outputted and, at the same time, the address controlling signal YAL is outputted.

Figure 5:
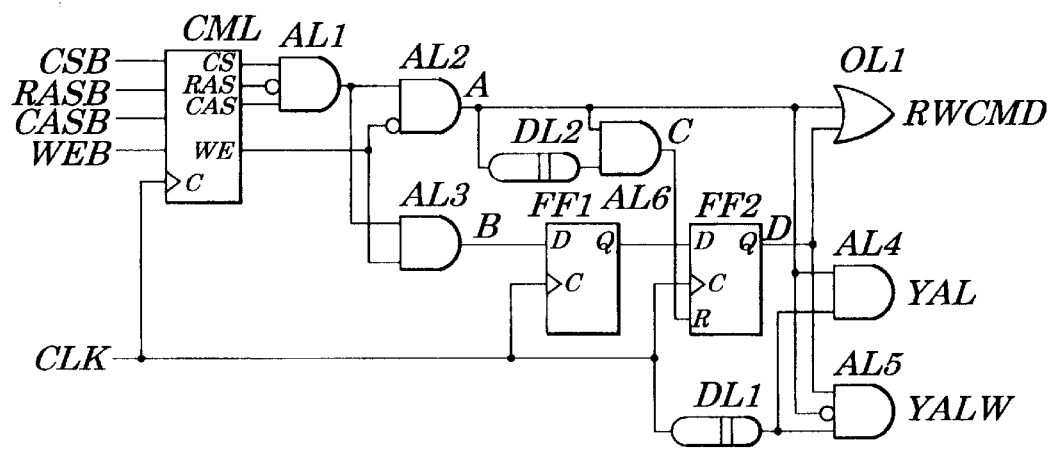
FIG. 5 is a circuit diagram illustrating an example (2) of the configuration of the command decoder in the semiconductor device.

FIG. 5 is a circuit diagram of an example (2) of the configuration of the command decoder.

The command decoder in this example, as shown in FIG. 5, contains a command latching circuit CML, AND circuits AL1, AL2, AL3, AL4, AL5 and AL6, an OR circuit OL1, flip-flops FF1 and FF2, and delay circuits DL1 and DL2.

The command decoder in this example differs from the command decoder shown in FIG. 4 in that the output A of the AND circuit AL2 is fed to the delay device DL2 and the output C of the AND circuit AL6 is fed to a reset input R of a flip-flop FF2. When a read command is inputted within 2 clocks after the inputting of the write command, both an output A of the AND circuit AL2 and an output D of the flip-flop go high simultaneously and, an address controlling signal YAL and YALW is not outputted simultaneously. In this embodiment, an address controlling signal YAL is outputted and reading of data by a read command is preferentially performed, however, since an address controlling signal YALW is not outputted and writing operation by a write command is not performed, damaging of data caused by a collision between a read address signal and a write address signal can be prevented accordingly.

Figure 6A:
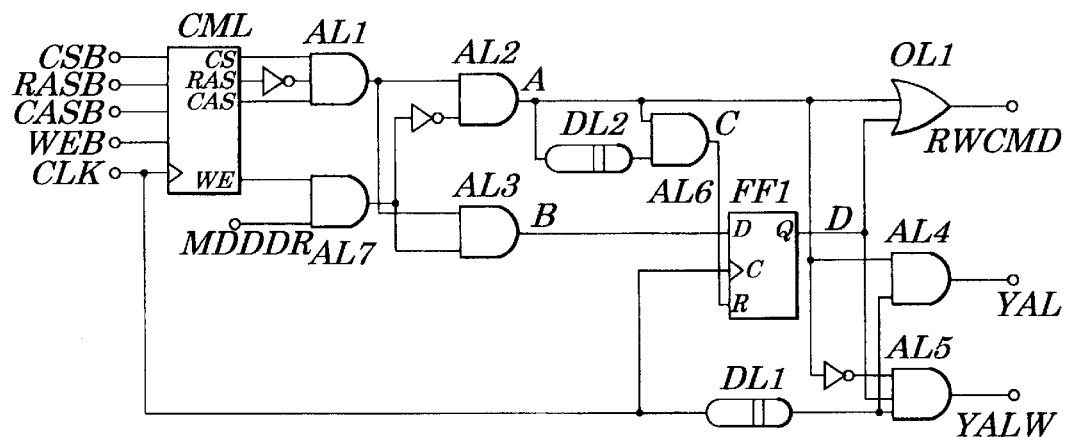
FIG. 6A is a circuit diagram showing an example (3) of the configuration of the command decoder and FIG. 6B is a timing chart explaining operations thereof in the semiconductor device.
Figure 6B:
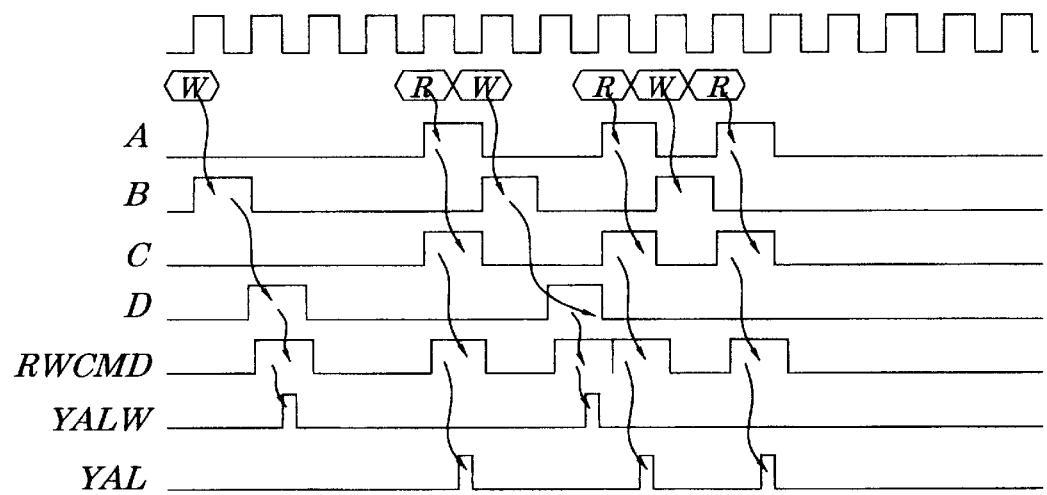

FIG. 6A is a circuit diagram of an example (3) of the configuration of the command decoder and FIG. 6B is a timing chart explaining operations thereof.

The command decoder in this example, as shown in FIG. 6A, contains a command latching circuit CML, AND circuits AL1, AL2, AL3, AL4, AL5, AL6 and AL7, an OR circuit OL1, a flip-flop FF1, delay devices DL1 and DL2.

In the command decoder of this embodiment, unlike the command decoder shown in FIG. 5, when a command signal WE of the command latching circuit CML is high and an external command signal MDDDR used to specify a mode in the case of the DDR-SDRAM is also high, an output of the AND circuit AL17 goes high, thus causing an output of the address controlling signal YAL in response to a read command to be performed immediately and, as a result, an operation to respond to the DDR-SDRAM including a delayed outputting of the address controlling signal in response to a write command.

In this example, because the flip-flop is a one-stepped flip-flop, while operations to respond to the DDR-SDRAM are being performed, the outputting of the address controlling signal YALW in accordance with inputting of a write command is carried out with a delay of one clock.

FIG. 6B shows an operational example of the command data of this embodiment. When the write command W is inputted, an output B is generated and an output D is generated with a delay of one clock, and a read write command RWCMD is outputted through the OR circuit OL1 and the address controlling signal YALW is outputted. Moreover, when the read command R is inputted, an output A is generated, the read write command RWCMD is outputted through the OR circuit OL1 and the address controlling signal YAL is outputted.

When the read command R is inputted one clock after the inputting of the write command W, though the output A is generated following the output B, since the flip-flop FF1 is reset due to the occurrence of the output C, the output D is not generated and therefore neither the read/write command RWCMD nor the address controlling signal YAL is generated in response to the write command. On the other hand, in response to the output A by inputting the read command, both the read/write command RWCMD and the address controlling signal YAL are outputted.

Figure 7A:
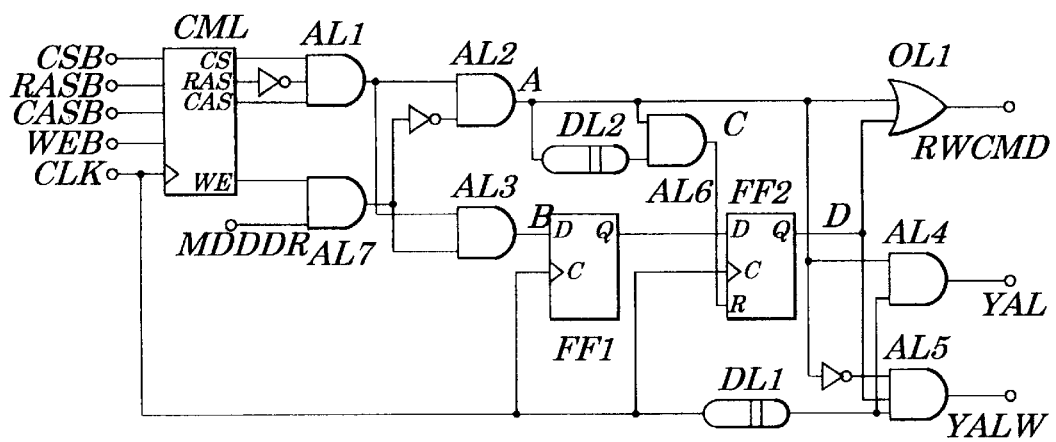
FIG. 7A is a circuit diagram of an example (4) of the configuration of the command decoder and FIG. 7B is a timing chart of operations thereof in the semiconductor device.
Figure 7B:
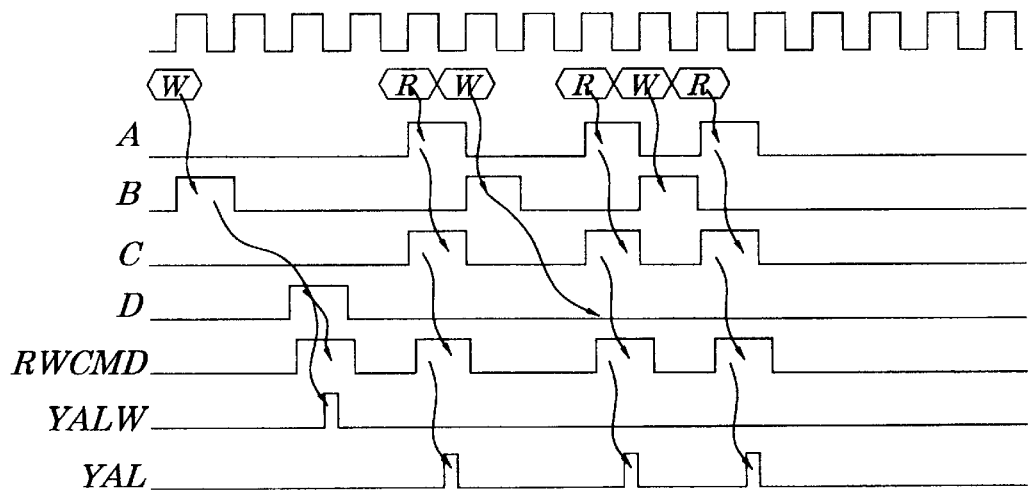

FIG. 7A is a circuit diagram of an example (4) of the configuration of the command decoder and FIG. 7B is a timing chart of operations thereof. The command decoder in this example, as shown in FIG. 7A, is comprised of a command latching circuit CML, AND circuits AL1, AL2, AL3, AL4, AL5, AL6, AL7, an OR circuit OL1, flip-flops FF1 and FF2, and delay devices DL1 and DL2. The command decoder in this example differs from that shown in FIG. 6A in that it contains two-stepped flip-flops which cause a read/write command RWCMD and an address controlling signal YALW by the input of a write command to be outputted with a delay of two clocks in the-operations to respond to the DDR-SDRAM. Moreover, if the read command R is inputted 2 clocks or 1 clock after the input of the write command W, though the read/write command RWCMD and an address controlling signal YALW are not outputted by inputting of the write command W, the read/write command RWCMD and the address controlling signal YAL are outputted by the inputting of the read command R.

Figure 8A:
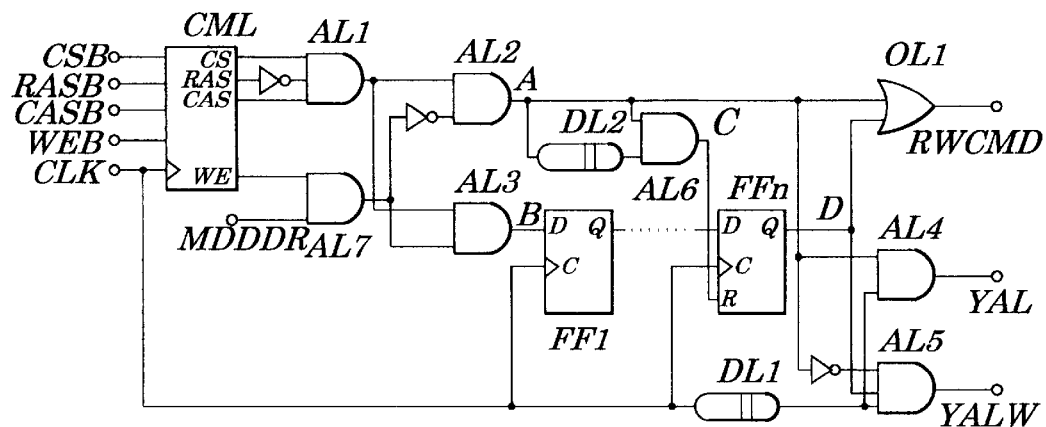
FIG. 8A is a circuit diagram of an example (5) of the configuration of the command decoder and FIG. 8B is a timing chart of operations thereof in the semiconductor device.
Figure 8B:
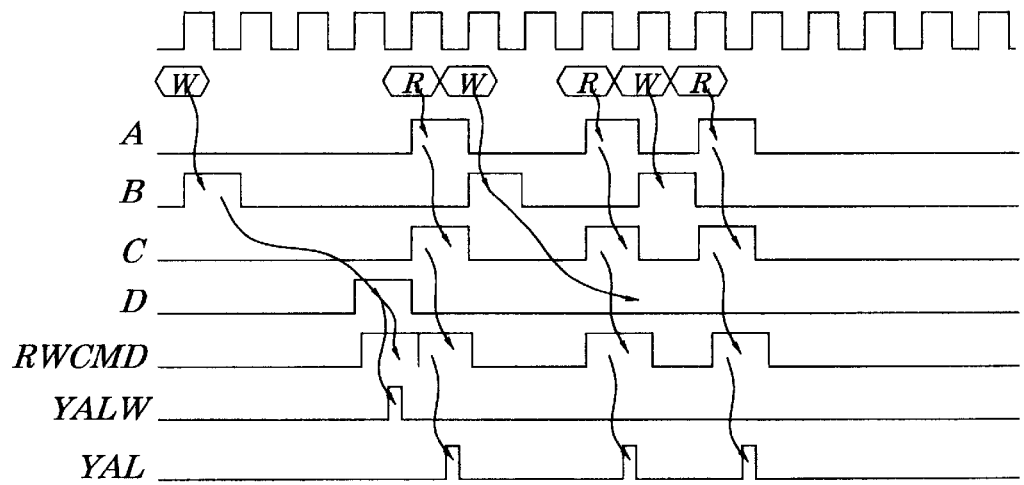

FIG. 8A is a circuit diagram of an example (5) of the configuration of the command decoder and FIG. 8B is a timing chart of operations thereof.

The command decoder in this example, as shown in FIG. 8, is comprised of a command latching circuit CML, AND circuits AL1, AL2, AL3, AL4, AL5, AL6 and AL7, an OR circuit OL1, n-stepped flip-flops FF1, . . . , FFn and delay circuits DL1 and DL2.

The command decoder in this example differs from that shown in FIG. 7A in that it contains n-stepped flip-flops which causes a read/write command RWCMD and an address controlling signal YALW by inputting of a write command to be outputted with a delay of n-clocks (n=3 in the drawing) in the operations to respond to the DDR-SDRAM. Moreover, if the read command R is inputted 2 clocks or 1 clock after the inputting of the write command W, though both the read/write command RWCMD and an address controlling signal YALW are not outputted by the inputting of the write command W, the read/write command RWCMD and the address controlling signal YAL are outputted by the inputting of the read command R. Furthermore, if a change of the outputting sequence for the address controlling signal YAL and YALW corresponding to the read command and the write command is not desired in the specification, outputting of the read/write command RWCMD and address controlling signal YALW can be interrupted by inputting reset signals to all of the flip-flops FF1, . . . , FFn as shown in FIG. 8A Additionally, in the case of such specifications as the DDR-SDRAM in which "a write command or a read command previously inputted is interrupted by a command inputted later in the consecutive inputting of commands", the above specifications can be met by inputting reset signals to all of the flip-flops FF1, . . . FFn.

Figure 9A:
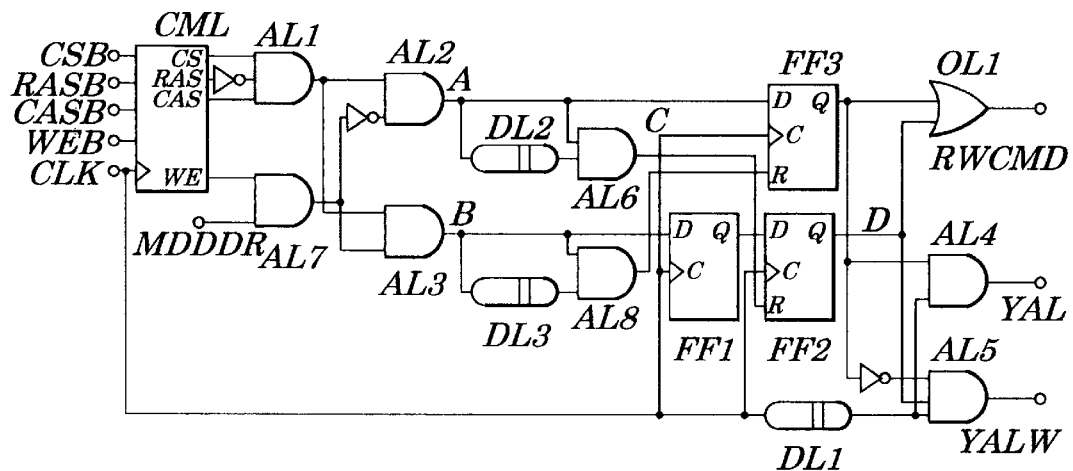
FIG. 9A is a circuit diagram of an example (6) of the configuration of the command decoder and FIG. 9B is a timing chart of operations thereof in the semiconductor device.
Figure 9B:
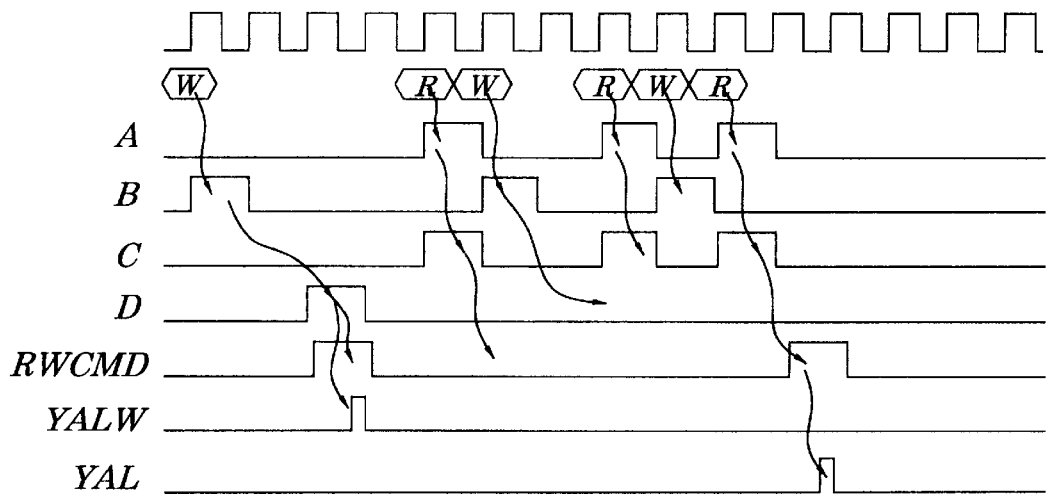

FIG. 9A is a circuit diagram of an example (6) of the configuration of the command decoder and FIG. 9B is a timing chart of operations thereof.

The command decoder in this example, as shown in FIG. 9, is comprised of a command latching circuit CML, AND circuits AL1, AL2, AL3, AL4, AL5, AL6, AL7 and AL8, and an OR circuit OL1, flip-flops FF1, FF2 and FF3 and delay circuits DL1, DL2 and DL3. The command decoder in this example differs from that shown in FIG. 7 in that it has a flip-flop FF3 connected between an output A of the AND circuit AL2 and an input of the OR circuit OR1, and an output B of the AND circuit AL3 is fed as a reset input R to the flip-flop 3 through the delay circuit DL3 and the AND circuit. When a single write command is inputted, a read/write command RWCMD and an address controlling signal YALW are outputted with a delay of two clocks and when a single read command is inputted, the read/write command RWCMD and the address controlling signal YALW are also outputted. At this point, even if the read command is inputted three clocks after the inputting of the write command, the address controlling signal YALW is outputted by the inputting of the write command and data is written by the write command, however, if the read command is inputted within two clocks after the input of the write command, because the flip-flop FF2 is reset by an output C of the AND circuit AL6, the read command is preferentially inputted. If the write command is inputted within one clock after the input of the read command, because the flip-flop FF3 is reset by an output of the AND circuit AL8, the address controlling signal YAL is not generated and therefore data is not read out by the read command inputted. On the other hand, if, though the read command is inputted one clock after the input of the write command, any subsequent write command is not inputted, the address controlling signal YAL is outputted by the input of the read command and data is read out by the input of the read command.

Figure 10A:
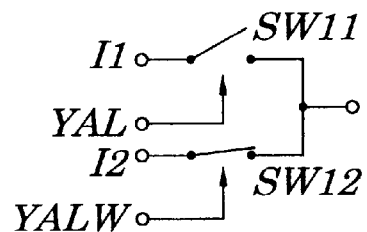
FIGS. 10A through 10C are diagrams of examples showing configurations of an address selector circuit incorporated into the burst counter in the semiconductor device.
Figure 10B:
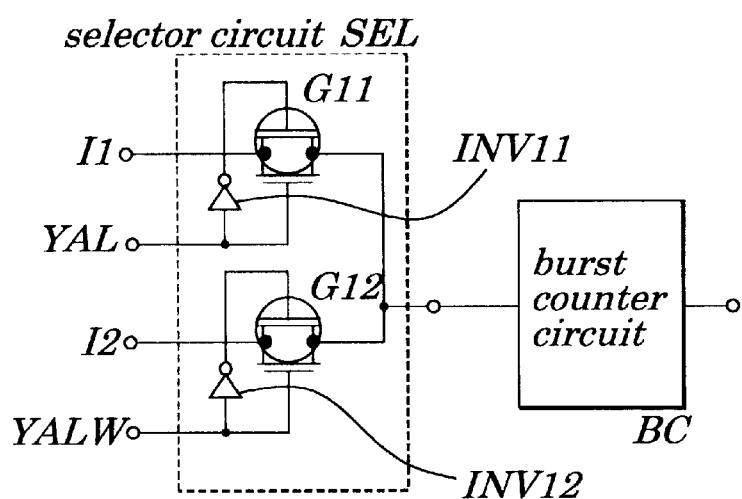
Figure 10C:
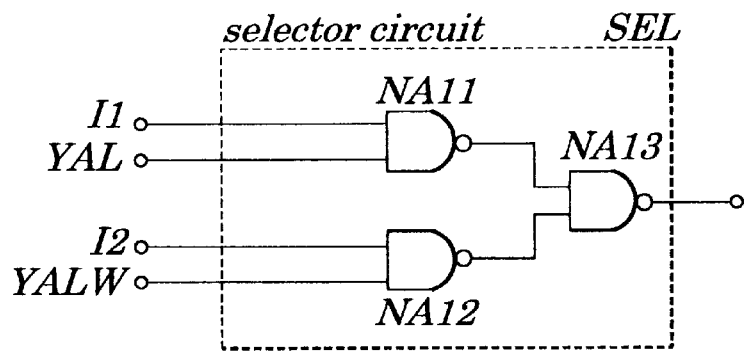

Next, an example of configurations and operations of the burst counter 16A in this example are hereafter described. FIGS. 10A through 10C are examples of configurations of an address selector circuit incorporated into the burst counter. FIGS. 11A through 11C and 12A through 12C are examples of configurations of the burst counter. FIGS. 13A through 13C, 14A through 14C, 15A through 15C, 16A through 16C, 17A through 17C, and 18A through 18C are timing charts showing operational configurations of the burst counter.

FIG. 10A shows operational principles of the address selector circuit comprised of switches SW11 and 12. According to configurations of this example, the switches SW11 and 12 the ON/OFF of which is controlled by inputs of the address controlling signals YAL or YALW output inputs 11 or 12 when the address controlling signals YAL or YALW go high.

FIG. 10B shows specific configurations (1) of the address selector circuit comprised of a selector circuit SEL having gate circuits G11 and G12 and inverters INV11 and INV12 and of a burst counter circuit. According to configurations of this example, a switching gate circuit G11 and an inverter INV11, and a switching gate circuit G12 and an inverter INV12 the ON/OFF of which is controlled by an input of the address controlling signals YAL or YALM, output, when the address controlling signal YAL or YALW goes high, corresponding inputs 11 or 12 to the burst counter circuit BC causing the burst counter circuit BC to start operations of outputting an address.

FIG. 10C shows specific configurations (2) of the address selector circuit comprised of NAND circuits NA11, NA12 and NA13. According to this configuration, when both the address controlling signal YAL and an input I1, or both YALW and input I2 go high, an output of the NAND circuit NA11 or NA12 goes low, and when either or both of the NAND circuit NA11 and/or NA12 go low, an output of the NAND circuit NA13 goes high, then the input I1 or I2 is outputted in response to the address controlling signal YAL or YALW.

Figure 11A:
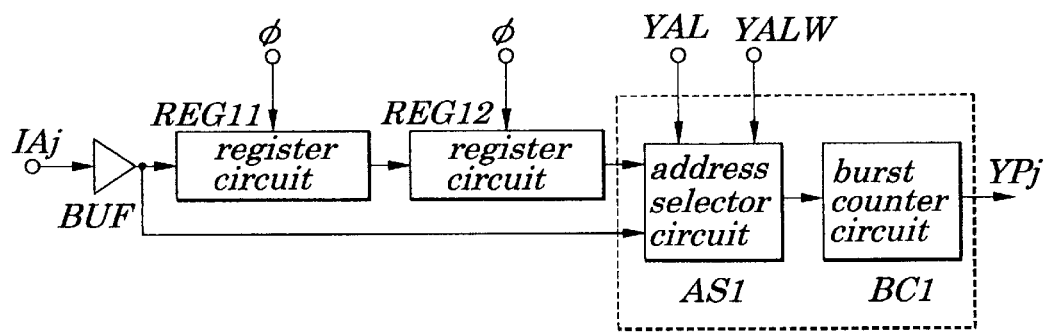
FIGS. 11A through 11C are block diagrams showing one example (1) of configurations of the burst counter.
Figure 11B:
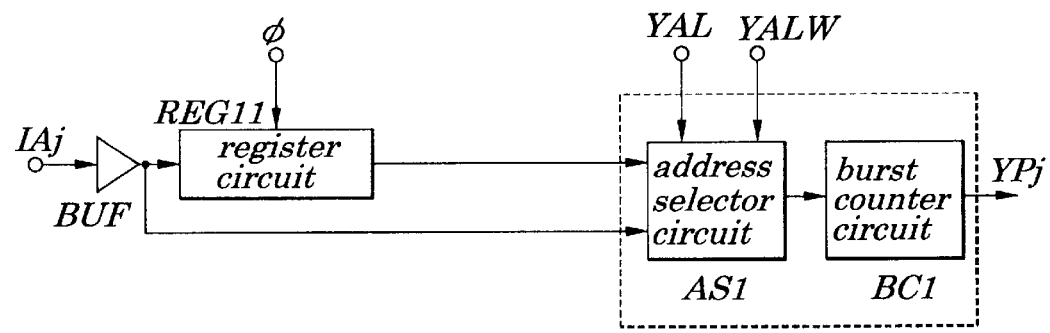
Figure 11C:
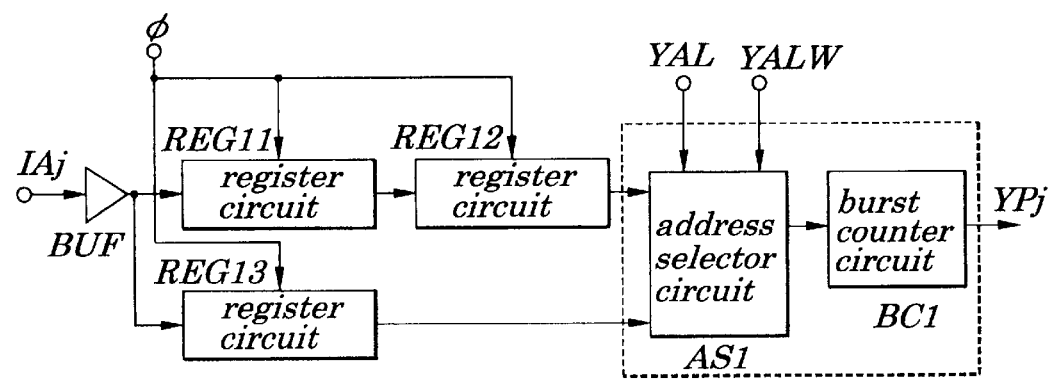

FIGS. 11A through 11C show examples of configurations of the burst counter. The burst counter shown in FIG. 11A is comprised of an input buffer BUF, register circuits REG 11 and 12, address selector circuit AS1 and a burst counter circuit BC1. The registers REG 11 and RGE 12 are adapted to output an address input IAj fed from an input buffer BUF with a delay of one block in response to a clock signal φ. The address selector circuit AS1, in response to the address controlling signal YAL or YALW, selects an output of the input buffer BUF or of the register circuit REG and inputs the selected output to the burst counter circuit BC1. This causes the burst counter circuit BC1 to output an address signal and to start operations of generating an address output YPj from the burst counter circuit BC1 immediately after inputting of the address input IAj in response to the address controlling signal YAL or two clocks after inputting of the address input IAj in response to the address controlling signal YALW.

The burst counter shown in FIG. 11B is comprised of an input buffer BUF, a register circuit REG11, an address selector circuit AS1 and a burst counter circuit BC1. The configuration of this example differs from that shown in FIG. 11A in that the number of registers is smaller one step and, because of this, the address selector circuit AS1 causes the burst counter circuit BC1 to start operations of generating an address output YPj immediately after inputting of an address input IAj in response to the address controlling signal YAL or one clock after inputting of an address input IAj in response to the address controlling signal YALW.

The burst counter shown in FIG. 11C is comprised of an input buffer BUF, register circuits REG11, REG 12 and REG 13, an address selector circuit AS1 and a burst counter circuit BC1. The configuration of this example differs from that shown in FIG. 11A in that it has an additional register circuit REG 13 and, because of this, the address selector circuit AS1 causes the burst counter circuit BC1 to start operations of generating an address output YPj with a delay of one clock after inputting of an address input IAj in response to the address controlling signal YAL or two clocks after inputting of an address input IAj in response to the address controlling signal YALW.

Figure 12A:
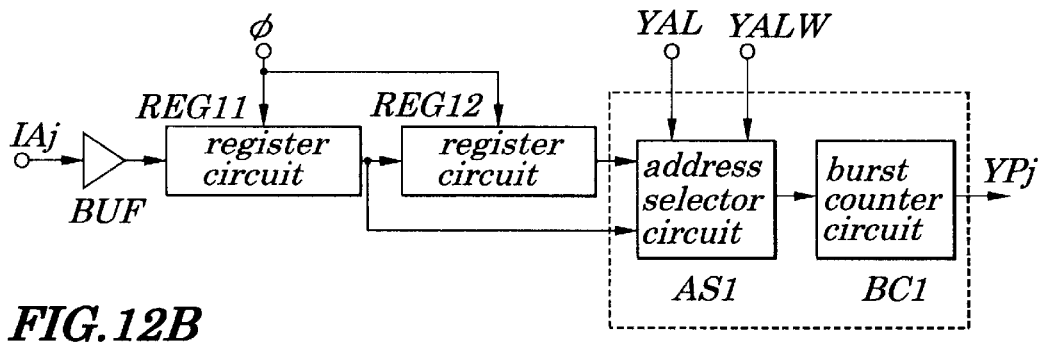
FIGS. 12A through 12C are block diagrams showing another example (2) of configurations of the burst counter.
Figure 12B:
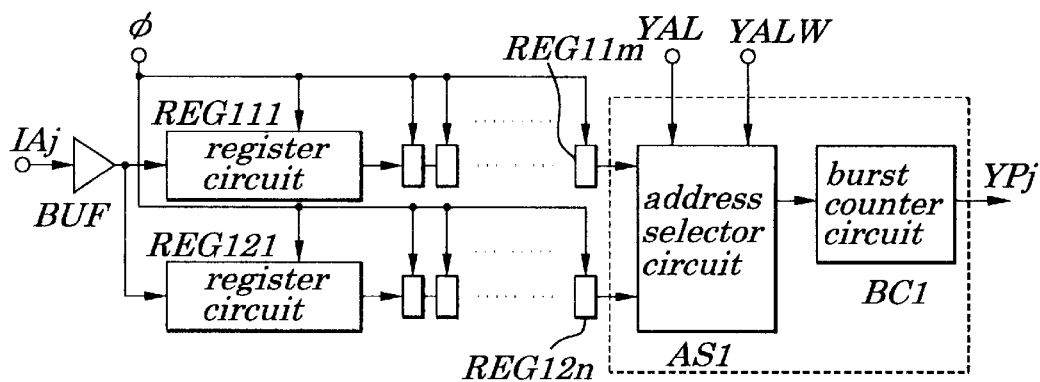
Figure 12C:
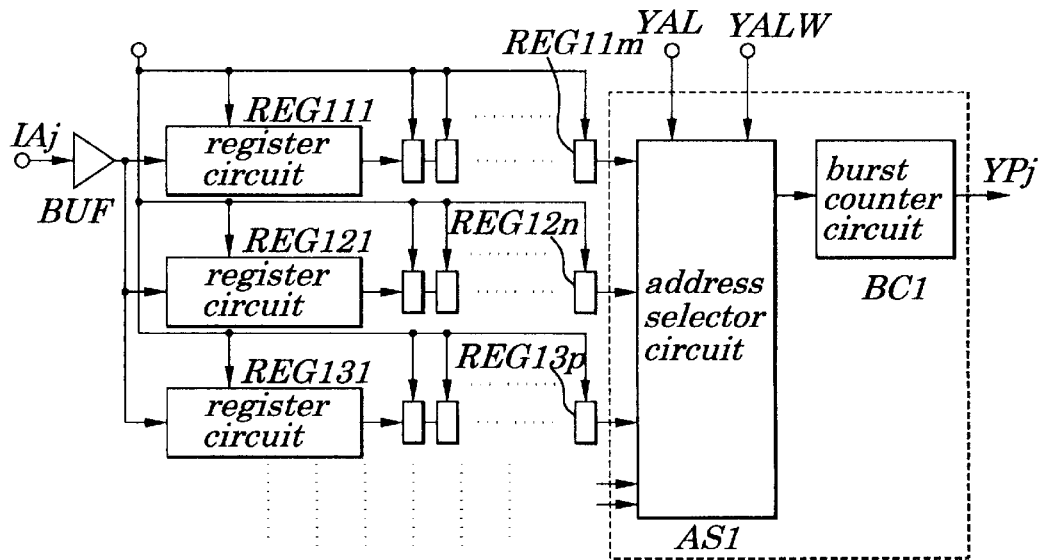

FIGS. 12A through 12C are examples of configurations of the burst counter. The burst counter shown in FIG. 12A is comprised of an input buffer BUF, register circuits REG11 and REG 12, an address selector circuit AS1 and a burst counter circuit BC1. In this example, since an output of the register circuit REG 11 and an output of the register circuit REG 12 are used as an input of the address selector circuit AS, the address selector circuit AS1 causes the burst counter circuit BC1 to start operations of generating an address output YPj with a delay of one clock after inputting of an address input IAj in response to an address controlling signal YAL or two clocks after inputting of the address input IAj in response to an address controlling signal YALW.

Referring to FIG. 12B, the burst counter circuit contains the input buffer BUF, m-stepped register circuits REG 111, ..., REG 11m (m is an arbitrary natural number), n-stepped register circuits REG 121, ..., REG 12n (n is an arbitrary natural number), an address selector circuit AS1 and a burst counter circuit BC1. In this example, register circuits REG 111, ..., REG 11m make an output of the input buffer BUF delayed by m clocks and register circuits REG 111, , REG 11n make an output of the input buffer BUF delayed by n clocks. The address selector circuit AS1 causes a burst counter circuit BC1 to start operations with a delay of m clocks after inputting of the address input IAj by selecting outputs of the register circuit REG 11m in response to the address controlling signal YAL or causes the burst counter circuit BC1 to start operation of generating the address output YPj by selecting outputs of the register circuit REG 12n in response to the address controlling signal YALW.

Referring to FIG. 12C, the burst counter circuit contains the input buffer BUF, m-stepped register circuits REG 111, ..., REG 11m (m is an arbitrary natural number), n-stepped register circuits REG 121, ..., REG 12n (n is an arbitrary natural number), p-stepped register circuits REG 131, ..., REG 13p (p is an arbitrary natural number), two or more stepped register circuits not shown in the drawing, an address selector circuit AS1, and a burst counter circuit BC1.

In this example, register circuits REG 111, ..., REG 11m are used to make an output of the input buffer BUF delayed by m clocks, register circuits REG 121, ..., REG 12n are used to make an output of the input buffer BUF delayed by n clocks, register circuits REG 131, ..., REG 13p are used to make an output of the input buffer BUF delayed by p clocks, and two or more stepped register circuits not shown in the drawing serve to make each of the input buffer BUF delayed by two or more clocks as well. The address selector circuit AS1 causes the burst counter circuit BC1 to start operations of generating the address output YPj by selecting an output of any of the register circuits, for example, an output of the register circuit REG 11m in response of the address controlling signal YAL and with a delay of m clocks after inputting of the address input IAj or by selecting an output of any of the register circuits, for example, an output of the register circuit REG 13p in response of the address controlling signal YALW and with a delay of p clocks after inputting of the address input IAj.

Next, operations of the burst counter are described by referring to FIGS. 13A through 18B.

Let it be assumed that, in the timing charts for the burst counter described below for each example, the number of clocks from one command to another is represented by "n" and an address IA1 is inputted in response to a first command and an address IA2 is inputted in response to a second command.

Figure 13A:
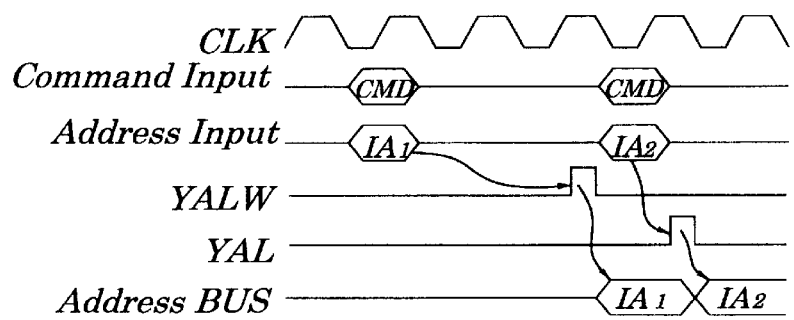
FIGS. 13A through 13C are timing charts showing one example (1) of configurations of the burst counter.
Figure 13B:
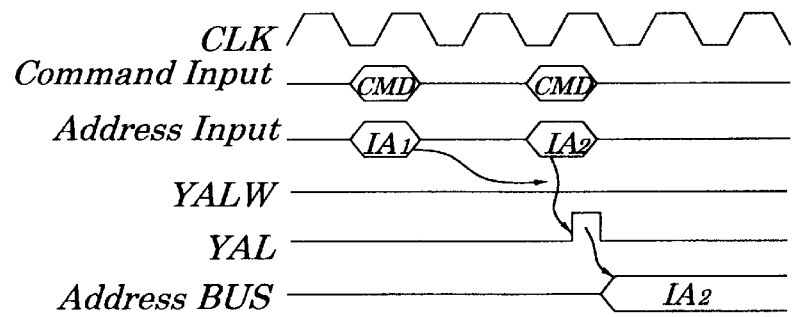
Figure 13C:
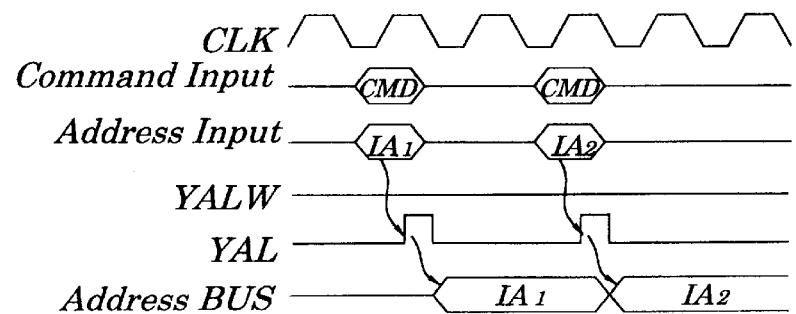

FIGS. 13A through 13C are timing charts showing operations of the burst counter in this example.

The timing chart in FIG. 13A shows that n=3 and addresses IA1 and IA2 are inputted in response to first and second commands CMD and that two clocks after inputting of the first command, an address controlling signal YALW is outputted and an address controlling signal YAL is outputted immediately after inputting of the second command, thus indicating that addresses IA1 and IA2 have been outputted on an address bus.

FIG. 13B shows that n=2 and, since a timing collision occurs between an address controlling signal YALW in response to a first command and an address controlling signal YAL when a second command is received, the address controlling signal YAL in response to the second command is preferentially outputted, thus indicating that an address IA2 is outputted on an address bus.

FIG. 13C shows that n=2 and an address controlling signal YAL in response to a first command and an address controlling signal YAL in response to a second command are outputted sequentially, thus indicating that address IA1 and IA2 are outputted sequentially on an address bus.

Figure 14A:
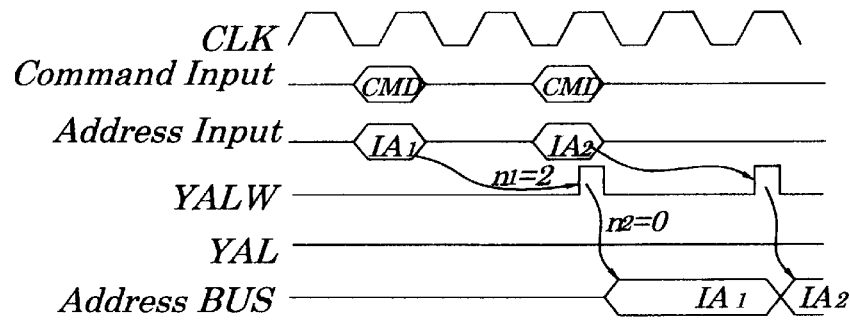
FIGS. 14A through 14C are timing charts showing another example (2) of configurations of the burst counter.
Figure 14B:
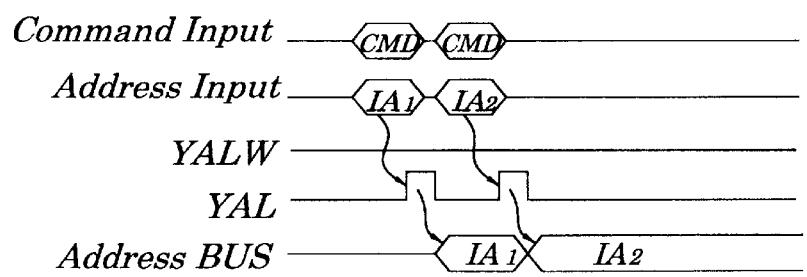
Figure 14C:
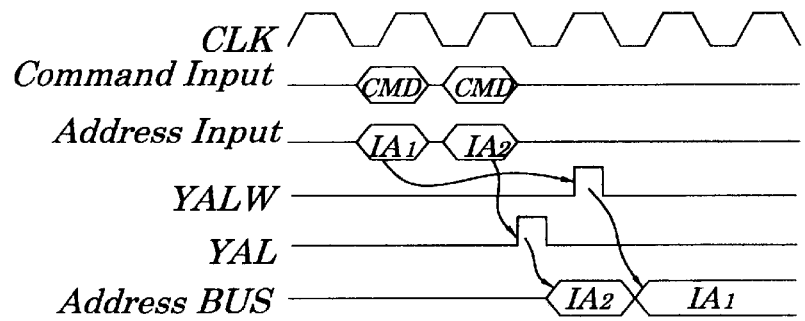

FIGS. 14A through 14C are timing charts showing operations of the burst counter in this example.

FIG. 14A shows that n=2 and an address controlling signal YALW in response to a first command and an address controlling signal YALW in response to a second command are outputted sequentially, thus indicating that addresses IA1 and IA2 are outputted sequentially on an address bus.

FIG. 14B shows that n=1 and an address controlling signal YAL in response to a first command and an address controlling signal YAL in response to a second command are outputted sequentially, thus indicating that addresses IA1 and IA2 are outputted sequentially on an address bus.

FIG. 14C shows that n=1 and an address controlling signal YAL in response to a second command and an address controlling signal YALW in response to a first command are outputted sequentially, thus indicating that addresses IA2 and IA1 are outputted sequentially on an address bus.

Figure 15A:
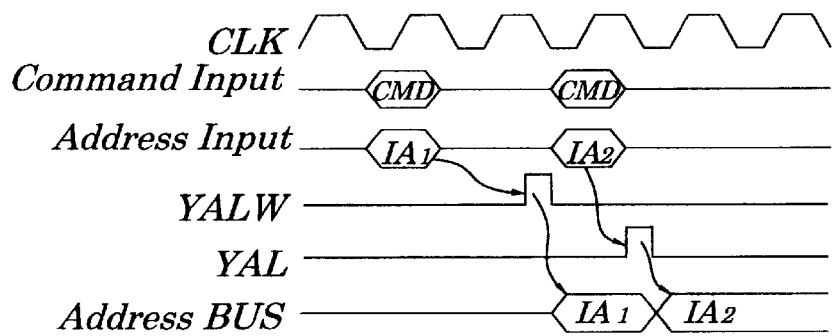
FIGS. 15A through 15C are timing charts showing a third example (3) of configurations of the burst counter.
Figure 15B:
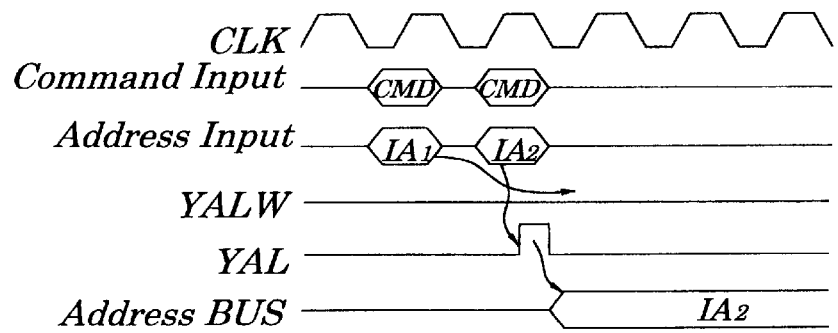
Figure 15C:
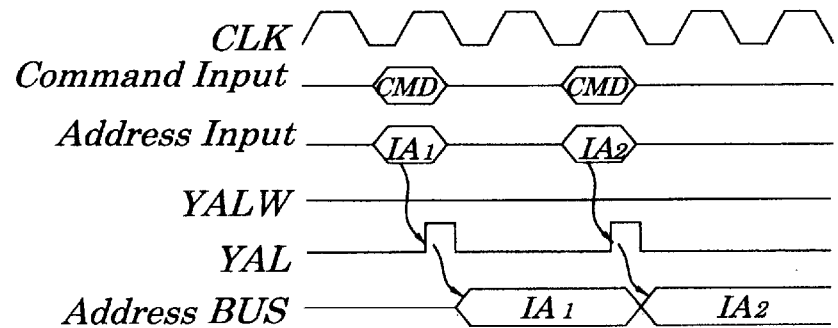

FIGS. 15A through 15C are timing charts showing operations of the burst counter in this example.

FIG. 15A shows that n=2 and an address controlling signal YALW in response to a first command and an address controlling signal YAL in response to a second command are outputted sequentially, thus indicating that addresses IA1 and IA2 are outputted sequentially on an address bus.

FIG. 15B shows that n=1 and, since a timing collision occurs between an address controlling signal YALW in response to a first command and an address controlling signal YAL in response to a second command, the address controlling signal YAL in response to the second command is preferentially outputted, thus indicating that an address IA2 are outputted on an address bus.

FIG. 15C shows that n=2 and an address controlling signal YAL in response to a first command and an address controlling signal YAL in response to a second command are outputted sequentially, thus indicating that addresses IA1 and IA2 are outputted sequentially on an address bus.

Figure 16A:
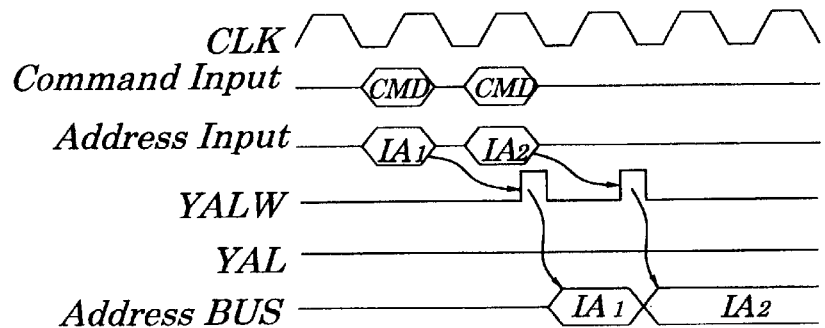
FIGS. 16A through 16C are timing charts showing a fourth example (4) of configurations of the burst counter.
Figure 16B:
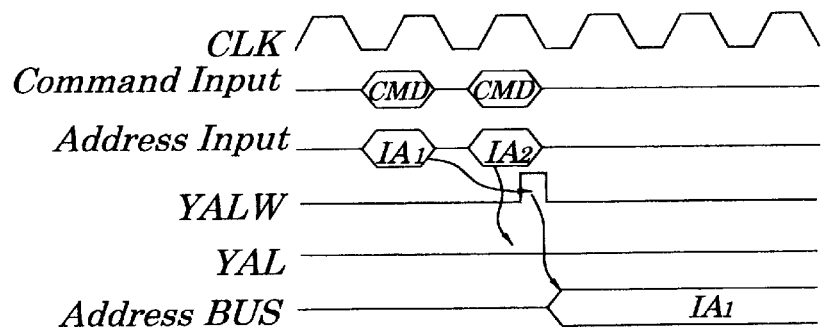
Figure 16C:
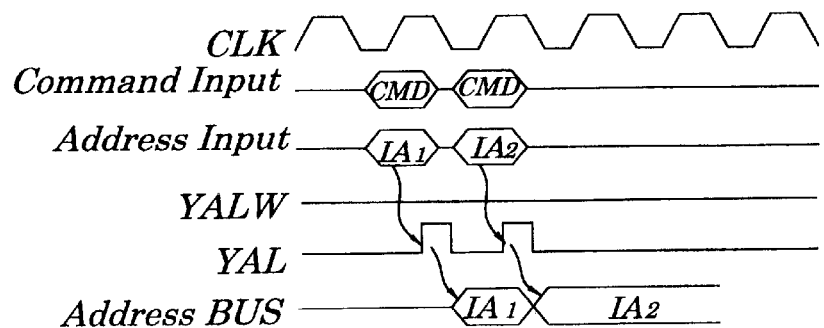

FIGS. 16A through 16C are timing charts showing operations of the burst counter in this example.

FIG. 16A shows that n=1 and an address controlling signal YALW in response to a first command and an address controlling signal YALW in response to a second command are outputted sequentially, thus indicating that addresses IA1 and IA2 are outputted sequentially on an address bus.

FIG. 16B shows that n=1 and, since a timing collision has occurred between an address controlling signal YALW in response to a first command and an address controlling signal YAL when a second command is received, the address controlling signal YALW in response to the second command is preferentially outputted, thus indicating that an address IA1 are outputted on an address bus.

FIG. 16C shows that n=1 and an address controlling signal YAL in response to a first command and an address controlling signal YALW in response to a second command are outputted sequentially, thus indicating that addresses IA1 and IA2 are outputted sequentially on an address bus.

Figure 17A:
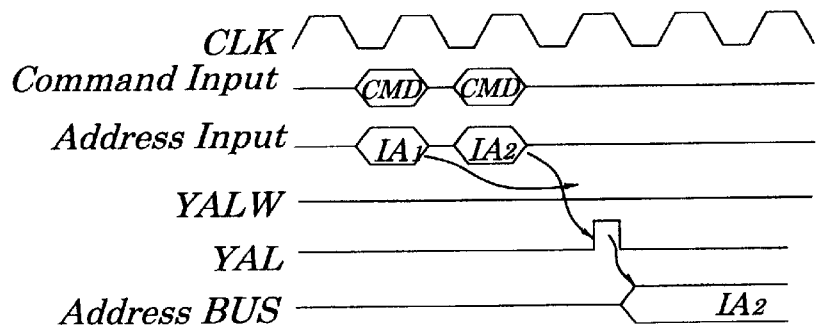
FIGS. 17A through 17C are timing charts showing a fifth example (5) of configurations of the burst counter.
Figure 17B:
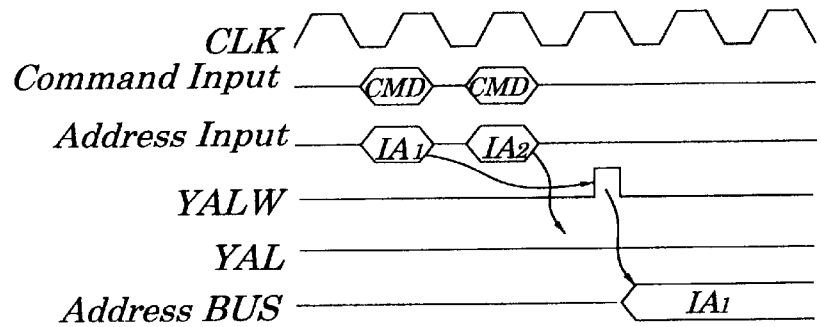
Figure 17C:
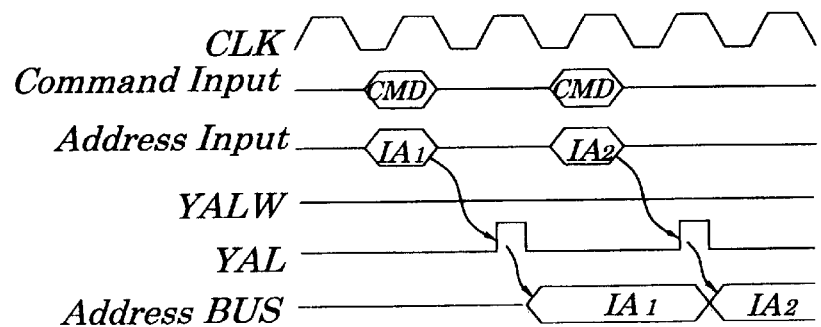

FIGS. 17A through 17C are timing charts showing operations of the burst counter in this example.

FIG. 17A shows that n=1 and, since a timing collision has occurred between an address controlling signal YALW in response to a first command and an address controlling signal YAL when a second command is received, the address controlling signal YALW in response to the second command is preferentially outputted, thus indicating that an address IA2 are outputted on an address bus.

FIG. 17B shows that n=1 and, since a timing collision occurs between an address controlling signal YALW in response to a first command and an address controlling signal YAL in response to a second command, the address controlling signal YALW in response to the second command is preferentially outputted, thus indicating that an address IA1 are outputted on an address bus.

FIG. 17C shows that n=2 and an address controlling signal YAL in response to a first command and an address controlling signal YAL in response to a second command are outputted sequentially, thus indicating that addresses IA1 and IA2 are outputted sequentially on an address bus.

Figure 18A:
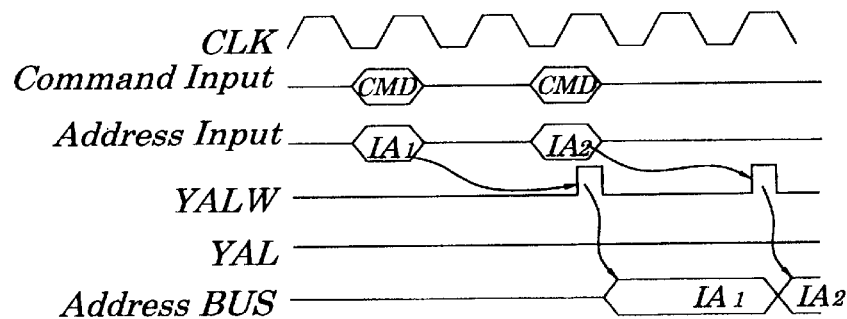
FIGS. 18A and 18B are timing charts showing a sixth example (6) of configurations of the burst counter.
Figure 18B:
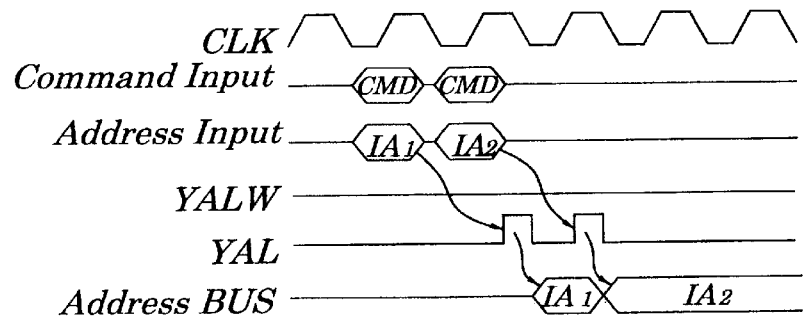

FIGS. 18A and 18B are timing charts showing operations of the burst counter in this example.

FIG. 18A shows that n=2 and an address controlling signal YALW in response to a first command and an address controlling signal YALW in response to a second command are outputted sequentially, thus indicating that addresses IA1 and IA2 are outputted sequentially on an address bus.

FIG. 18B shows that n=1 and an address controlling signal YAL in response to a first command and an address controlling signal YAL in response to a second command are outputted sequentially, thus indicating that addresses IA1 and IA2 are outputted sequentially on an address bus.

Thus, according to the semiconductor memory device of this example, it is possible to perform holding of two or more addresses and outputting of selected addresses corresponding to kinds of commands with a sufficient operational margin. Moreover, according to this embodiment, in a semiconductor memory device having various address inputs, flexible selection of addresses and setting of address output timing are made possible.

Second Embodiment

Figure 19:
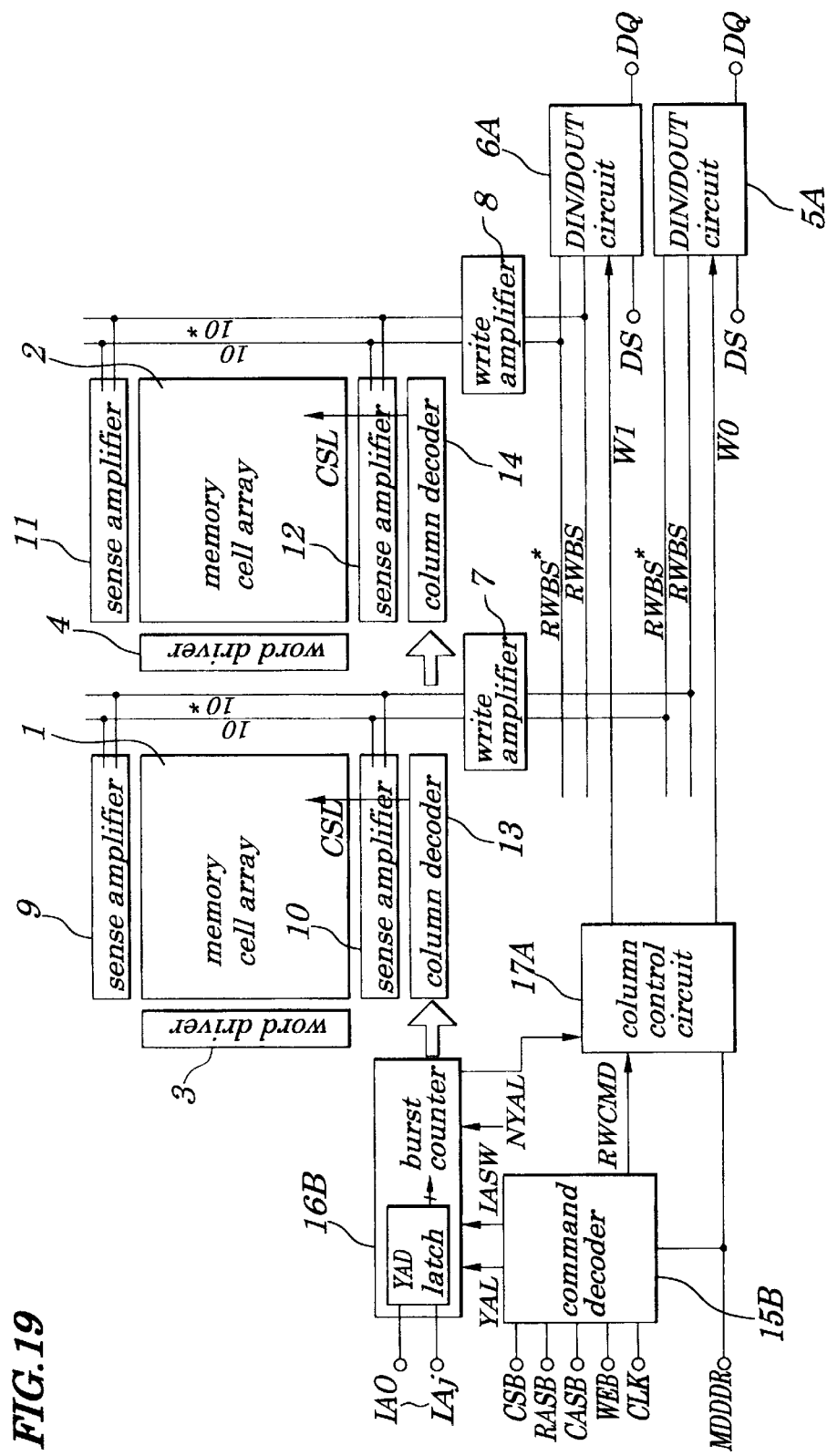
FIG. 19 is a block diagram illustrating an overall configuration of a semiconductor memory device according to a second embodiment of the present invention.

FIG. 19 is a block diagram showing an overall configuration of a semiconductor memory device according to a second embodiment of the present invention;

The semiconductor memory device of this embodiment, as shown in FIG. 19, is comprised approximately of memory cell arrays 1 and 2, word drivers 3 and 4, DIN/DOUT circuits 5A and 6A, write amplifiers 7 and 8, sense amplifiers 9, 10, 11 and 12, column decoders 13 and 14, a command decoder 15B, a burst counter 16B and column control circuit 17A.

The configurations of this embodiment differ greatly from those of the first embodiment (FIG. 1) in that the command decoder 15B does not produce the address controlling signal YALW but produces an address selecting signal IASW and in that the burst counter 16B is adapted to perform control on address outputting using the address controlling signal YAL and on selection of types of addresses using the address selecting signal IASW, instead of control on output timing using the address controlling signal YAL and YALW. Except these components, the configuration of this embodiment is the same as that of the first embodiment. The same reference number in FIG. 19 designates corresponding parts shown in FIG. 1. For simplicity, the description of the same parts is hereinafter omitted.

The command decoder 15B, in the case of the DDR-SDRAM, when a DDR mode signal MDDDR goes high, is generated in response to external command signals CSB, RASB, CASB and WEB, and clock signals CLK, a read/write command RWCMD being an internal command signal, address controlling signals YAL and NYAL and, at the same time, an address selecting signal IASW specifying an address type.

The burst counter 16B, after generating an address output with a timing defined by the address controlling signal when it receives address inputs IA0 to IAj, is used to perform repeated processing of sequentially generating the address output with 2 added, at each time of the occurrence of the address controlling signal NYAL, for a period corresponding to a specified burst length.

Figure 20A:
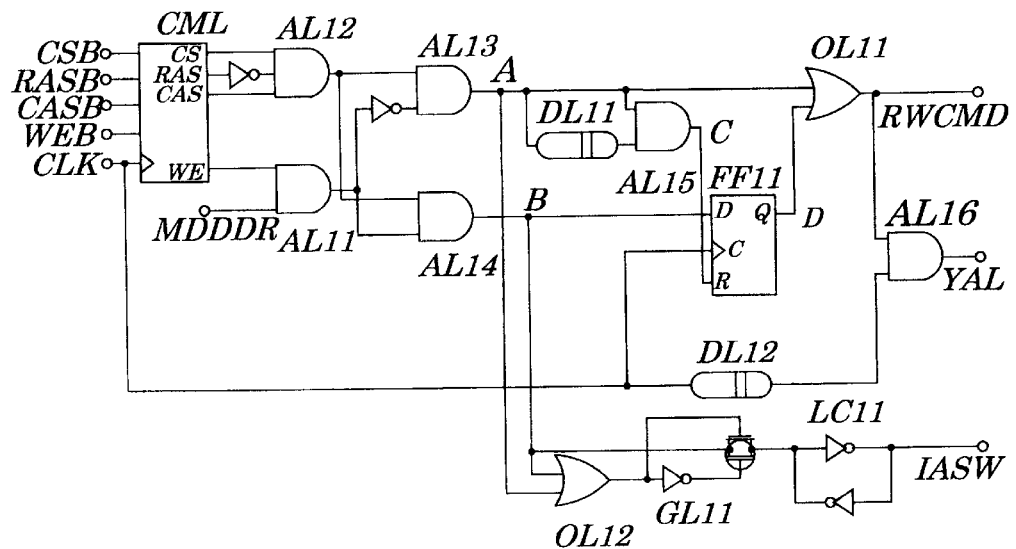
FIG. 20A is a diagram showing an example of configurations of the command decoder and FIG. 20B is a timing chart explaining operations thereof.

Next, configurations and operations of the command decoder 15B are described below. FIGS. 20A is a diagram showing an example (1) of configurations of the command decoder and 20B is a timing chart explaining its operations.

The command decoder of this embodiment, as shown in FIG. 20A, contains a command latching circuit CML, AND circuits AL11, AL12, AL13, AL14, AL15 and AL16, OR circuits OL11 and OL12, a flip-flop FF11, delay devices DL11 and DL12, a gate circuit GL11 and a latching circuit LC11.

The command latching circuit CML is used to receive external command signals CSB, RASB, CASB and WEB of the semiconductor memory device and to decode them in synchronization with a clock CLK and then to output internal command signals CS, RAS, CAS and WE. If an external command signal MDDDR is high, an output of the AND circuit AL11 goes high when the command signal WE is high (i.e., at the time of writing of data) and goes low when the WE is low (i.e., at the time of reading of data). Since an output of the AND AL12 becomes high when a command selection is designated by a command signal CS, a row address selection is not designated by a command signal RAS and a column address selection is designated by a command signal CAS, an output B of the AND circuit AL14 becomes high at the time of data writing and an output of the AND circuit AL13 becomes high at the time of data reading. This causes a read/write command RWCMD to be immediately outputted through an AND circuit AL13 and an OR circuit OL 11 and another read/write command RWCMD to be outputted by an output D generated with a delay of one clock through an AND circuit AL14 and a flip-flop FF11. Moreover, when timing of the output of the OR circuit OL 11 is matched to that of the clock signal CLK, an address controlling signal YAL is outputted from the AND circuit AL16. At this point, the address controlling signal YAL is used as 1 shot pulse to respond to a rise of the read/write command RWCMD by making the clock signal CLK delayed using a delay device DL11.

By connecting an output C generated by an output A of the AND circuit AL13 and by passing the output A through the delay device DL11 to an input for reset R of a flip-flop FF11, the flip-flop FF11 is reset when two inputs occur at the OR circuit so that the read/write command RWCMD is not generated by an output B and the read/write command RWCMD is preferentially generated by the output A.

On the other hand, since the outputs A and B are inputted into a gate circuit GL1 through an OR circuit OL12, the ON/OFF of gate circuit GL11 is controlled in accordance with the on/off of the output B, and an address selection signal IASW is outputted by latching the output of the gate circuit GL11 with a latching circuit LC11, the address selection signal IASW goes high at the time of writing data and goes low at the time of reading data.

Figure 20B:
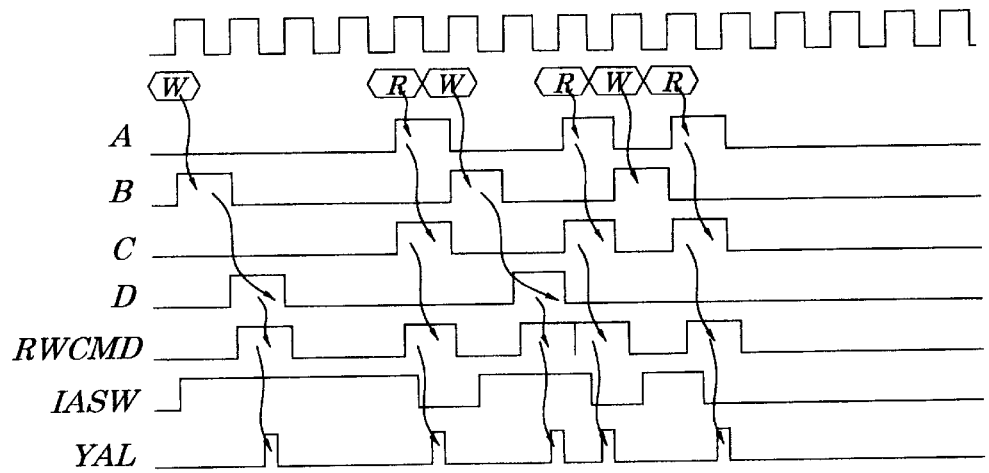

FIG. 20B shows an example of operations of the command decoder of this embodiment. When a write command W is inputted, an output B is generated and an output D is generated with a delay of one clock, and a read/write command RWCMD is outputted through the OR circuit OL11 and an address controlling signal YAL is outputted. During this timing, an address selection signal IASW is high, indicating that the output of the address controlling signal YAL is induced by the write command. Moreover, when a read command R is inputted, an output A is generated and the read/write command RWCMD is outputted and the address controlling signal YAL is outputted. During this timing, an address selection signal IASW is low, indicating that the output of the address controlling signal YAL is induced by the read command. When the read command R is inputted with a delay of one clock after inputting of the write command, though an output A is generated following an output B, since the flip-flop FF11 is reset due to the occurrence of an output C, an output D is not generated and a read/write command EWCMD in response to the output A is outputted and an address controlling signal YAL is outputted. During this timing, an address selection signal IASW is low, indicating that the output of the address controlling signal YAL is induced by the write command.

Figure 21A:
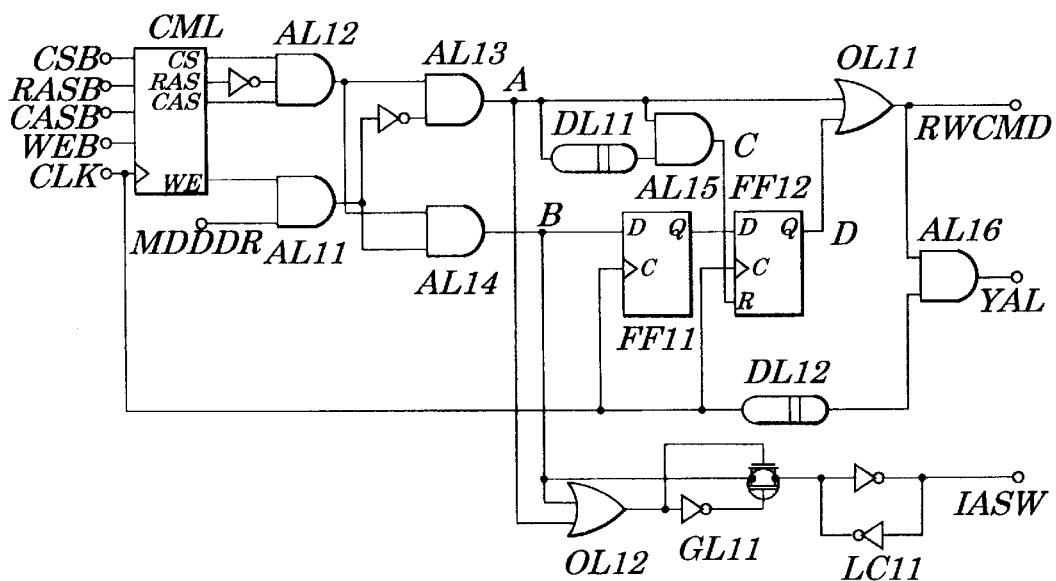
FIG. 21A is a diagram showing an example of configurations of the command decoder and FIG. 21B is a timing chart explaining operations thereof.
Figure 21B:
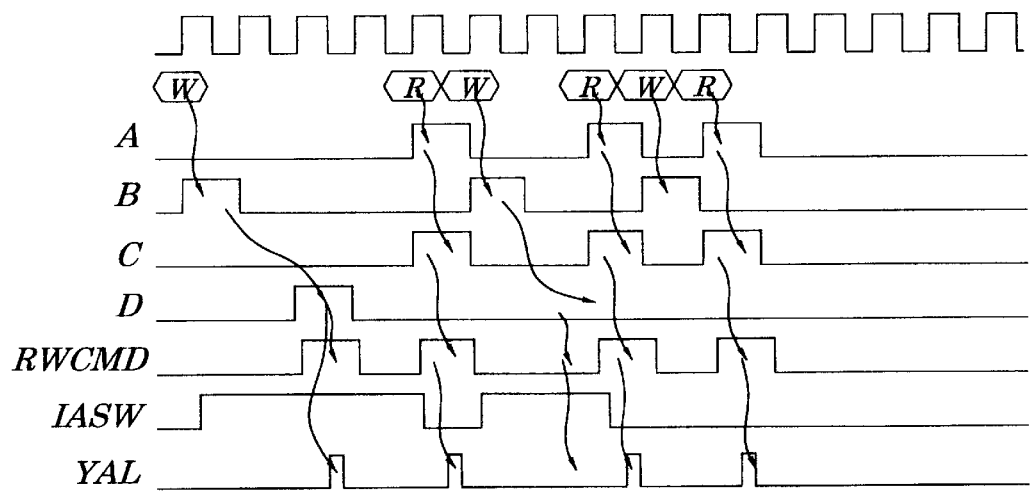

FIG. 21A is a diagram showing an example (2) of configurations of the command decoder and FIG. 21B is a timing chart explaining its operations;

The command decoder of this embodiment, as shown in FIG. 21A, contains a command latching circuit CML, AND circuits AL11, AL12, AL13, AL14, AL15 and AL16, OR circuits OL11 and OL12, a flip-flop FF11, delay devices DL11 and DL12, a gate circuit GL11 and a latching circuit LC11.

In the command decoder of this embodiment, since it has larger steps of flip-flops by one than in that shown in FIG. 20, when it responds to operations of the DDR-SDRAM, a read/write command RWCMD induced by a write command and an address controlling signal YAL are outputted with a delay of two clocks.

In this case, when a read command R is inputted with a delay of two clocks after inputting of a write command W and the read command R is inputted with a delay of one clock after inputting of the write command, since the flip-flop FF11 is reset due to the occurrence of an output C, an output D is not generated, and the read/write command RWCMD in response to an output A is outputted and the address controlling signal YAL is outputted. During this timing, an address selection signal IASW is low, indicating that the output of the address controlling signal YAL is induced by the read command.

Figure 22A:
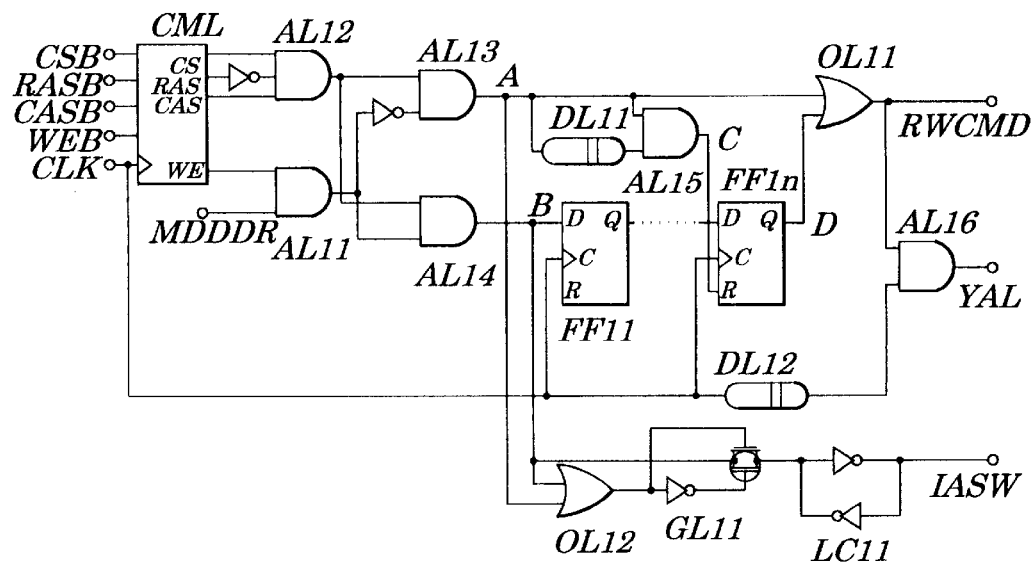
FIG. 22A is a block diagram showing an example of configurations of the command decoder and FIG. 22B is a timing chart explaining operations thereof.
Figure 22B:
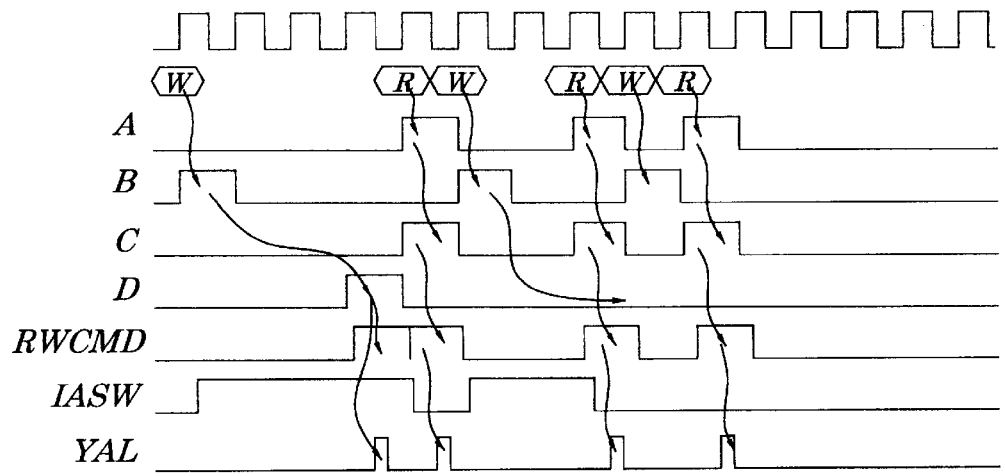

FIG. 22A is a diagram showing an example (3) of configurations of the command decoder and FIG. 22B is a timing chart explaining its operations.

The command decoder of this embodiment, as shown in FIG. 22A, contains a command latching circuit CML, AND circuits AL1, AL12, AL13, AL14, AL15 and AL16, OR circuits OL11 and OL12, n-stepped flip-flop FF11, , FF1n (n is an arbitrary natural number), delay devices DL11 and DL12, a gate circuit GL11 and a latching circuit LC11.

In the command decoder of this embodiment, since it has arbitrary n-stepped flip-flops unlike in the case of the command decoder in that shown in FIG. 20, when it responds to operations of the DDR-SDRAM, a read/write command RWCMD induced by a write command and an address controlling signal YAL are outputted with a delay of n clocks (n=3 in the drawing).

In this case, when a read command R is inputted with a delay of two clocks after inputting of a write command W and the read command R is inputted with a delay of one clock after inputting of the write command, since the flip-flop FF11 is reset due to the occurrence of an output C, an output D is not generated, and the read/write command RWCMD in response to an output A is outputted and the address controlling signal YAL is outputted. During this timing, an address selection signal IASW is low, indicating that the output of the address controlling signal YAL is induced by the read command.

As depicted in FIG. 22A, the address selection signal IASW is produced by outputs from nodes A and B and does not contain such delayed information as included in the read/write command RWCMD produced through flip-flops FF11, . . . , FF1n. Even in this case, if a change of the sequence of the address output to commands is desired, the address selection signal IASW can be produced using two input signals to the OR circuit 11 instead of using outputs from nodes A and B. Furthermore, even in the case of specifications where a write command inputted previously is fully interrupted by a read command inputted later, reset signals are inputted to all flip-flops FF11, . . . , FF1n.

In the case of specifications where, if a command (not shown) other than the read command and write command is inputted, the read command and write command inputted previously are interrupted, outputs obtained by ORing reset signals generated from commands described above with outputs from the node C are inputted to all flip-flops FF11, FF11, . . . , FF1n.

Figure 23A:
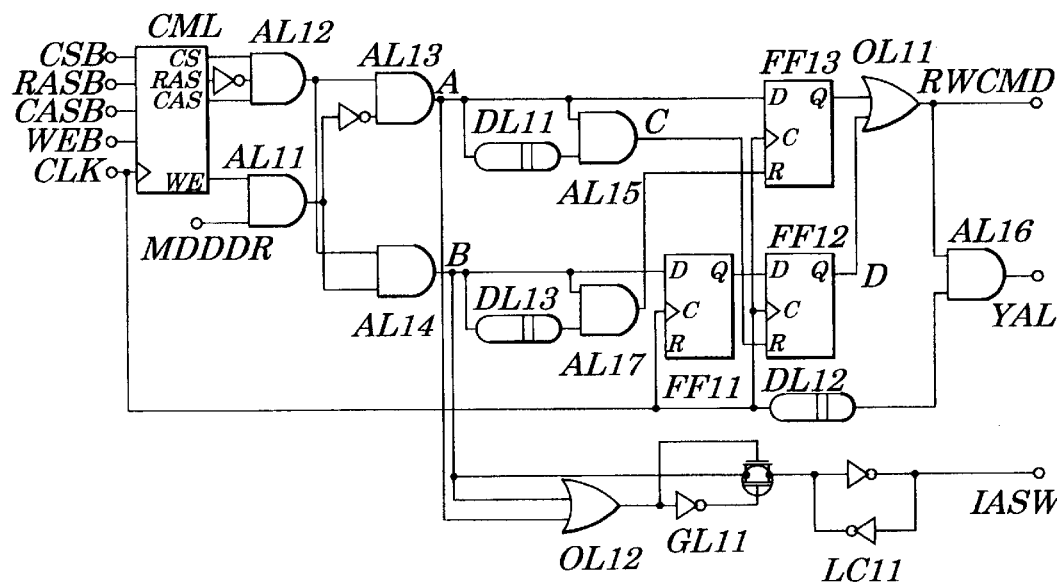
FIG. 23A is a block diagram showing an example of configurations of the command decoder and FIG. 23B is a timing chart explaining operations thereof.
Figure 23B:
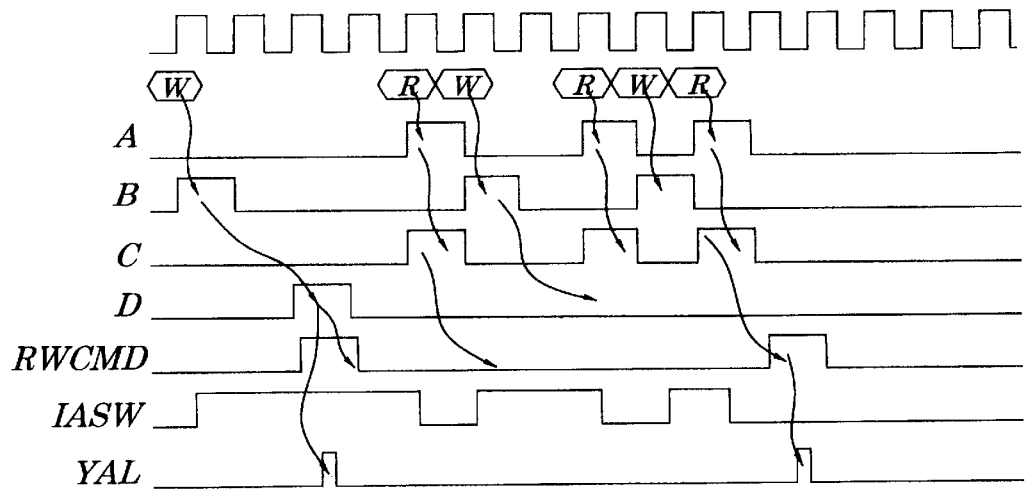

FIG. 23A is a diagram showing an example (4) of configurations of the command decoder and FIG. 23B is a timing chart explaining its operations.

The command decoder of this embodiment, as shown in FIG. 23A, contains a command latching circuit CML, AND circuits AL1, AL12, AL13, AL14, AL15, AL16 and AL17, OR circuits OL11 and OL12, flip-flops FF11, FF12 and FF13, delay devices DL11 and DL12, a gate circuit GL11 and a latching circuit LC11.

The command decoder of this embodiment differs from that shown in FIG. 21 in that it has a flip-flop FF13 between an output A of the AND circuit AL113 and an input of the OR circuit OL11 and an output B of the AND circuit AL14 is supplied to the Flip-flop FF13 as a reset input R through a delay device DL13 and the AND circuit AL17. This causes a read/write signal RWCMD and an address controlling signal YAL to be outputted at the time of inputting of a write command with a delay of 2 clocks and another read/write RWCMD and the address controlling signal YAL to be outputted at the time of inputting of a read command with a delay of one clock.

Moreover, when the read command R is inputted with a delay of two clocks after inputting of the write command W and the read command R is inputted with a delay of one clock after inputting of the write command W, since the flip-flop FF12 is reset due to the occurrence of an output C, the read/write command RWCMD in response to the write command and the address controlling signal YAL are not outputted. When the write command W is inputted with a delay of one clock after inputting of the read command R, since the flip-flop FF13 is reset by an output of the AND circuit AL17, the read/write command RWCMD in response to the read command and the address controlling signal are not outputted.

Next, examples of configurations and operations of the burst counter of this embodiment are described below.

FIGS. 24A through 24E are diagrams showing configurations of register circuits and selector circuits constituting the burst counter of the semiconductor memory device of the present invention. FIGS. 25A through 25D and FIGS. 26A through 26C show examples of configurations of the burst counter. FIGS. 27A through 27C, FIGS. 28A through 28C, FIGS. 29A through 29C and FIGS. 30A through 30C are timing charts of examples of configurations of the burst counter.

Figure 24A:
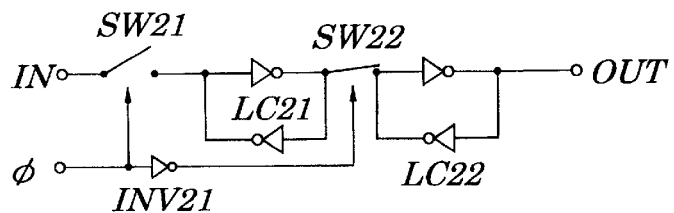
FIGS. 24A through 24E are diagrams showing configurations of register circuits and selector circuits constituting the burst counter of the semiconductor memory device of the present invention.

FIG. 24A shows operational principles of the register circuit comprised of switches SW1 and SW2, latching circuits LC21 and LC22 and an inverter INV21.

In the register circuit in this example, when a clock φ is high, the switch SW21 is turned ON and the switch SW22 is turned OFF, the state of an input IN is captured and latched into a latching LC21, and when a clock φ is low, the switch SW21 is turned OFF, the switch SW22 is turned ON, a state of the latching LC21 is latched into the latching circuit LC22, thus causing an output OUT to be generated and the state of the input IN to be maintained for a period of one clock.

Figure 24B:
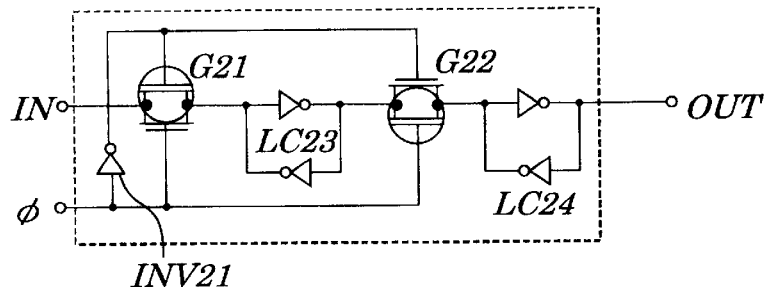

FIG. 24B shows a specific example of the register circuit comprised of gate circuits G21 and G22, latching circuits LC23 and LC24, and an inverter INV21.

In the register circuit in this example, when a clock (is high, the gate circuit G21 is turned ON and the gate circuit G22 is turned OFF, the state of an input IN is captured and latched into a latching circuit LC23, and when a clock (is low, the gate circuit G21 is turned OFF, the gate circuit G22 is turned ON, a state of the latching circuit LC23 is latched into the latching circuit LC24, thus causing an output OUT to be generated and the state of the input IN to be maintained for a period of one clock.

Figure 24C:
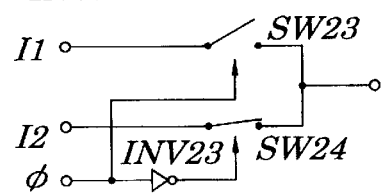

FIG. 24C shows operational principles of the selector circuit comprised of switches SW23 and SW24.

In the selector circuit in this example, when a clock φ is high, the switch SW23 is turned ON and the switch SW24 is turned OFF, causing an input 11 to be outputted, and then when a clock φ is low, the switch SW23 is turned OFF and the switch SW24 is turned ON, causing an input 12 to be outputted and the input 11 and 12 to be switched for outputting.

Figure 24D:
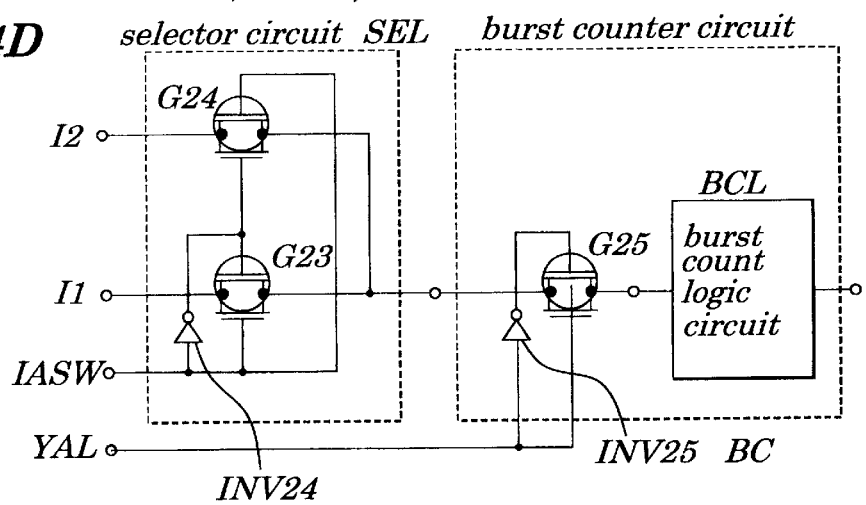

FIG. 24D shows a specific example of configurations of the selector circuit and the burst counter circuit, which is comprised of the selector circuit SEL having gate circuits G23 and G24, and a burst counter circuit BC having a gate circuit G25 and an inverter INV25 and a burst count logic circuit.

According to this configuration, in the selector circuit SEL, when an address selecting signal IASW is high, the gate circuit G23 is turned ON and the gate circuit G24 is turned OFF, causing an input 11 to be selected, while, when the address selecting signal a?IASW is low, the gate circuit G23 is turned OFF and the gate circuit G24 is turned ON, causing an input 12 to be selected. In the address counter circuit BC, when the address controlling signal YAL is high, the selected input 12 is inputted to the burst count logic circuit BCL, causing the circuit BCL to start operations of generating address outputs.

Figure 24E:
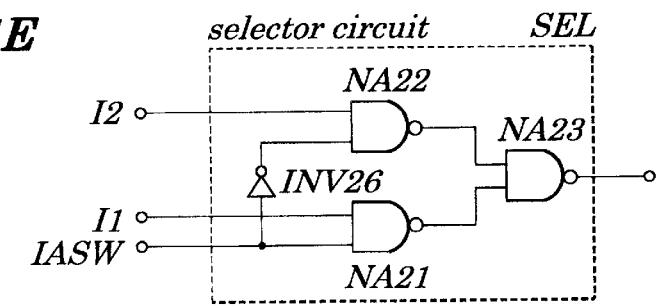

FIG. 24E shows an example of specific configurations of the selector circuit, which is comprised of NAND circuits NA21, NA22 and NA22, and the selector circuit SEL. According to the configuration in this example, in the selector circuit SEL, when an address selection signal IASW is high, an input 11 is outputted from the NAND circuit NA21, and when the address selection signal IASW is low, an input 12 is outputted from the NAND circuit NA22 which passes through the NAND circuit NA23 and is outputted as a signal being high.

FIGS. 25A through 25D show examples of configurations of the burst counter.

Figure 25A:
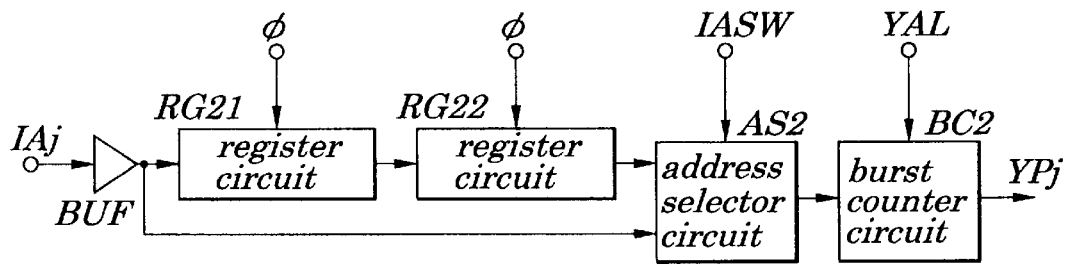
FIGS. 25A through 25D show examples (1) of configurations of the burst counter.

The configuration shown in FIG. 25A contains an input buffer BUF, register circuits RG21 and RG22, an address selector circuit AS2, and a burst counter circuit BC2. In this configuration, the register circuits RG21 and RG22 are used output an address input IAj fed from the input buffer BUF with a delay of one clock in response to a clock signal φ. The address selector circuit AS2 is used to select an output of the input buffer BUF or an output of the register circuit RG22 in response to the address selecting signal IASW and to input it to the burst counter circuit BC2. This causes an address output to be generated in response to the address selecting signal IASW immediately or 2 clocks after inputting of the address input IAj with a timing of the address controlling signal YAL, and thereafter, at each time of the occurrence of the address controlling signal YAL, this also causes processing of sequentially generating the address output YPj with 2 added to be performed repeatedly, every one clock, for a period corresponding to a specified burst length.

Figure 25B:
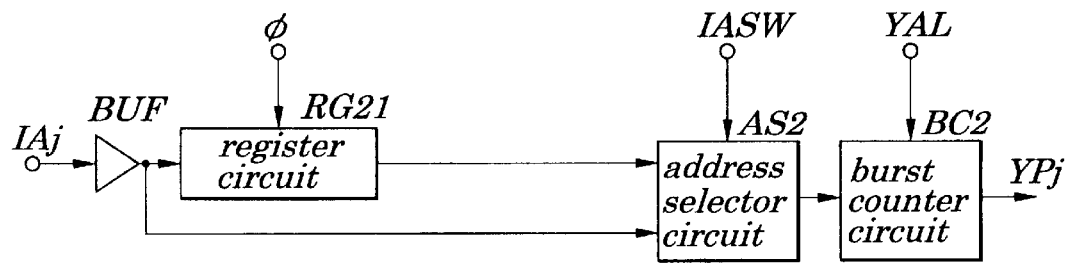

The configuration shown in FIG. 25B contains an input buffer BUF, a register circuit RG21, an address selector circuit AS2 and a burst counter circuit BC2. The configuration in this example differs from that shown in FIG. 25A in that the number of the register circuits is smaller one step; because of this, the address selector circuit AS2 is used to make the burst counter circuit BC2 start its operations, in response to an address selecting signal IASW immediately or one clock after inputting of the address input IAj.

Figure 25C:
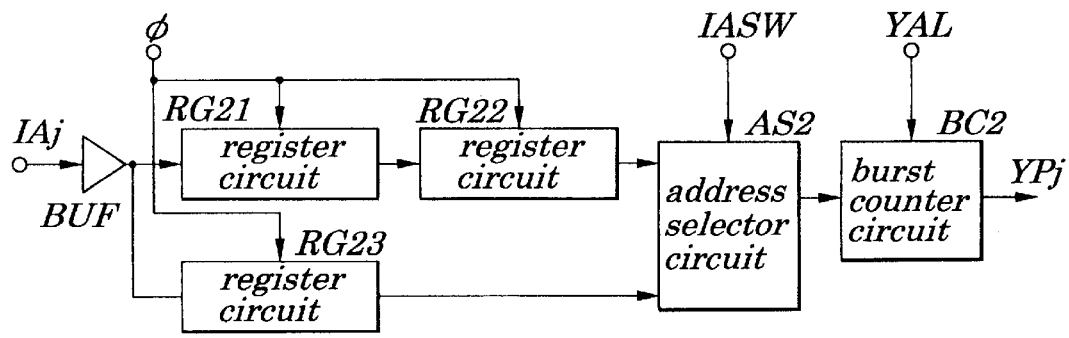

The configuration shown in FIG. 25C contains an input buffer BUF, register circuits RG21, RG22 and RG23, an address selector circuit AS2 and a burst counter circuit BC2.

The configuration in this example differs from that shown in FIG. 25A in that, since it has the register circuit RG23, the address selector circuit AS2 is used to have the burst counter circuit BC2 start its operations, in response to an address selecting signal IASW one clock or two clocks after inputting of the address input IAj.

Figure 25D:
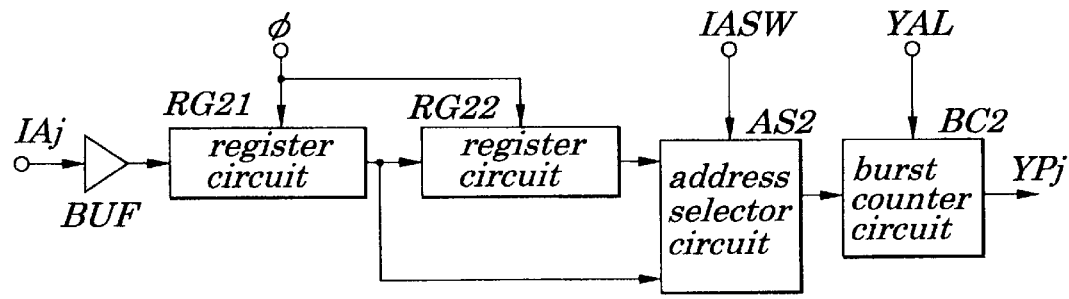

The configuration shown in FIG. 25D contains an input buffer BUF, register circuits RG21 and RG22, an address selector circuit AS2 and a burst counter circuit BC2.

In this example, since outputs of the register circuit RG21 and of the register circuit RG22 are used as inputs of the address selector circuit AS2, the address selector circuit AS2 is used to have the burst counter circuit BC2 start its operation, in response to the address selecting signal IASW one clock or two clocks after inputting of the address input IAj.

FIGS. 26A through 26D show examples of configurations of the burst counter.

Figure 26A:
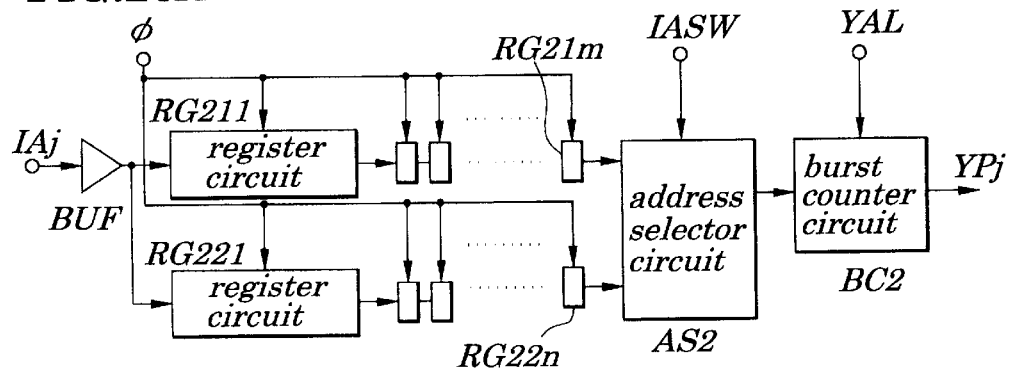
FIGS. 26A through 26C show other examples (2) of configurations of the burst counter.

The configuration shown in FIG. 26A contains an input buffer BUF, m-stepped register circuits RG211, . . . , RG21$m$ ("m" is a natural number), n-stepped register circuits RG221, . . . , RG22$n$ ("n" is a natural number), and an address selector circuit AS2 and a burst counter circuit BC2.

In this example, the register circuit RG211, . . . , RG21$m$ is used to make an address input IAj from the input buffer BUF delayed by m clock(s) and the register circuit RG221, . . . , RG22$n$ is used to make the address input IAj from the input buffer BUF delayed by n clock(s). The address selector circuit AS2 serves to have the burst counter circuit BC2 start its operation by selecting outputs of the register circuit RG21$m$ or of the register circuit RG22 in response to an address selecting signal IASW with a delay of m clock(s) or n clock(s).

Figure 26B:
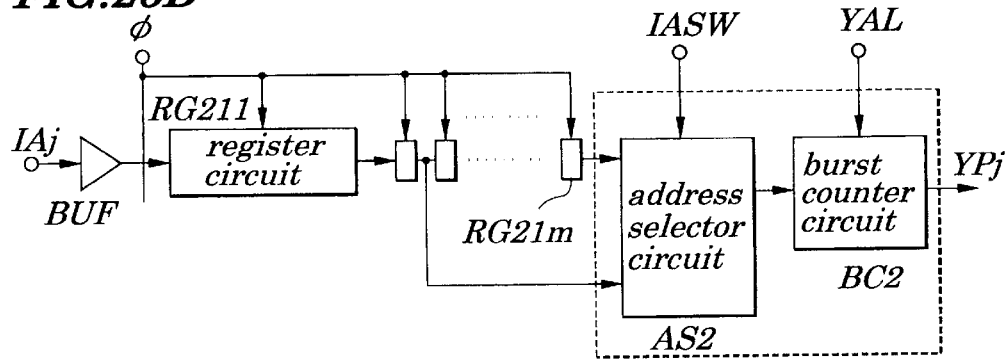

The configuration shown in FIG. 26B contains an input buffer BUF, m-stepped register circuits RG211, . . . , RG21$m$ (m is an arbitrary number), an address selector circuit AS2 and a burst counter circuit BC2.

In this example, since outputs of the register circuit RG211 and of the register circuit RG21$m$ are used as inputs of the address selector circuit AS2, the address selector circuit AS2 is used to have the burst counter circuit BC start its operation, in response to the address selecting signal IASW 2 clocks or m clock(s) after inputting of the address input IAj.

Figure 26C:
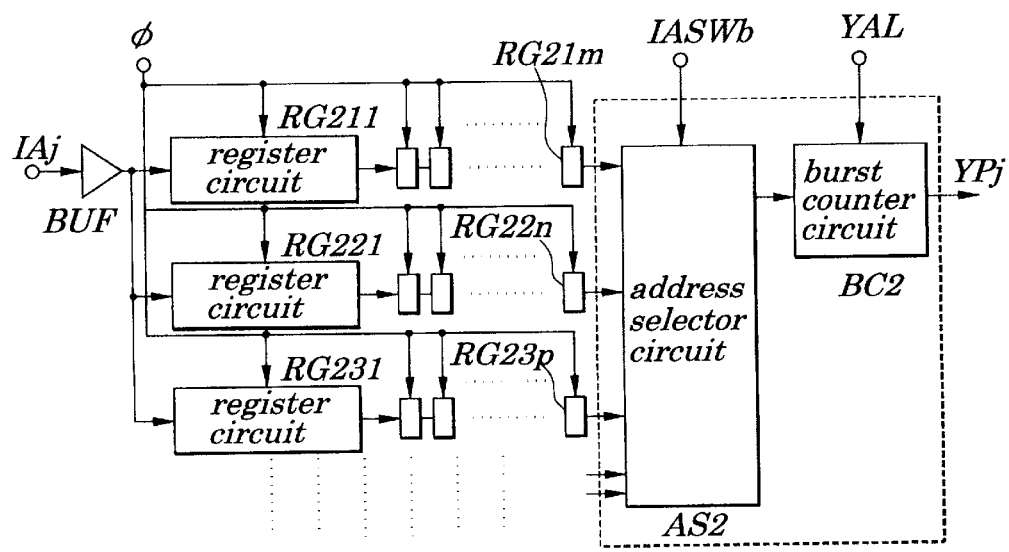

The configuration shown in FIG. 26C contains an input buffer BUF, m-stepped register circuits REG211, . . . , RG21$m$ (m is an arbitrary number), n-stepped register circuits REG221, . . . , RG21$n$ (n is an arbitrary number), p-stepped register circuits REG231, . . . , RG21$p$ (p is an arbitrary number), arbitrary two or more stepped registers with two or more lines (not shown), an address selector circuit AS2 and a burst counter circuit BC2.

In this example, the register circuits REG211, . . . , RG21$m$ are used to make outputs of the input buffer BUF delayed m clock(s), register circuits REG221, . . . , RG21$n$ are used to make outputs of the input buffer BUF delayed n clock(s), register circuits REG231, . . . , RG21$p$ are used to make outputs of the input buffer delayed p clock(s) and the register circuits with two or more lines (not shown) are used to make outputs of the input buffer BUF delayed two or more clocks.

In this example, an address selecting signal ISAWb is outputted corresponding to arbitrary two or more rows of the register circuits. The address selector circuit AS2 is used to have the burst counter circuit BC2 start its operations m clock(s) or n clock(s) after inputting an address input IAj in response to an address selecting signal IASWb, for example, to outputs selected from those of the register circuits REG21$m$ or the register circuits REG22$n$.

Next, operations of the burst counter of this example are described below by referring to FIGS. 27A through 30C.

Figure 27A:
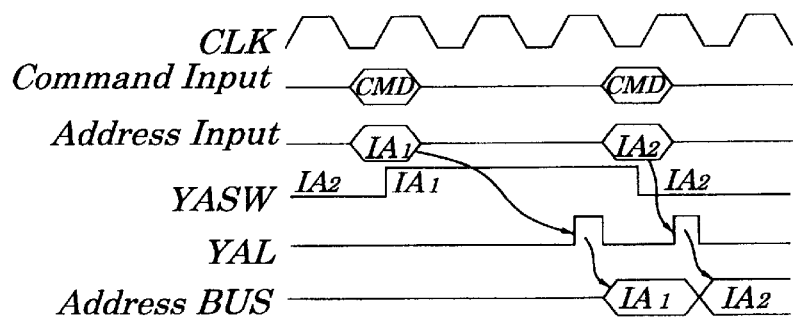
FIGS. 27A through 27C are timing charts of one example (1) of configurations of the burst counter.
Figure 27B:
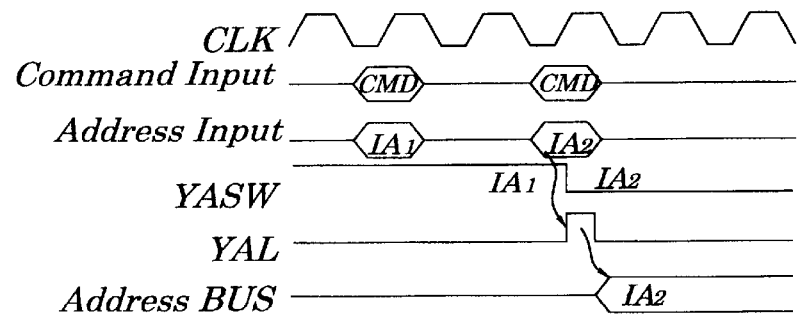
Figure 27C:
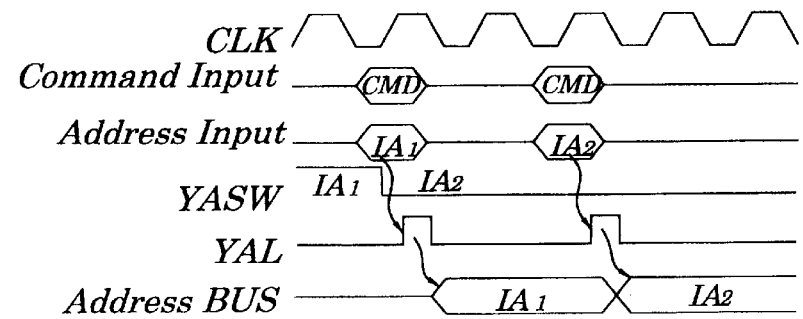

FIGS. 27A, 27B and 27C are timing charts showing examples of operations of the burst counter of this example.

FIG. 27A shows that n=3 and, when address inputs IA1 and IA2 are inputted in response to a first and second commands CMD, as an address selecting signal IASW goes high by inputting of the first command, an address IA1 is outputted, tow clock later, on an address bus with a timing of an address controlling signal YAL, and the address selecting signal IASW goes low by inputting of the second command, an address IA2 is outputted immediately with a timing of the address controlling signal YAL.

FIG. 27B shows that n=2 and, when a first command is inputted, as an address selecting signal IASW goes high, an address controlling signal YAL is outputted 2 clocks later and at the same time the address selecting signal IASW goes low by inputting of a second command and immediately the address controlling signal YAL is outputted, causing a collision of generating timing of both signals, however, because the address controlling signal YAL is preferentially outputted by the second command, an address IA2 is outputted on an address bus.

FIG. 27C shows that n=2 and, when an address selecting signal IASW goes low by inputting of a first command, an address IA1 is outputted immediately on an address bus with a timing of an address controlling signal YAL and when a second command is inputted, the address selecting signal IASW continues to be low and an address IA2 is outputted immediately on an address bus with a timing of the address controlling signal YAL.

Figure 28A:
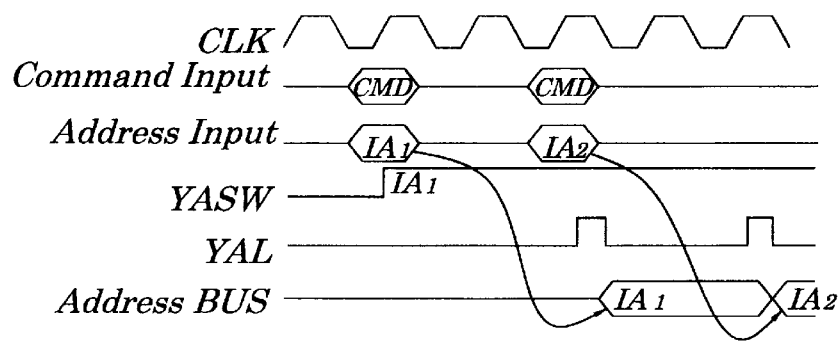
FIGS. 28A through 28C are timing charts of another example (2) of configurations of the burst counter.
Figure 28B:
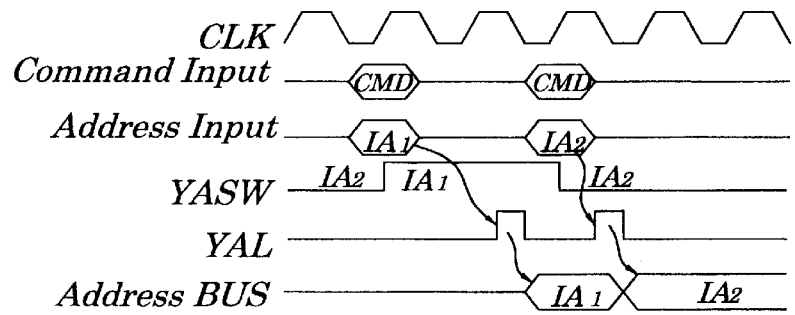
Figure 28C:
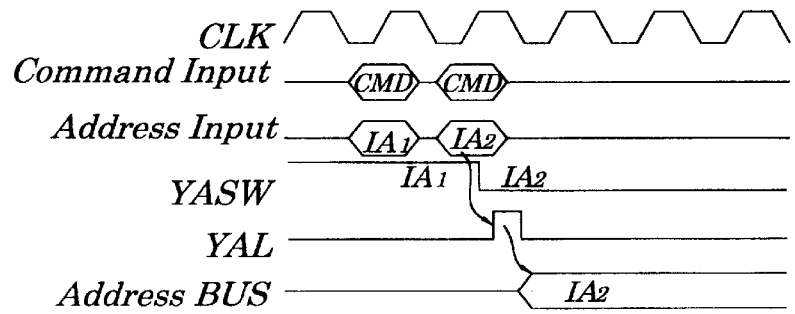

FIGS. 28A, 28B and 28C are timing charts showing examples of operations of the burst counter.

FIG. 28A shows that n=2 and, when an address selecting signal IASW goes high by a first command input, 2 clocks later, an address IA1 is outputted with a timing of an address controlling signal IASW, and when a second command is inputted, the address controlling signal IASW continues to be high and, 2 clocks later, an address IA2 is outputted on an address bus.

FIG. 28B shows that n=2 and, when the address selecting signal IASW goes high by a first command input, 1 clock later, an address IA1 is outputted in the bus with a timing of the address controlling signal YAL, and when the address selecting signal IASW goes low by a second command input, an address IA2 is immediately outputted in the bus with a timing of the address controlling signal YAL.

FIG. 28C shows that n=1 and, when a first command is inputted, the address selecting signal IASW goes high and, one clock later, at the same time when the address controlling signal YAL is outputted, the address selecting signal IASW goes low and immediately the address controlling signal is outputted, causing a collision between both signals, however, the address controlling signal YAL is preferentially selected by a second command and an address IA2 is outputted by the address bus.

Figure 29A:
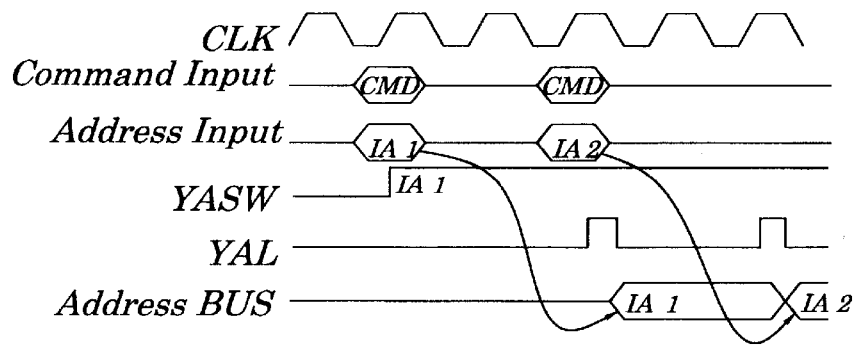
FIGS. 29A through 29C are timing charts of other example (3) of configurations of the burst counter.
Figure 29B:
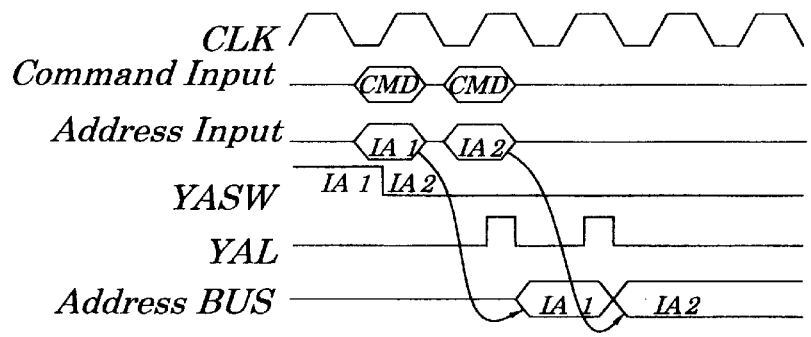
Figure 29C:
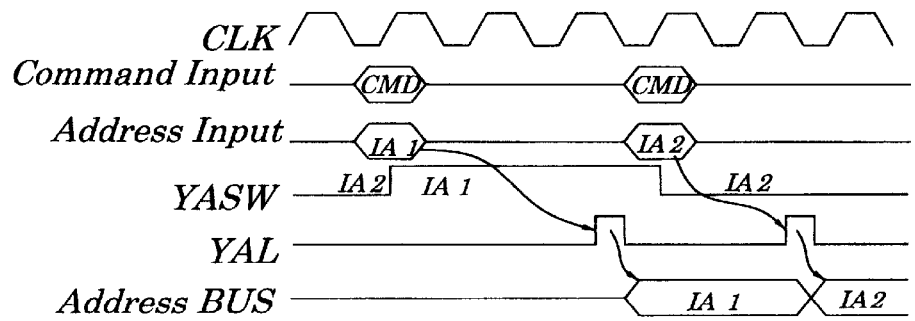

FIGS. 29A, 29B and 29C are timing charts showing examples of operations of the burst counter.

FIG. 29A shows that n=2 and, when a first command is inputted, the address selecting signal IASW goes high and, an address IA1 is outputted, 2 clocks later, by inputting of a first command with a timing of an address controlling signal YAL, and when a second command is inputted, the address selecting signal IASW continues to be high and an address IA2 is, 2 clock later, outputted with a timing of the address controlling signal YAL.

FIG. 29B shows that n=1 and, when a first command is inputted, an address selecting signal IASW goes low and, by inputting of the first command, an address IA1 is outputted, one clock later, with a timing of an address controlling signal YAL, and when a second command is inputted, the address selecting signal IASW continues to be low and an address IA2 is outputted, one clock later, in a address bus with a timing of the address controlling signal YAL.

FIG. 29B shows that n=1 and, when a first command is inputted, an address selecting signal IASW goes high and, 2 clocks later an address IA1 is outputted with a timing of an address controlling signal YAL, when a second command is inputted, the address selecting signal IASW goes low and one clock later an address IA2 is outputted on an address bus with a timing of the address controlling signal YAL.

Figure 30A:
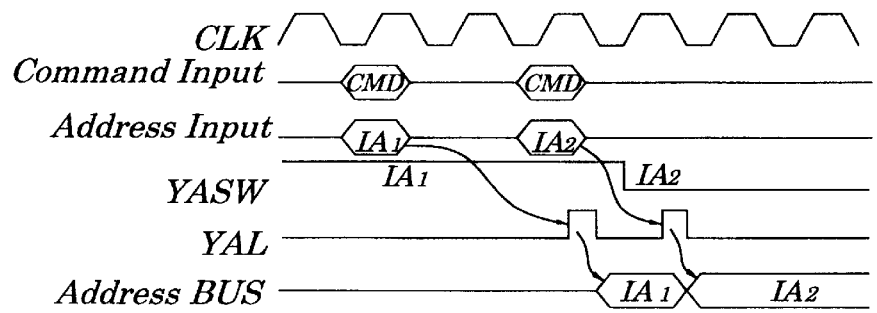
FIGS. 30A through 30C are timing charts of the example (4) of configurations of the burst counter.
Figure 30B:
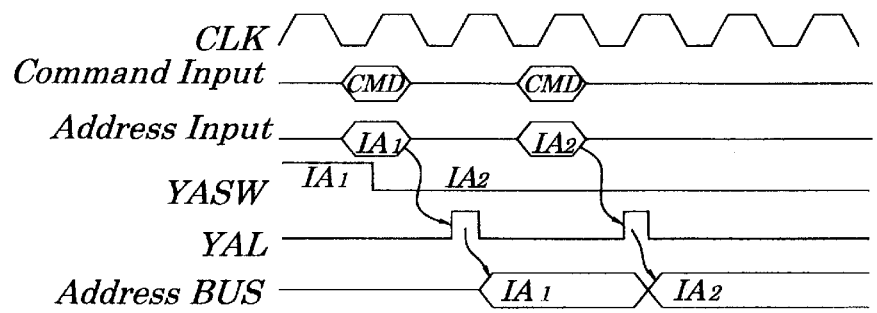
Figure 30C:
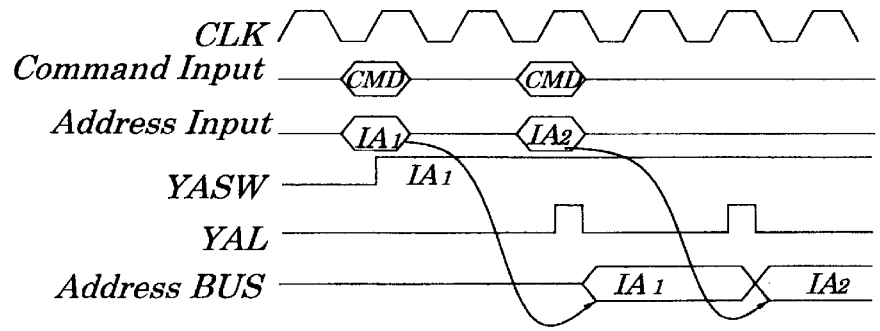

FIGS. 30A, 30B and 30C are timing charts showing examples of operations of the burst counter.

FIG. 30A shows that n=2 and, when a first command is inputted, an address selecting signal IASW goes high, and by inputting of the first command, 2 clocks later, an address IA1 is outputted on an address bus with a timing of an address controlling signal YAL, and when a second command is inputted, the address selecting signal IASW continues to be high and one clock later an address IA2 is outputted on the address bus with a timing of the address controlling signal YAL.

FIG. 30B shows that n=1 and, when a first command is inputted, an address selecting signal IASW goes low and by inputting of the first command, one clock later, an address IA1 is outputted on an address bus with a timing of an address controlling signal YAL, and when a second command is inputted, the address selecting signal IASW continues to be low and one clock later an address IA2 is outputted on the address bus with a timing of the address controlling signal YAL.

FIG. 30C shows that n=2 and, when a first command is inputted, an address selecting signal IASW goes high and by inputting the first command, 2 clocks later, an address IA1 is outputted on an address bus with a timing of an address controlling signal YAL, and when a second command is inputted, the address selecting signal IASW continues to be high and 2 clocks later an address IA2 is outputted on the address bus with a timing of the address controlling signal YAL.

Thus, according to the semiconductor memory device of this embodiment, it is possible to perform holding of two or more addresses and outputting of selected addresses corresponding to kinds of commands with a sufficient operational margin.

Moreover, according to this embodiment, in a semiconductor memory device having various address inputs, flexible selection of addresses and of setting of address output timing are made possible.

Third Embodiment

Figure 31:
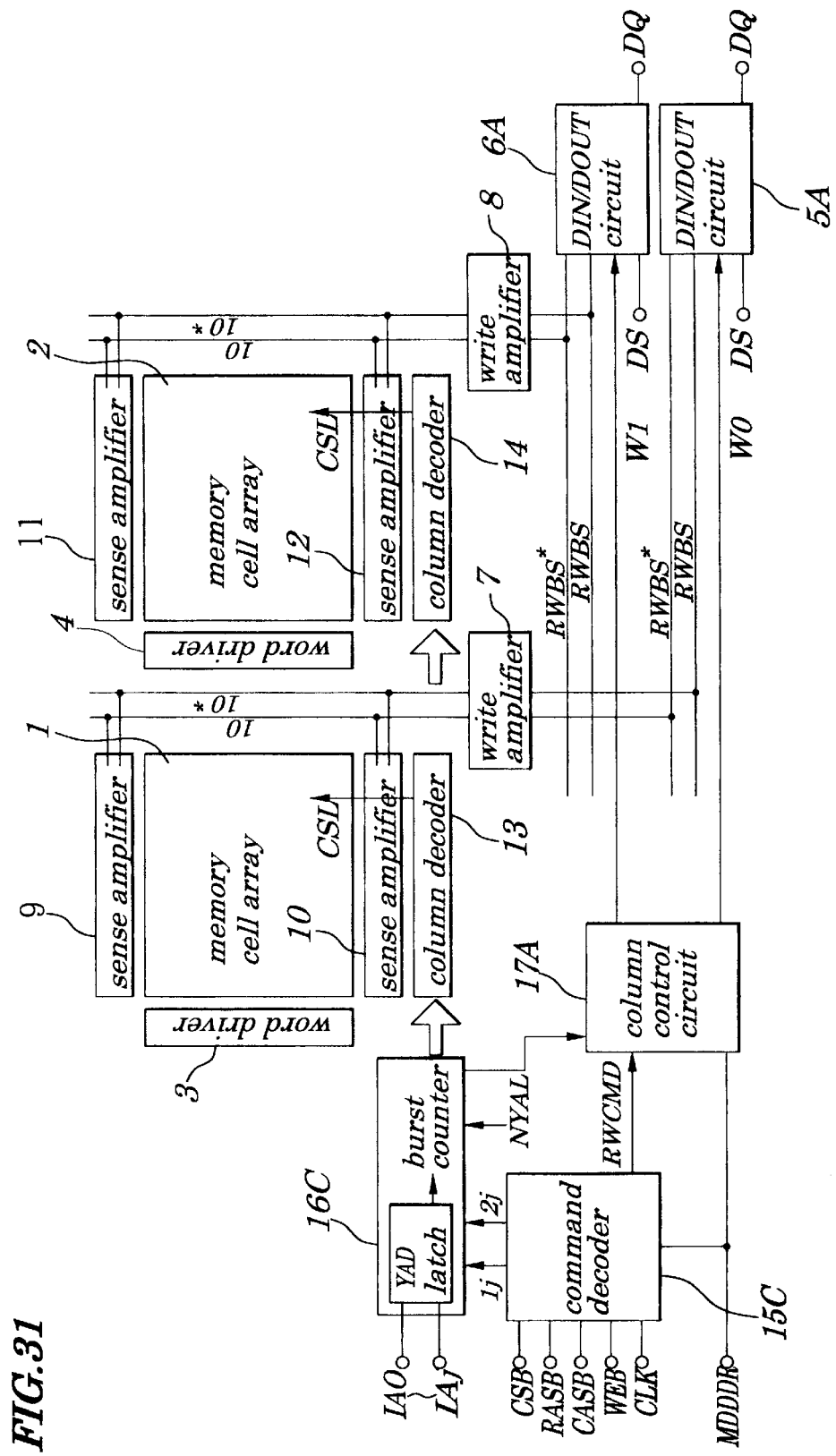
FIG. 31 is a block diagram showing overall configurations of the semiconductor memory device according to a third embodiment of the present invention.

FIG. 31 is a block diagram showing overall configurations of the semiconductor memory device according to a third embodiment of the present invention.

As depicted in FIG. 31, the semiconductor memory device of this embodiment is comprised of memory cell arrays 1 and 2, word drivers 3 and 4, DIN/DOUT circuits 5A and 6A, write amplifiers 7 and 8, sense amplifiers 9, 10, 11 and 12, column decoders 13 and 14, a command decoder 15C, a burst counter 16C and a column control circuit 17A.

The configuration of the third embodiment shown in FIG. 31 differs greatly from that of the first embodiment shown in FIG. 1 in that the command decoder outputs address controlling signals 1j and 2j instead of address controlling signals YAL and YALW and in that the burst counter 16 is used to perform control on output timing using the address controlling signals 1j and 2j instead of the address controlling signals YAL and YALW. Except these components, the configuration is almost the same as those in the first embodiment. The same reference number in FIG. 31 designates corresponding parts shown in FIG. 1. For simplicity, the description of the same parts is hereinafter omitted.

The command decoder 15C, in the case of the DDR-SDRAM, is used to output a read write command RWCMD being an internal command signal and address controlling signals 1j and 2j, when the DDR mode signal MDDDR goes high, in response to external command signals CSB, RASB, CASB, WEB and a clock signal CLK. The burst counter 16C is used to latch address inputs IA0 to IAj in a latching circuit with a timing defined by the address controlling signal 1l and then read out data latched in the latching circuit with a timing defined by the address controlling signal 2j to hold it in a signal holding circuit and to output it as address outputs from the burst counter. The burst counter is also used to latch address inputs IA0 to IAj at each time of the occurrence thereof, to read the latched data with a timing of the address controlling signal 2j, to hold them in the signal holding circuit and then to output them. Moreover, the burst counter circuit is used to perform repeated processing of sequentially generating address outputs with 2 added, at each time of occurrence of an address controlling signal NAAL, for a period corresponding to a predetermined burst length.

Next, examples of configurations and operations of the command decoder 15C of this embodiment are hereafter described.

Figure 32:
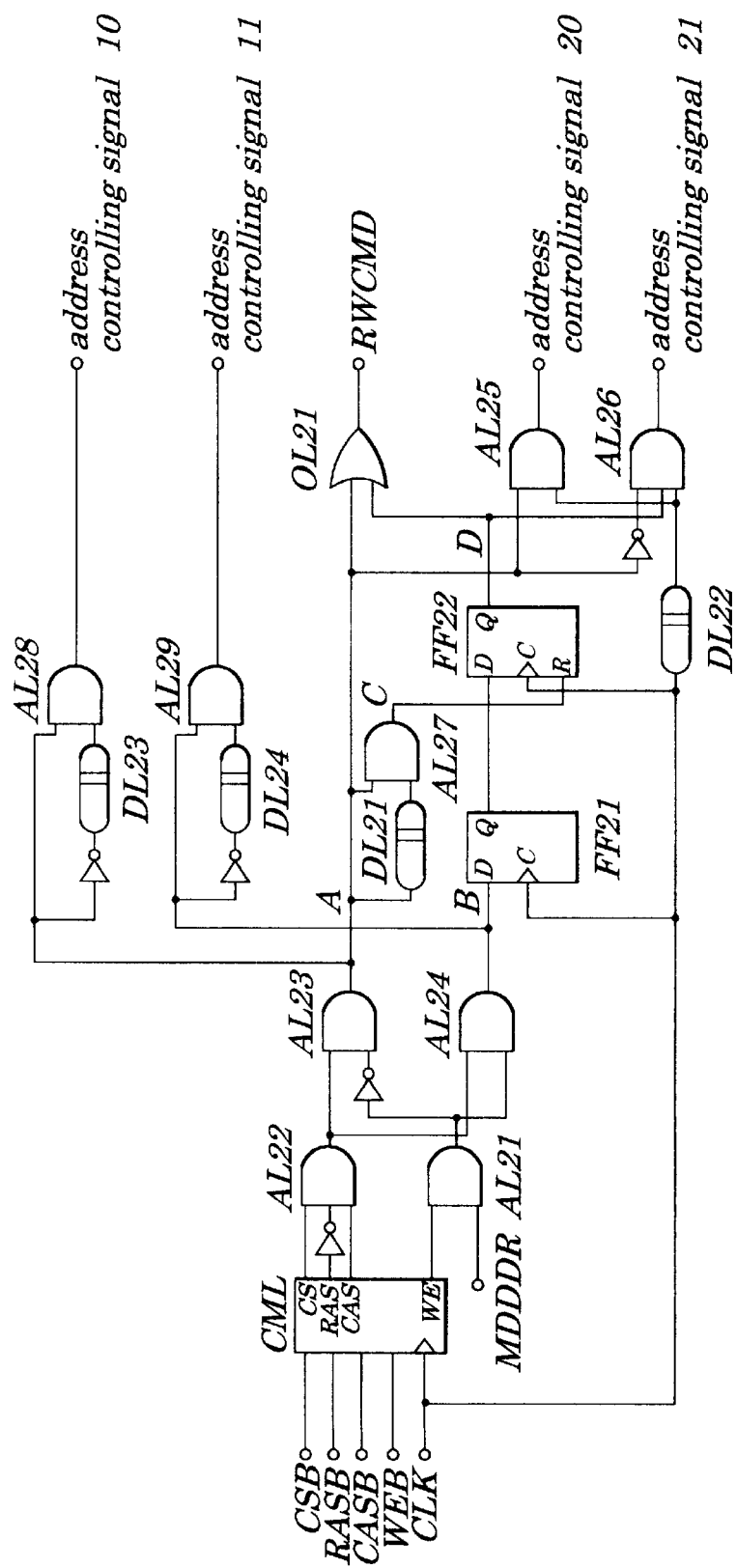
FIG. 32 is a block diagram showing an example of circuit configurations of the semiconductor memory device according to the third embodiment of the present invention.
Figure 33:
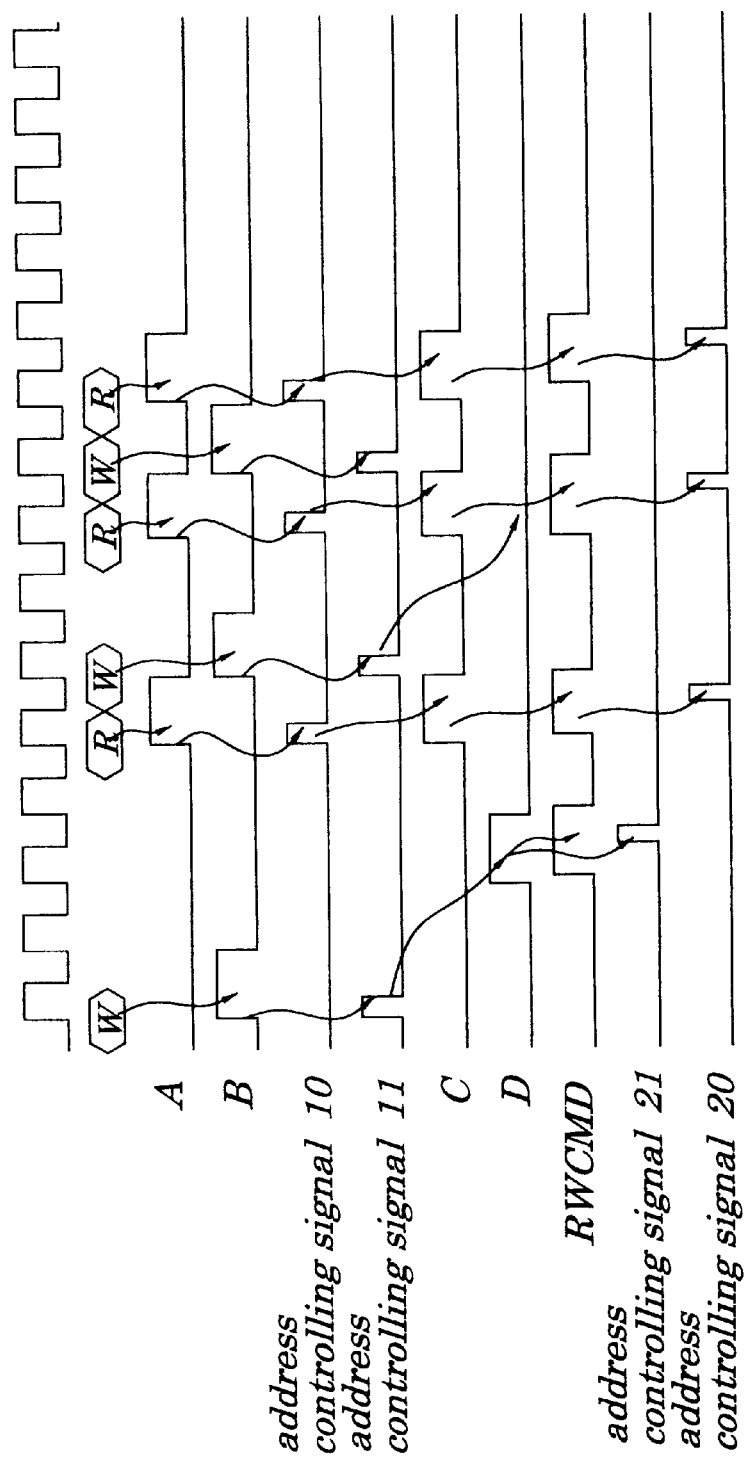
FIG. 33 shows timing charts of operations of the command decoder of this embodiment.

FIG. 32 is a block diagram showing an example of circuit configurations of the semiconductor memory device according to the third embodiment of the present invention. FIG. 33 shows timing charts of operations of the command decoder of this embodiment.

As depicted in FIG. 32, the command decoder is provided with a command latching circuit CML, AND circuits AL21, AL22, AL23, AL24, AL25, AL26, AL27, AL28 and AL29, an OR circuit OL21, flip-flops FF21 and FF22, delay devices DL21, DL22, DL23 and DL24.

The command latching circuit CML is used to receive external signals CSB, RASAB, CASB and WEB of the semiconductor memory device and to decode them in synchronization with a clock CLK and then to output them as internal command signals CS, RAS, CAS and WE. An output of the AND circuit AL21, if an external command signal MDDDR is high, goes high when a command signal WE is high (i.e., at the time of writing by the decoder) and goes low when the command signal WE is low (at the time of reading by the decoder).

Since an output of the AND circuit AL22 goes high when selection of a command is instructed by a command signal CS, selection of a row address is not instructed by a command signal RAS and selection of a column address is instructed by a command signal CAS, at the time of writing data, an output B of the AND circuit goes high and at the time of reading data an output A of the AND circuit goes high.

This causes the AND circuit AL28 to generate an address controlling signal 10 composed of one shot pulse by detecting matching of the output A and an output obtained by inverting the output A and by making it delayed using a delay device DL23. This also causes the AND circuit AL29 to generate an address controlling signal 11 composed of one shot pulse by detecting matching of an output B and an output obtained by inverting the output B and by making it delayed using a delay device DL24. Moreover, a read/write command RWCMD is outputted immediately through the AND circuit AL23 and the OR circuit OL21, and also the read/write command RWCMD is outputted by an output D with a delay of 2 clocks through the AND circuit AL24 and the flip-flops FF21 and FF22. Also, an address controlling signal 20 is outputted from the AND circuit AL25 when an output of the AND circuit AL23 is matched to the clock signal CLK and an address controlling signal 21 is outputted from the AND circuit AL26 when an output D of the flip-flop FF22 is matched to the clock signal CLK. At this point, each of the address controlling signals 20 and 21 is outputted as one shot pulse corresponding to a rise of the read/write command RWCMD by making the clock signal delayed by passing the same through a delay device DL22.

At this point, by connecting an output C from the AND circuit AL27 obtained by using the output A from the AND circuit AL23 and a delayed output obtained by passing the output A through a delay device DL21 to a reset input R of the flip-flop 22, even if two inputs of the OR circuit OL21 occur simultaneously, because the flip-flop FF22 is reset causing the read/write command RWCMD not to be produced by the output B and the read/write command RWCMD to be preferentially generated by the output A.

In the case of such specifications as for the DDR-SDRAM in which "a write command or a read command previously inputted is interrupted by a command inputted later in the consecutive inputting of commands", the above specifications can be met by inputting reset signals to all of the flip-flops.

If it is required by specifications that, when a command (not shown) other than the read command and write command is inputted, the previously inputted read command and write command be interrupted, the specifications can be met by inputting outputs obtained by ORing reset signals generated from other commands described above with outputs from the node C to all flip-flops.

Examples of operations of the command decoder are described by referring to FIG. 33. When a write command W is inputted, an output B is generated and an address controlling signal 11 is outputted. Two clocks later, an output D is generated which is outputted as the read/write command RWCMD through the OR circuit OL21 and, at the same time, an address controlling signal 21 is outputted.

Furthermore, when the read command R is inputted, the output A is generated and the address controlling signal 10 is outputted. Immediately after the read/write command RWCMD is outputted through the OR circuit OL21, the address controlling signal 20 is outputted. When the read command R is inputted 2 clocks after inputting of the write command W, the output B is generated by the inputting of the write command W causing the address signal 11 to be outputted, however, since the output A is generated by the inputting of the read command R causing the output C to be outputted, the flipflop FF22 is reset thus causing the output D not to be generated. On the other hand, due to generation of the output A, the address controlling signal 10 is outputted which is then outputted as the read/write command RWCMD through the OR OL21 and at the same time the address controlling signal 20 is generated.

When the read command R is inputted one clock after inputting of the write command W and the address controlling signal 11 is generated, since the output A is generated by the inputting of the read command R causing the output C to be produced, the output D is not generated and the address controlling signal 10 is outputted by the occurrence of the output A and the read/write command RWCMD is outputted and the address controlling signal 20 is outputted.

Furthermore, in the case of specifications of the DDR-SDRAM, if the write command is inputted, in a continuous manner, followed by the read command, since the write command is interrupted by the read command, neither the read/write command RWCMD nor the address are outputted, the above specifications can be met by inputting a reset signal to all flip-flops according to this embodiment.

As in the case of continuous inputting of the write command followed by the read command, when the read command is inputted, in a continuous manner, followed by the write command and other command not shown is required, the above specifications can be met by inputting a reset signal to all flip-flops.

Next, examples of configurations and operations of the burst counter 16C of this embodiment are described below.

Figure 35A:
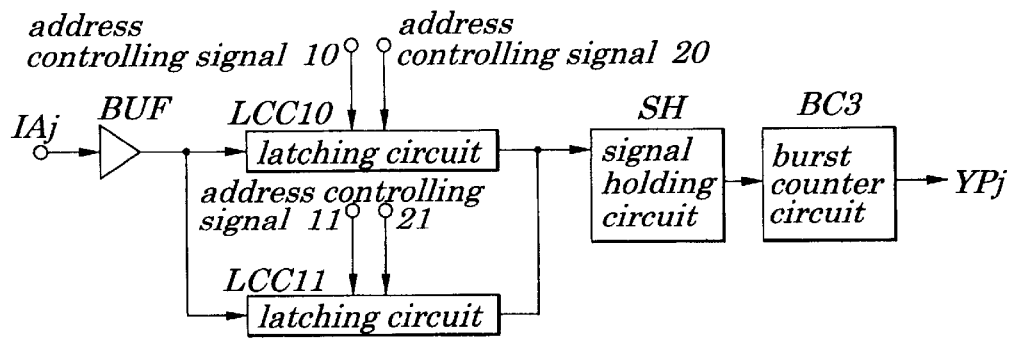
FIGS. 35A through 35C show block diagrams illustrating examples (1) of configurations of the burst counter.
Figure 35B:
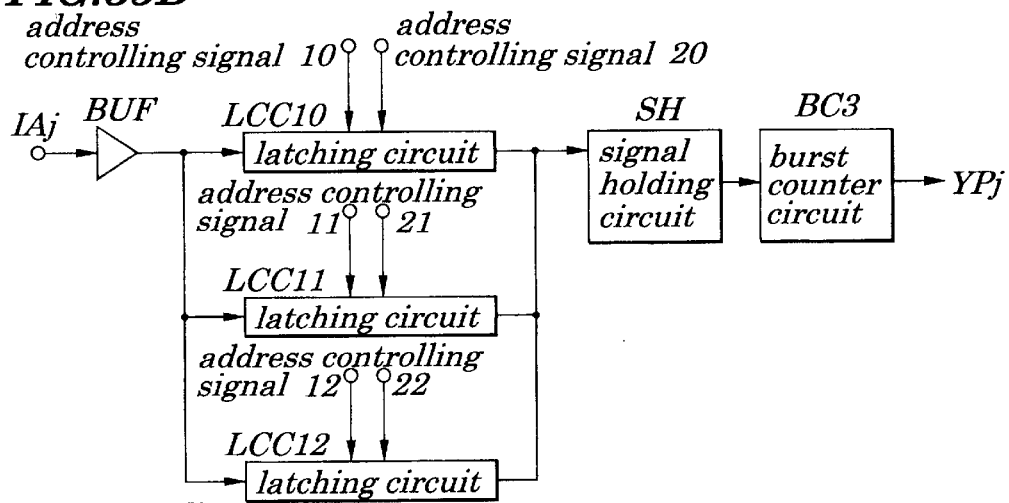
Figure 35C:
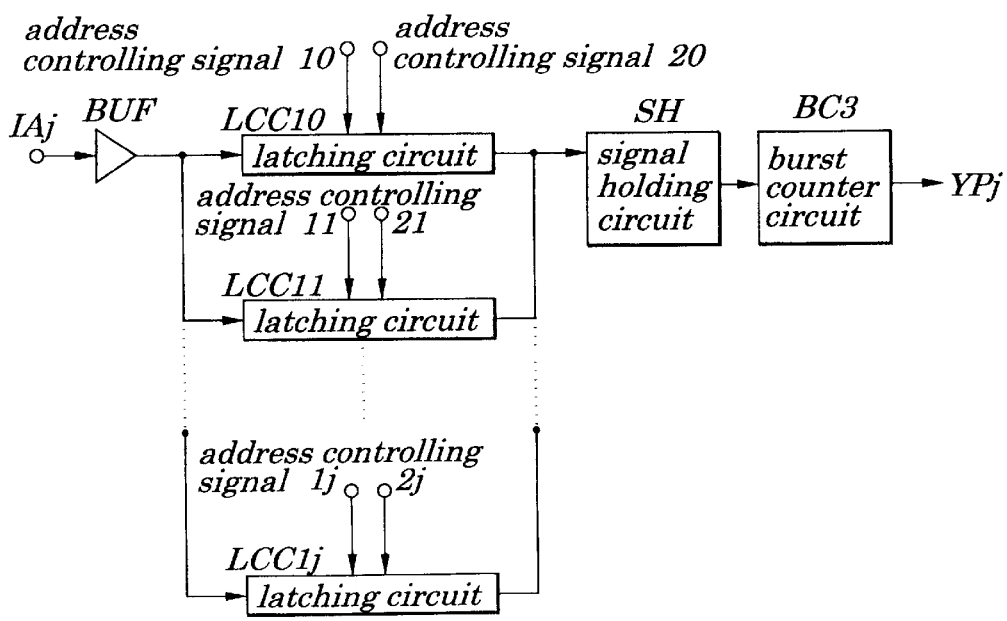
Figure 36A:
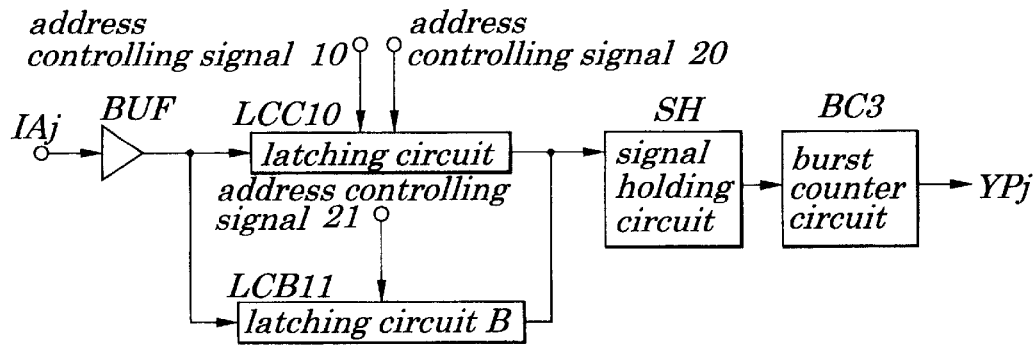
FIGS. 36A through 36C show block diagrams illustrating examples (2) of configurations of the burst counter.
Figure 36B:
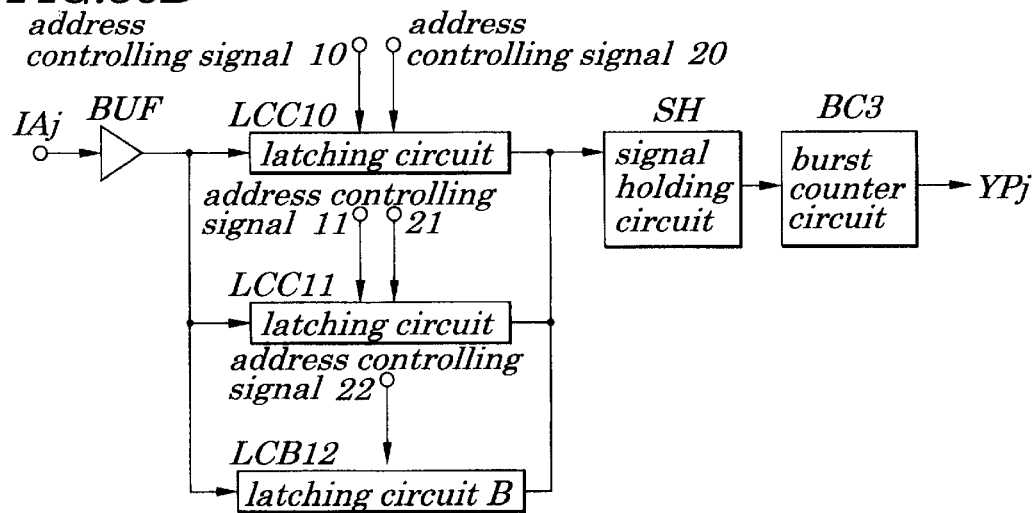
Figure 36C:
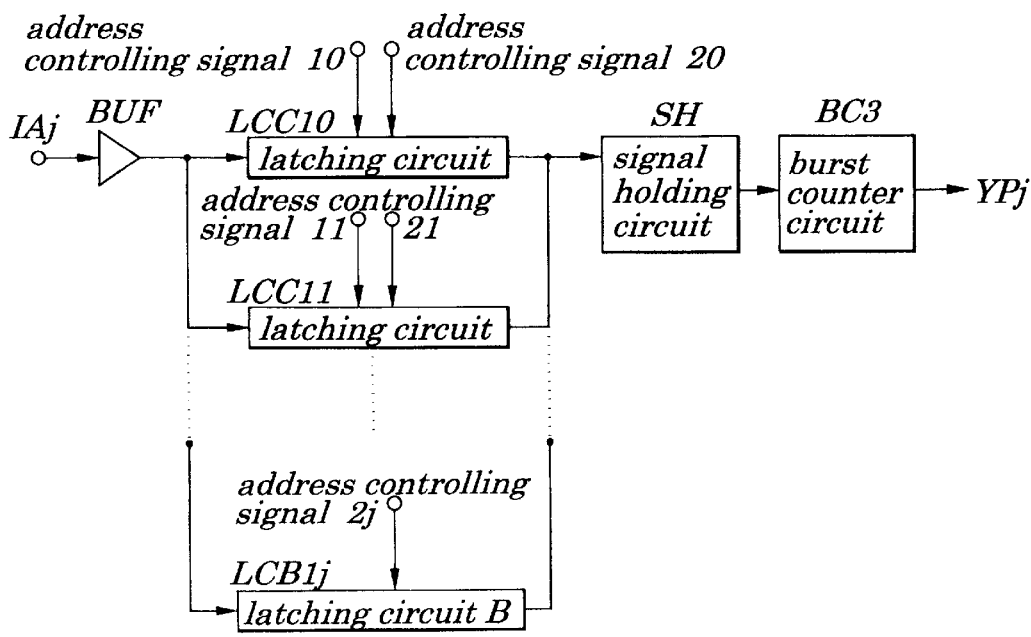
Figure 37A:
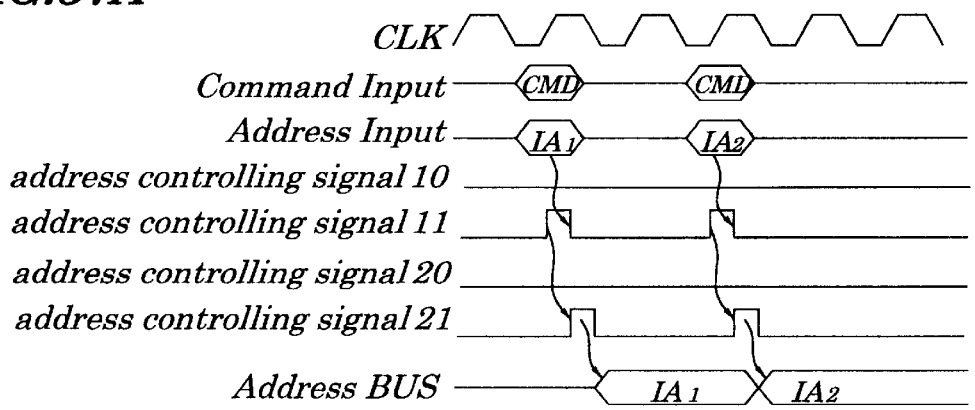
FIGS. 37A through 37C show timing charts of examples (1) of the configurations of the burst counter.
Figure 37B:
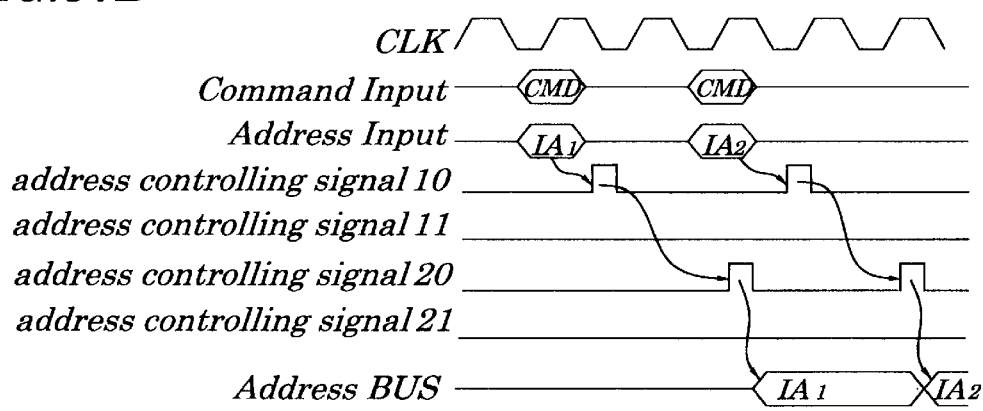
Figure 37C:
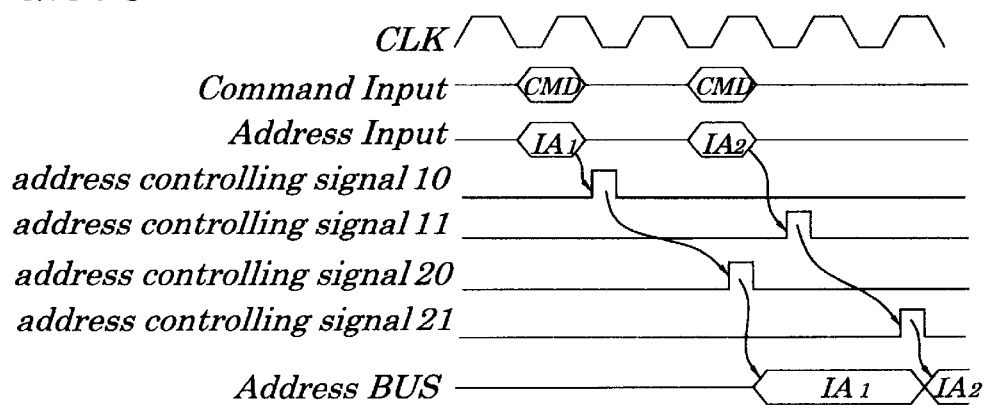
Figure 38A:
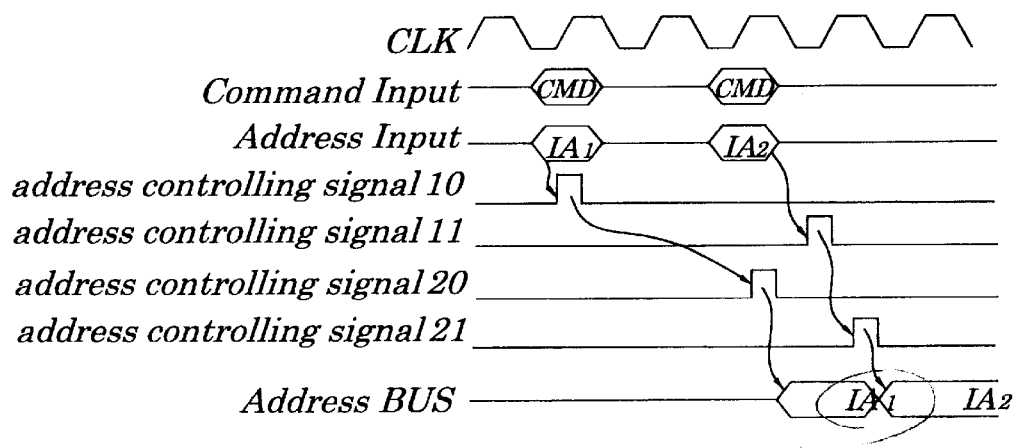
FIGS. 38A and 38B show timing charts of examples (2) of the configurations of the burst counter.
Figure 38B:
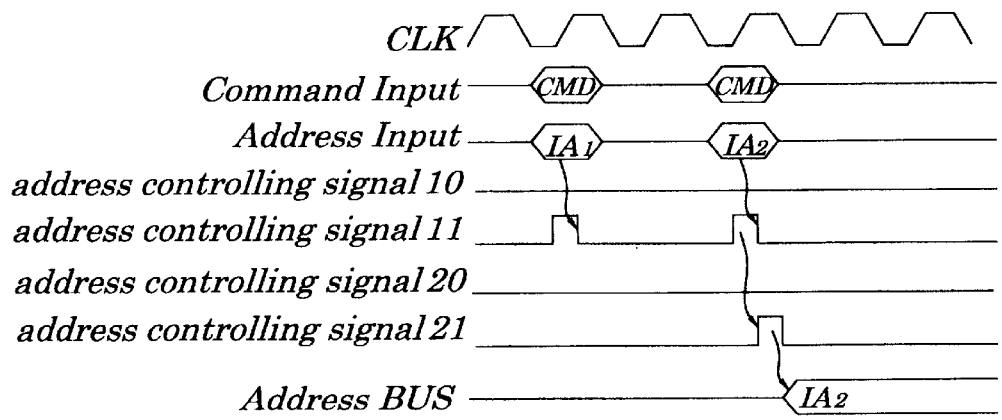

FIGS. 34A through 34D show operational examples of configurations of the latching circuit and the signal holding circuit constituting the burst counter of the semiconductor memory device of the present invention. FIGS. 35A through 35C show block diagrams of operational examples (1) of configurations of the burst counter. FIGS. 36A through 36C show block diagrams of operational examples (2) of configurations of the burst counter. FIGS. 37A through 37C show timing charts of operational examples (1) of configurations of the burst counter. FIGS. 38A and 38B show timing charts of operational examples (2) of configurations of the burst counter.

Figure 34A:
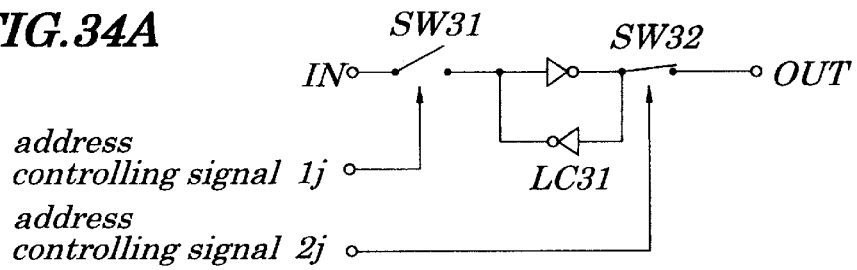
FIGS. 34A through 34d show examples of configurations of the latching circuit and the signal holding circuit constituting the burst counter of the semiconductor memory device of the present invention.

FIG. 34A is a diagram showing operational principles of the latching circuit, which is comprised of switches SW31 and 32, and a latching circuit 31. In the latching circuit of this embodiment, the switch SW31 is turned ON by an address controlling signal 1j and a state of an input IN is captured and latched in the latching circuit 31, and then the switch SW32 is turned ON by an address controlling signal 2j and an output OUT is generated depending on a state of the latching circuit 31.

Figure 34B:
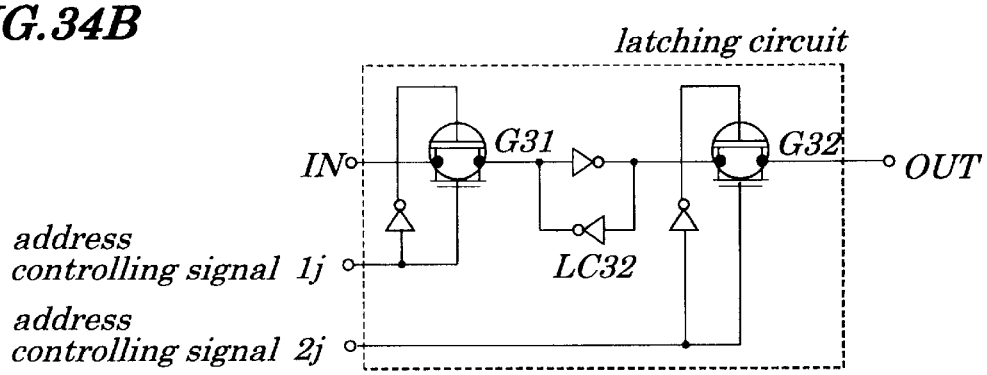

FIG. 34B is a diagram showing a specific example of the latching circuit, which is comprised of gate circuits G31 and G32, and a latching circuit LC32. In the latching circuit in this example, the gate circuit G31 is turned ON by an address controlling signal 1j and a state of an input IN is captured and latched in the latching circuit 32, and then the gate circuit G32 is turned ON by an address controlling signal 2j and an output OUT is generated depending on a state of the latching circuit 32.

Figure 34C:
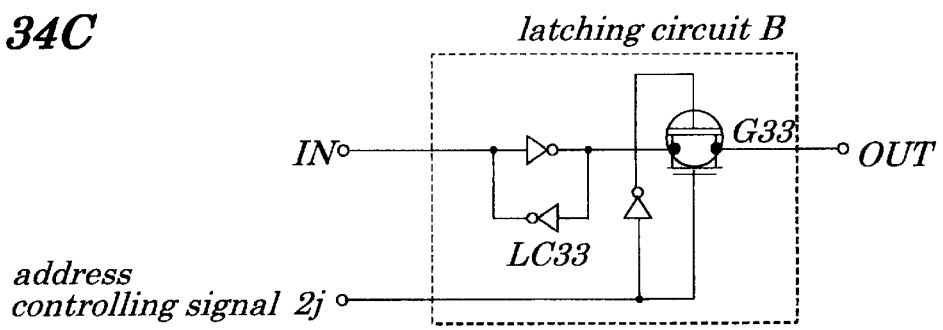

FIG. 34C is a diagram showing a specific example of the latching circuit, which is comprised of a latching circuit LC33 and a gate circuit G33. In the latching circuit in this example, a state of an input IN is latched in a latching circuit LC33 and a gate circuit G33 is turned ON by an address controlling signal 2j and an output OUT is generated depending on a state of the latching circuit LC33.

Figure 34D:
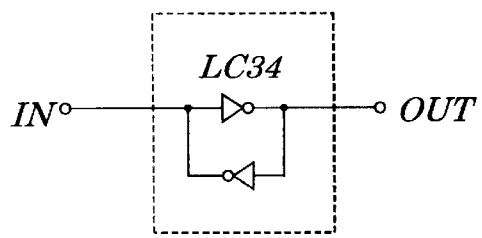

FIG. 34D is a diagram showing a specific example of the latching circuit, which is comprised of a latching circuit LC34. In the latching in this example, an input IN is latched in the latching circuit LC34 at each time of occurrence thereof and an output OUT is generated.

FIGS. 35A, 35B and 35C show examples of configurations of the burst counter. The configurations shown in FIG. 35A contains an input buffer BUF, latching circuits LCC10 and LCC11, a signal holding circuit SH and a burst counter circuit BC3. In this example, each of the latching circuits LCC10 and LCC11 is used to latch an address input IAj from an input buffer BUF in response to address controlling signals 10 and 11 and to output a signal in response to address controlling signals 20 and 21 respectively. The signal holding circuit SH holds outputs fed from latching circuits LCC10 or LCC11. The burst counter circuit BC is used to generate an address output immediately after inputting of a signal from the signal holding circuit SH or after a predetermined period of time, and then at each time of occurrence of an address controlling signal NYAL, to perform repeated processing of sequentially outputting an address output YPj with 2 added, every one clock, for a period corresponding to a predetermined burst length.

Configurations shown in FIG. 35B contain an input buffer BUF, latching circuits LCC10, LCC11 and LCC12, a signal holding circuit SH and a burst counter circuit BC3.

In this example, each of the latching circuits LCC10, LCC11 and LCC12 is used to latch an address input IAj fed by the input buffer BUF in response to address controlling signals 10, 11 and 12 respectively and to output a signal in response to address controlling signals 20, 21 and 22 respectively. The signal holding circuit SH is used to hold outputs from the latching circuits LCC10, LCC11 or LCC 12. The burst counter circuit BC3 starts operations by an input from the signal holding circuit SH. Configurations shown in FIG. 35C contain an input buffer BUF, two or more latching circuits LCC10, LCC11, . . . , LCC1j, a signal holding circuit SH and a burst counter circuit BC3.

In this example, each of the latching circuits LCC10, LCC11, . . . , LCC1j is used to latch an address input IAj fed by the input buffer BUF in response to address controlling signals 10,11, . . . , 1j and to output a signal in response to address controlling signals 20, 21, . . . , 2j. The signal holding circuit SH is use to hold an output from any of latching circuits LCC10, LCC11, . . . , LCC1j. The burst counter circuit BC3 is used to start operations by an input from the signal holding circuit SH.

FIGS. 36A, 36B and 36C show operational examples of configurations of the burst counter. Configurations shown in FIG. 36A contain an input buffer BUF, latching circuits LCC10 and LCB11, a signal holding circuit SH and a burst counter circuit BC3. The latching circuit LCC10 is used to latch an address input IAj fed by the input buffer BUF in response to an address controlling signal 10 and to output a signal in response to an address controlling signal 20. The latching circuit LCB11 is used to latch an address input IAj fed by the input buffer BUF at each time of receiving the input and to output a signal in response to an address controlling signal 21. The signal holding circuit SH is used to hold an output from the latching circuit LCC10 or LCB11. The burst counter circuit BC3 is used to generate an address output immediately after inputting of a signal from the signal holding circuit SH or after a predetermined period of time, and then at each time of occurrence of an address controlling signal NYAL, to perform repeated processing of sequentially outputting an address output YPj with 2 added, every one clock, for a period corresponding to a predetermined burst length.

Configurations shown in FIG. 36B contain an input buffer BUF, latching circuits LCC10, LCC11 and LCB12, a signal holding circuit SH and a burst counter circuit BC3. Each of latching circuits LCC10 and LCC11 is used to latch an address input IAj fed by the input buffer BUF in response to address controlling signals 10 and 11 and to output a signal in response to address controlling signals 20 and 21 respectively. The latching circuit LCB12 is used to latch an address input IAj fed by the input buffer BUF and to output a signal in response to an address controlling signal 22. The signal holding circuit SH is used to hold an output from any of latching circuits LCC10, LCC11 and LCB12. The burst counter circuit BC3 serves to start operations by an input from the signal holding circuit SH.

Configurations shown in FIG. 36C contain an input buffer BUF, two or more latching circuits LCC10, LC11 and so on, a latching circuit LCB1j, a signal holding circuit SH and a burst counter circuit BC3. Each of latching circuits LCC10, LCC11 and so on is used to latch an address input IAj fed by the input buffer BUF in response to address controlling signals 10, 11 and so on and to output a signal in response to address controlling signals 20, 21 and so on. The latching circuit LCB1j is used to latch at each time of receiving an address input IAj fed by the input buffer BUF and to output a signal in response to an address controlling signal 2j. The signal holding circuit SH is used to hold an output from any of latching circuits LCC10, LCC11, . . . , LCB1j. The burst counter circuit BC3 serves to start operations by an input from the signal holding circuit SH.

Operations of the burst counter in this example are described by referring to FIGS. 37A through 40B. FIGS. 37A, 37B and 37C. FIGS. 37A, 37B and 37C show timing charts of operational examples of the burst counter shown in FIGS. 35A through 35C.

FIG. 37A shows that n=2 and, when addresses IA1 and IA2 are inputted in response to first and second commands CMD, an address selecting signal 11 is turned on by the first command and immediately an address IA1 is outputted on an address bus when an address controlling signal 21 is turned on, and by the second command, the address selecting signal 11 is turned on and immediately an address IA2 is outputted on the address bus when the address controlling signal 21 is turned on.

FIG. 37B shows that n=2 and, when a first command is inputted, an address selecting signal 10 is turned on and 2 clocks later, an address controlling signal 20 is turned on which causes an address IA1 to be outputted on an address bus, and when a second command is inputted, an address selecting signal 10 is turned on and 2 clocks later an address controlling signal 20 is turned on which causes an address IA2 to be outputted on the address bus.

FIG. 37C shows that n=2 and, when a first command is inputted, an address selecting signal 10 is turned on, and 2 clocks later an address controlling signal 20 is turned on which causes an address IA1 to be outputted on an address bus, and when a second command is inputted, an address selecting signal 11 is turned on and 2 clocks later an address controlling signal 21 is turned on which causes an address IA2 to be outputted on the address bus.

FIGS. 38A and 38B show timing charts of operational examples of the burst counter shown in FIGS. 35A through 35C.

FIG. 38A shows that n=3 and, when a first command is inputted, an address selecting signal 10 is turned on and, 2 clocks later, an address controlling signal 20 is turned on which causes an address IA1 to be outputted on an address bus, and when a second command is inputted, an address selecting signal 11 is turned on and immediately an address controlling signal 21 is turned on, which causes an address IA2 to be outputted on the address bus.

FIG. 38B shows that n=2 and, when a first command is inputted, an address selecting signal 11 is turned on and, when a second command is inputted, an address controlling signal 11 is turned on, which causes an address controlling signal 21 to be generated 2 clocks later by the inputting of the first command and an address controlling signal to be generated immediately after the inputting of the second command, resulting in an collision of signals, however, because the second command is preferentially inputted causing the address controlling signal 21 to be outputted and an address IA2 to be generated.

FIGS. 38A through 39C show timing charts of operational examples of the burst counter shown in FIGS. 36A through 36C.

Figure 39A:
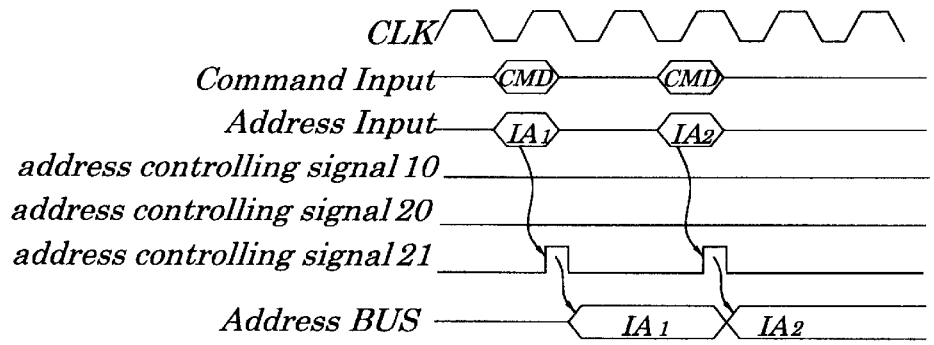
FIGS. 39A through 39C show timing charts of example (3) of the configurations of the burst counter.

FIG. 39A shows that n=2 and, when a first command is inputted, an address selecting signal 21 is outputted, causing an address IA1 to be outputted from the latching circuit B on an address bus, and when a second command is inputted, an address selecting signal 21 is outputted on an address bus, causing an address IA2 to be outputted from the latching circuit B on an address bus.

Figure 39B:
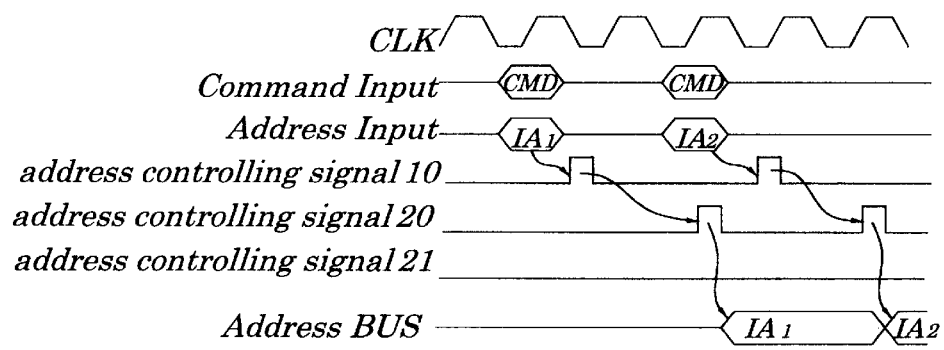

FIG. 39B shows that n=2 and, when a first command is inputted, an address selecting signal 10 is outputted and 2 clocks later, an address controlling signal 20 is outputted which causes an address IA1 to be outputted from the latching circuit on an address bus, and when a second command is inputted, an address selecting signal 10 is outputted and 2 clocks later an address controlling signal 20 is outputted which causes an address IA2 to be outputted from the latching circuit on the address bus. In this case, since no address controlling signal is outputted, an address output is not generated from the latching circuit B.

Figure 39C:
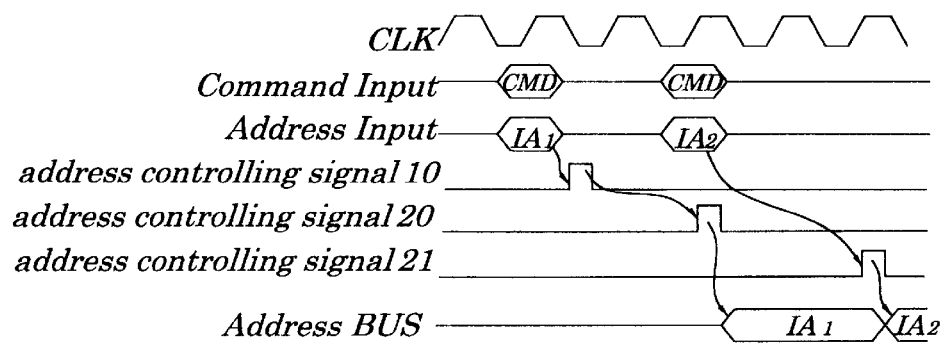

FIG. 39C shows that n=2 and, when a first command is inputted, an address selecting signal 10 is turned on and, when an address controlling signal 20 is turned on 2 clocks later, an address IA1 is outputted from the latching circuit on an address bus, and further 2 clocks after the inputting of a second command, an address controlling signal 21 is turned on, causing an address IA2 to be outputted from the latching circuit B on the address bus.

Figure 40A:
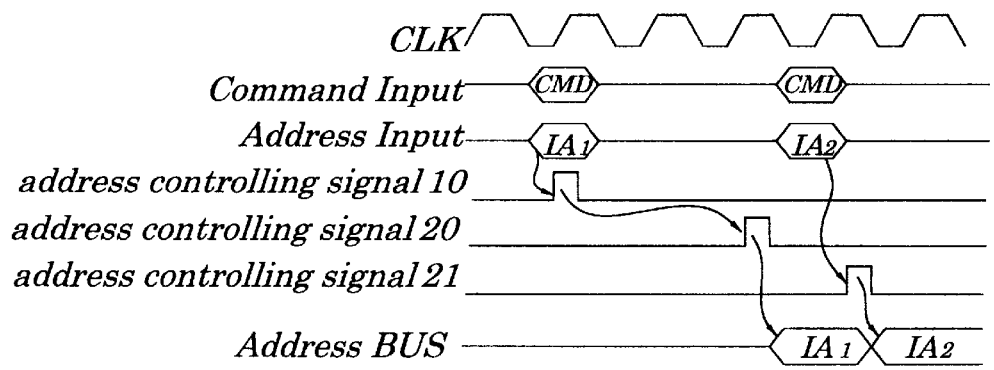
FIGS. 40A to 40B show timing charts of example (4) of the configurations of the burst counter.
Figure 40B:
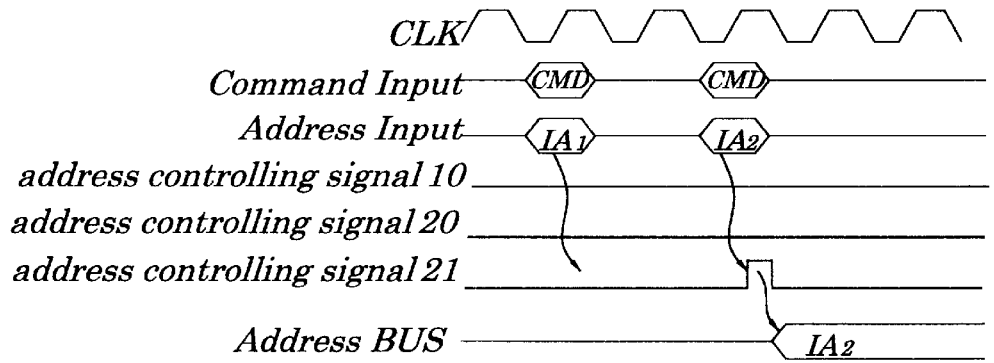

FIGS. 40A and 40B show timing charts of operational examples of the burst counter shown in FIGS. 36A through 36C. FIG. 40A shows that n=3 and, by inputting of a first command, an address controlling signal 10 is outputted and 2 clocks later an address controlling signal 20 is outputted, causing an address IA1 to be outputted from the latching circuit on an address bus, and, by inputting of a second command, an address selecting signal 21 to be outputted, causing an address IA2 to be outputted from the latching circuit B on the address bus.

FIG. 40B shows that n=2 and, a collision occur between an address controlling signal 21 generated 2 clocks after inputting of a first command and an address selecting signal 21 generated by inputting of a second command, however, the second command is preferentially inputted causing the address controlling signal 21 to be outputted and an address IA2 to be generated on an address bus.

Thus, according to the semiconductor memory device of this embodiment, it is possible to perform holding of two or more addresses and outputting of selected addresses corresponding to kinds of commands with a sufficient operational margin.

Moreover, according to this embodiment, in a semiconductor memory device having various address inputs, flexible selection of addresses and of setting of address output timing are made possible. Additionally, it is possible to re-arrange captured address inputs in an arbitrary order.

Fourth Embodiment

FIG. 41 is a block diagram showing overall configurations of a semiconductor memory device according to a fourth embodiment of the present invention.

The semiconductor memory device of this embodiment, as shown in FIG. 41, is provided with memory cell arrays 1 and 2, word drivers 3 and 4, DIN/DOUT circuits 5A and 6A, write amplifiers 7 and 8, sense amplifiers 9, 10 and 11, column decoders 13 and 14, a command decoder 15A, a burst counter 16D and a column control circuit 17A.

The configurations of the fourth embodiment differs greatly from those of the third embodiment (FIG. 31) in that the command decoder is adapted to output an address controlling signal YAL in addition to address controlling signals 1j and 2j and in that the burst counter 16D is adapted to perform control on timing of address outputs by using the address controlling signal YAl in addition to address controlling signals 1j and 2j. Except these components, the configuration of this embodiment is the same as that of the third embodiment. The same reference number in FIG. 41 designates corresponding parts shown in FIG. 31. For simplicity, the description of the same parts is hereinafter omitted.

The command decoder 15D, in the case of the DDR-SDRAM, when a DDR mode signal MDDDR goes high, is adapted to output a read/write command RWCMD being an internal command signal and address controlling signals 1j, 2j and YAL in response to external command signals CSB, RASB, CASB and WEB and a clock signal CLK.

The burst counter 16D is used to hold signals inputted as address inputs IA0 to IAj in the latching circuit with a timing defined by the address controlling signal 1j and then to read data held by the latching circuit with a timing defined by the address controlling signal 2j and to store them in a signal holding circuit, then to read them by an address controlling signal YAL and to output them as address outputs from the burst counter circuit. The burst counter also serves to latch address inputs IA0 to IAj at each time of the occurrence thereof and to read the latched data with a timing defined by the address controlling signal 2j and then to output them as address outputs. Moreover, the burst counter circuit is used to perform repeated processing of sequentially generating an address output with 2 added at each time of the occurrence of an address controlling signal NYAL for a period corresponding to a specified burst length.

Figure 42:
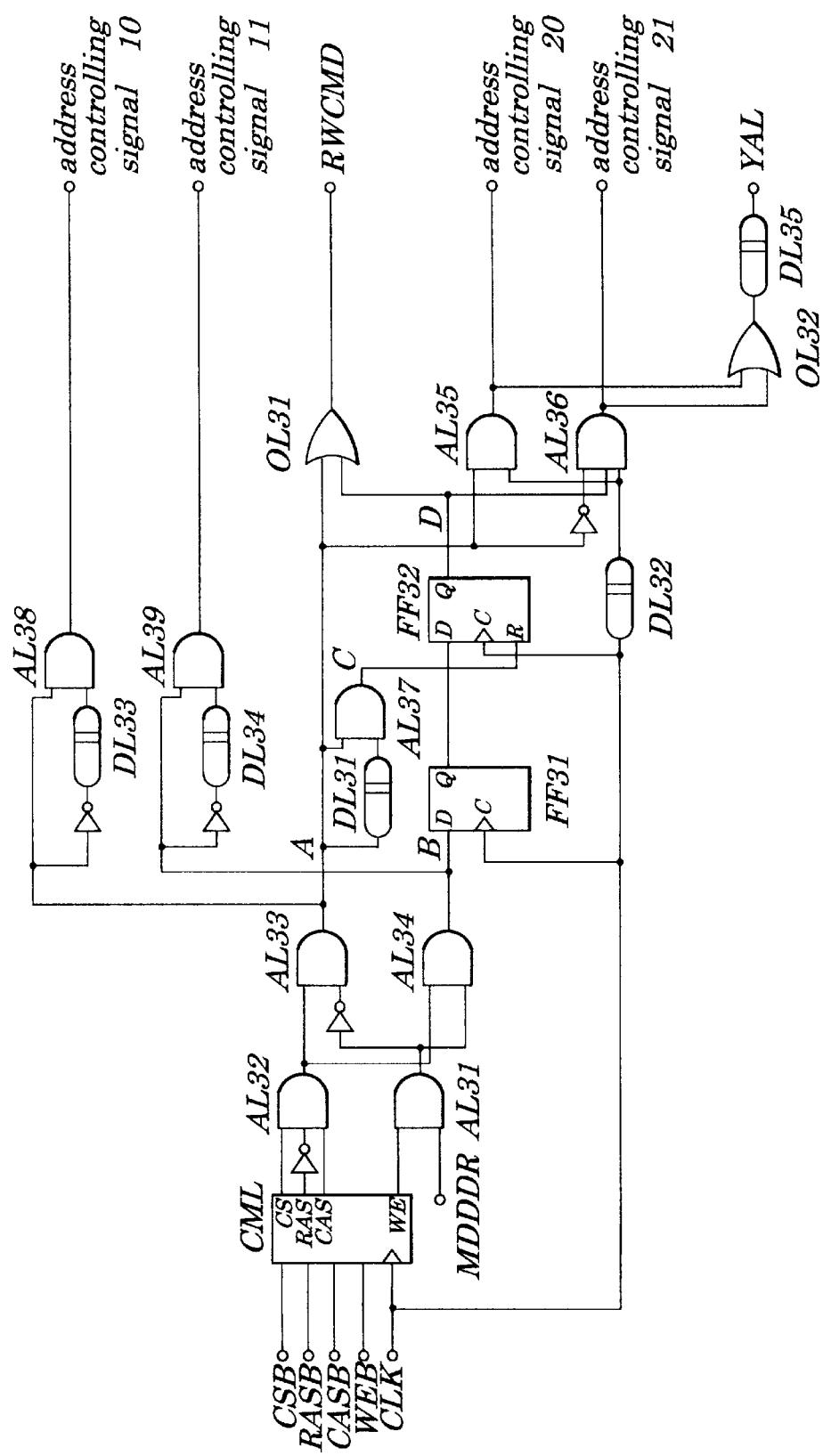
FIG. 42 is a block diagram showing an example of circuit configurations of a command decoder in the semiconductor memory device.
Figure 43:
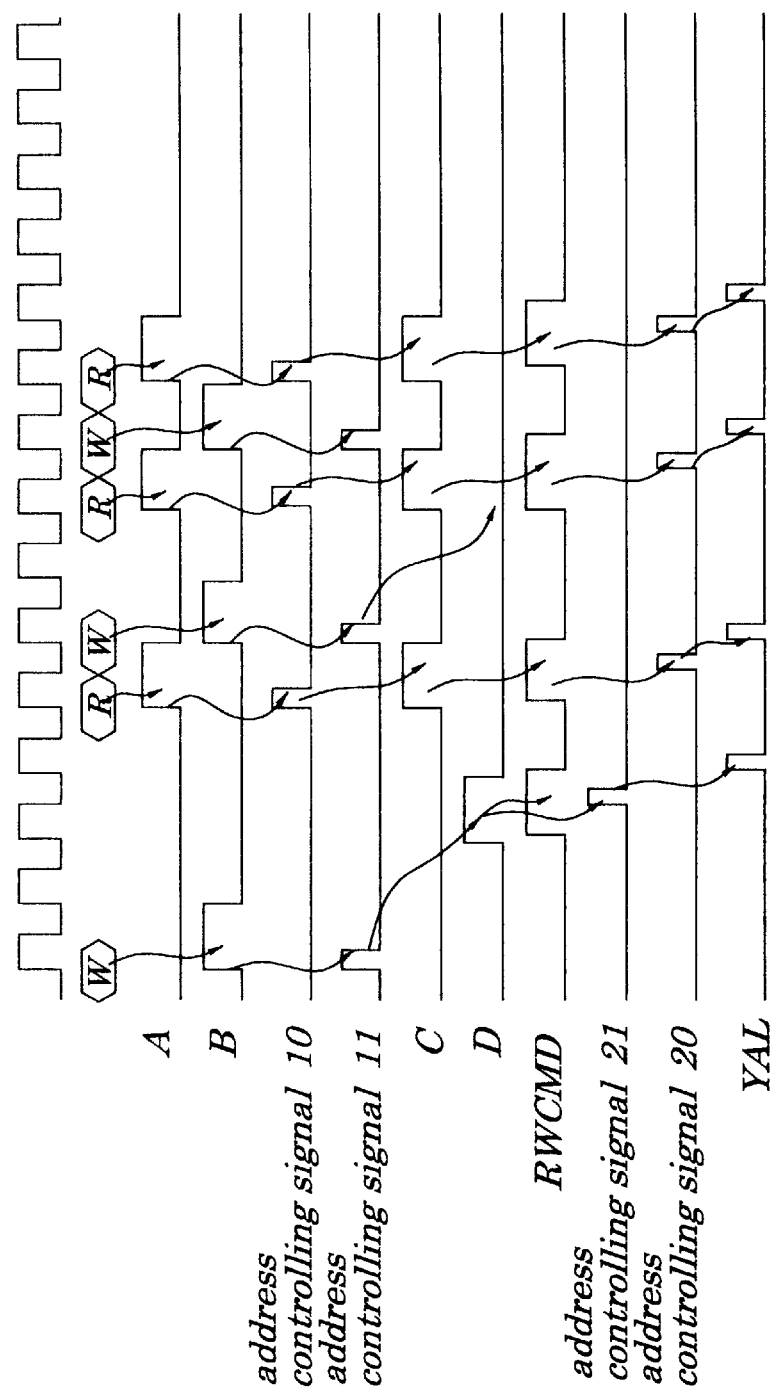
FIG. 43 is a timing chart showing operations of the command decoder.

Next, an example of configuration and operations of the command decoder 15D of this embodiment are described. FIG. 42 is a block diagram showing an example of circuit configurations of the command decoder in the semiconductor memory device. FIG. 43 is a timing chart showing operations of the command decoder.

As depicted in FIG. 42, the command decoder in this example is provided with a command latch circuit CML, AND circuits AL31, AL33, AL34, AL35, AL36, AL37, AL38 and AL39, OR circuits OL31 and OL32, flip-flops FF31 and FF32, and delay devices DL31, DL32, DL33, DL34 and DL35.

The command latch circuit CML is used to decode external command signals CSB, RASB, CASB and WEB of the semiconductor memory device in synchronization with a clock signal CLK and to output internal command signals CS, RAS, CAS and WE. When an external command signal MDDDR is high, an output of the AND circuit AL31 goes high when a command signal WE is high (i.e., at the time of writing of data) and goes low when the command signal WE is low (at the time of reading data). Since an output of the AND circuit AL32 goes high when selection of a command is instructed by the command signal CS, selection of a row address is not instructed by the command signal RAS and selection of a column address is instructed by the command signal CAS, an output B of the AND circuit AL34 goes high at the time of writing data and an output A of the AND circuit AL33 goes high at the time of reading data. Because of this, the AND circuit AL38, when detecting the matching of the output A to an output obtaining by inverting the output A and by passing it through a delay device DL33, is adapted to generate an address controlling signal 10 composed of one shot pulse. Also, the AND circuit AL39, when detecting the matching of the output B to an output obtaining by inverting the output B and by passing it through a delay device DL34, is adapted to generate an address controlling signal 11 composed of one shot pulse.

A read/write command RWCMD is outputted directly through the AND circuit AL33 and the OR circuit OL31 and also is produced by an output D generated with a delay of 2 clocks through the AND circuit AL34 and flip-flops FF31 and FF32. The AND circuit AL35 is used to output an address controlling signal 20 by using an output of the AND circuit AL33 and the clock signal CLK, while the AND circuit AL36 is used to output an address controlling signal 21 by using an output D from the flip-flop FF32 and the clock signal CLK. At this point, each of the address controlling signals 20 and 21 is outputted as one shot pulse corresponding to a rise of the read/write command RWCMD by the clock signal CLK delayed through a delay device DL32. An address controlling signal YAL is generated by making a signal obtained by ORing address controlling signals 20 and 21 at the OR circuit OL32 delayed using a delay device DL35.

At this point, by connecting an output C of the AND circuit AL37 obtained by using an output A of the AND circuit AL33 and a delayed signal obtained by passing the output A through a delay device 31 to a reset input R of the flip-flop FF32, when two inputs occur simultaneously at the OR circuit OL31, the flip-flop FF32 is reset so that the read/write command RWCMD induced by an output B is not generated and the read/write command RWCMD induced by the output A is preferentially outputted.

In the case of such specifications as for the DDR-SDRAM in which "a write command or a read command previously inputted is interrupted by a command inputted later in the consecutive inputting of commands", the above specifications can be met by inputting reset signals to all of the flip-flops.

If it is required by specifications that, when a command (not shown) other than the read command and write command is inputted, the previously inputted read command and write command be interrupted, the specifications can be met by inputting outputs obtained by ORing reset signals generated from other commands described above with outputs from the node C to all flip-flops.

Next, an example of operations of the command decoder of this embodiment is hereafter described by referring to FIG. 43. By inputting of a write command W, an output B is generated, causing an address controlling signal 11 to be outputted. With a delay of 2 clocks, an output D is produced and a read/write command RWCMD is outputted through the OR circuit OL31 and an address controlling signal 21 is outputted. Moreover, by inputting of a read command R, an output A is generated causing an address controlling signal 10 to be outputted, and the read/write command RWCMD is outputted through the OR circuit OL31 and an address controlling signal 20 is generated.

When the read command R is inputted 2 clocks after inputting of a write command W, an output B is generated by inputting of a write command W causing an address controlling signal 11 to be outputted. However, since the output A is generated by inputting of the read command R, causing the output C to be generated and therefore the flip-flop FF32 to be reset, the output D is not produced. On the other hand, by the occurrence of the output A, an address controlling signal 10 is outputted and a read/write command RWCMD is outputted through the OR circuit OL31, causing an address controlling signal 20 to be outputted.

Furthermore, when an address controlling signal 11 is generated by inputting of the read command R one clock after inputting of the write command W, the output A is generated by inputting of the read command R in the similar manner to above case. However, because an output C is generated, an output D does not occur and, due to the occurrence of the output A, an address controlling signal 10 is outputted and the read/write command RWCMD is outputted and an address controlling signal 20 is produced.

Additionally, due to the occurrence of address controlling signals 20 and 21, an address controlling signal YAL is outputted through the OR circuit OL32.

According to specifications of the DDR-SDRAM, when the write command is inputted followed by the read command, the write command is interrupted by the read command and therefore the read/write command RWCMD and an address are not outputted. The above specification can be satisfied by inputting reset signals to all flip-flops.

As in the case of continuous inputting of the write command followed by the read command, when the read command is inputted, in a continuous manner, followed by the write command and any interruption by other commands not shown is required, the above specifications can be met by inputting a reset signal to all flip-flops.

Next, an example of configurations and operations of the burst counter 16D of this embodiment are described below. FIGS. 44A through 45C are block diagrams showing examples of configurations of the burst counter of the semiconductor memory device.

FIGS. 46A through 49C are timing charts showing examples of operations of the burst counter of the semiconductor memory device.

Figure 44A:
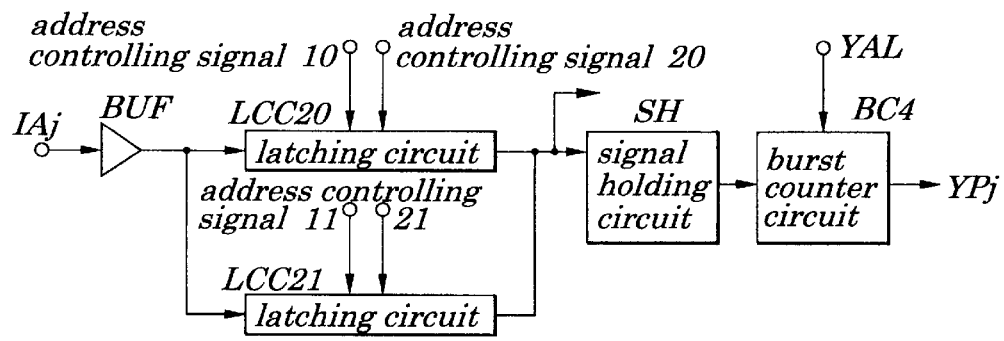
FIGS. 44A through 44C are block diagrams showing configurations of the burst counter of the semiconductor memory device.

Configurations shown in FIG. 44A contain an input buffer BUF, latching circuits LCC20 and LCC21, a signal holding circuit SH and a burst counter circuit BC4.

In this example, latching circuits LCC20 and LCC21 are used to latch an address input IAj in response to address controlling signals 10 and 11 and to output the latched signal in response to address controlling signals 20 and 21. The signal holding circuit SH is used to hold outputs of the latching circuits LCC20 or LCC21. The burst counter circuit BC4 is used to generate address outputs, after a signal is inputted from the signal holding circuit SH and when an address controlling signal YAL is generated or after a specified clock period, and thereafter at each time of the occurrence of an address controlling signal NYAL, to perform repeated processing of sequentially generating an address output YPj with 2 added, every one clock, for a period corresponding to a specified burst length.

Figure 44B:
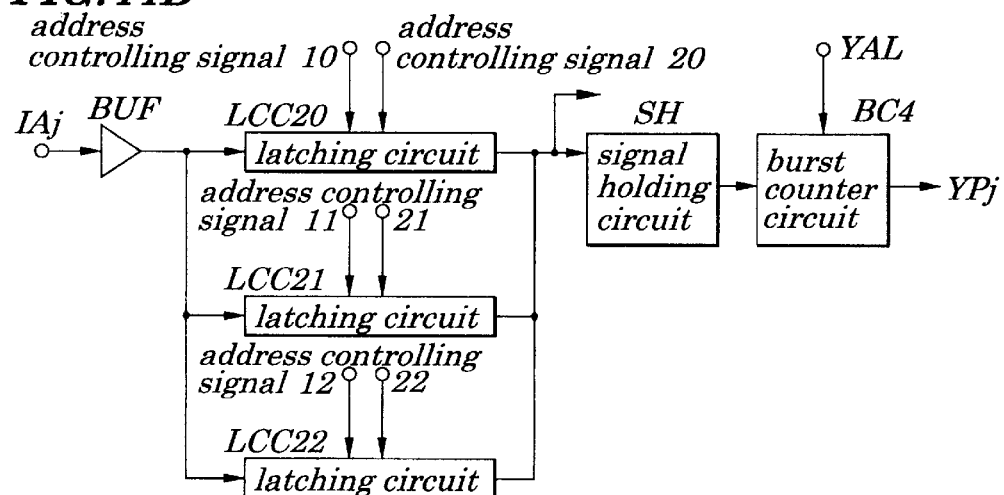

Configurations shown in FIG. 44B contain an input buffer BUF, latching circuits LCC20, LCC21 and LCC22, a signal holding circuit SH, and a burst counter circuit BC4. In this example, each of latching circuits LCC20, LCC21 and LCC22 is used to latch address input IAj from the input buffer BUF in response to address controlling signals 10, 11 and 12 and to output the latched signals in response to address controlling circuits 20, 21 and 22. The signal holding circuit SH is used to hold outputs from the latching circuits LCC20 or LCC21 or LCC22. The burst counter circuit BC4 serves to start operations by inputting of a signal from the signal holding circuit SH at the time of the occurrence of the address controlling signal YAL.

Figure 44C:
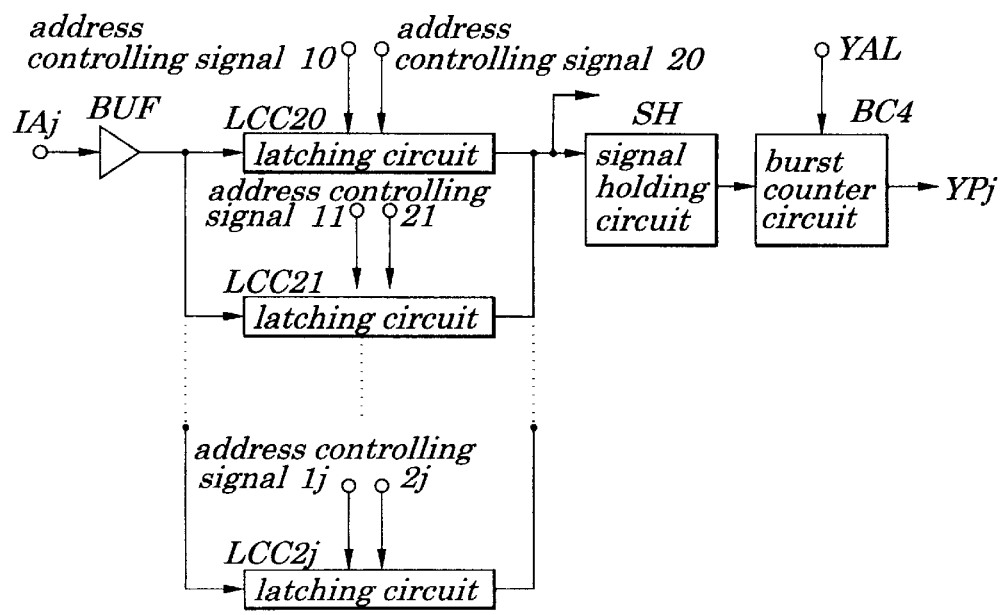

Configurations shown in FIG. 44C contain an input buffer BUF, two or more latching circuits LCC20, LCC21, . . . , LCC2j, a signal holding circuit SH and a burst counter circuit BC4.

In this example, each of latching circuits LCC20, LCC21, . . . , LCC2j is used to latch address input IAj from the input buffer BUF, in response to address controlling signals 10, 11, . . . , 1j and to output the latched signal in response to address controlling signals 20, 21, . . . , 2j. The signal holding circuit SH is used to hold outputs of any of latching circuits LCC20, LCC21, . . . , LCC2j. The burst counter circuit BC4 serves to start operations by inputting of a signal from the signal holding circuit SH at the time of the occurrence of an address controlling signal YAL.

FIGS. 44A through 45C are block diagrams showing examples of configurations of the burst counter of the semiconductor memory device.

Figure 45A:
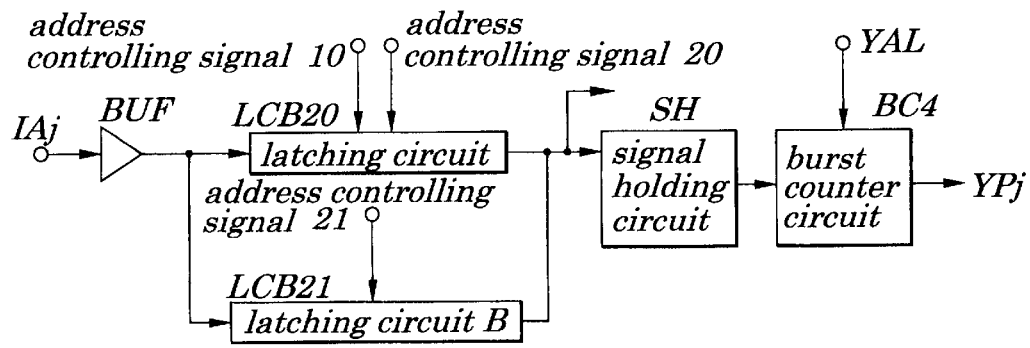
FIGS. 45A through 45C are block diagrams showing configurations of the burst counter of the semiconductor memory device.

Configurations shown in FIG. 45A contain an input buffer BUF, latching circuits LCC20 and LCC21, a signal holding circuit SH and a burst counter circuit BC4.

Latching circuit LCC20 is used to latch the address input IAj from the input buffer BUF in response to the address controlling signal 10 and to output the latched signal in response to the address controlling signal 20. The latching circuit LCB21 is used to latch the address input IAj from the input buffer BUF at each time of receiving the signal and to output it in response to an address controlling signal 21. The signal holding circuit SH is used to hold outputs from latching circuits LCC20 or LCB21. The burst counter circuit BC4 is used to generate an address output by inputting of a signal from the signal holding circuit SH immediately after the occurrence of an address controlling signal YAL or after a specific clock period, then to perform repeated processing of sequentially generating an address output YPj with 2 added, every one clock, for a period corresponding to a specified burst length.

Figure 45B:
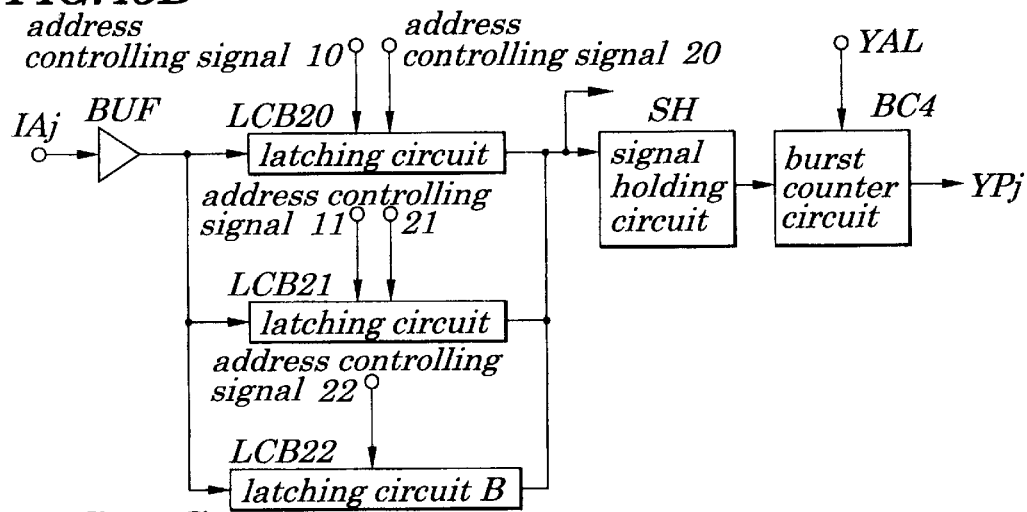

Configurations shown in FIG. 45B contain an input buffer BUF, latching circuits LCC20, LCC21 and LCB22, a signal holding circuit SH and a burst counter circuit BC4. Each of the latching circuits LCC20 and LCC21 is used to latch an address input IAj from the input buffer BUF in response to address controlling signals 10 and 11 and to output the latched signal in response to address controlling signals 20 and 21. The latching circuit LCB22 is used to latch an address input IAj from the input buffer BUF at each time of receiving it and to output the latched signal in response to an address controlling signal 22. The signal holding circuit SH is used to hold an output from any of latching circuits LCC20, LCC21 and LCB22. The burst counter circuit BC4 serves to start operations by inputting of a signal from the signal holding circuit SH at the time of the occurrence of an address controlling signal YAL.

Figure 45C:
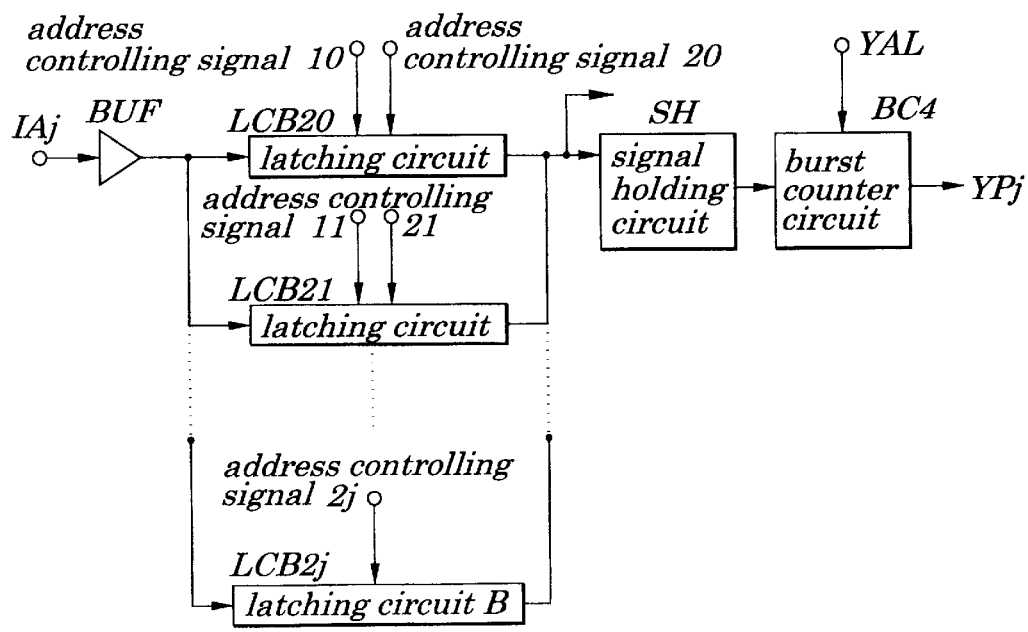

Configurations shown in FIG. 45C contain an input buffer BUF, two or more latching circuits LCC20, LCC21, . . . , and latching circuit LCB2j, a signal holding circuit SH and a burst counter circuit BC4. Each of latching circuits LCC20, LCC21 and so on are used to latch an address input IAj from the input buffer BUF in response to address controlling signals 10, 11 and so on and to output the latched signal in response to address controlling signals 20, 21 and so on. The latching circuit LCBj is used to latch address input IAj from the input buffer BUF at each time of receiving the signal and to output it in response to address controlling signal 2j. The signal holding circuit SH is used to hold an output from any of latching circuits LCC20, LCC21 and so on, or LCB2j. The burst counter circuit BC4 serves to start operations by inputting of an input from the signal holding circuit SH at the time of the occurrence of an address controlling signal YAL.

Figure 46A:
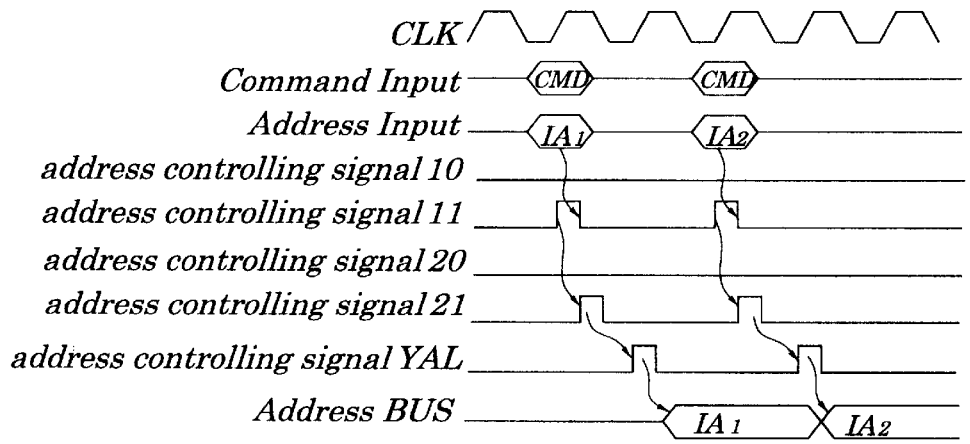
FIGS. 46A through 46C are timing charts showing an example (1) of operations of the burst counter of the semiconductor memory device.

Operations of the burst counter of this embodiment are described by referring to FIGS. 46A through 49B. FIGS. 46A through 46C are timing charts showing examples of operations of the burst counter shown in 44A through 44C.

FIG. 46A shows that n=2 and, when addresses IA1 and IA2 in response to first and second commands CMD are inputted, an address controlling signal 11 is inputted by the first command, and by an immediate inputting of an address controlling signal 21, an address IA1 is held by the signal holding circuit SH, in response to an address controlling signal YAL, an address IA1 is outputted from the burst counter circuit BC4 on an address bus, and then an address controlling signal 11 is inputted by the second command, and by an immediate inputting of an address controlling signal 21, an address IA2 is held by the signal holding circuit SH, and in response to an address controlling signal YAL, an address IA2 is outputted from the burst counter circuit BC4 on the address bus.

Figure 46B:
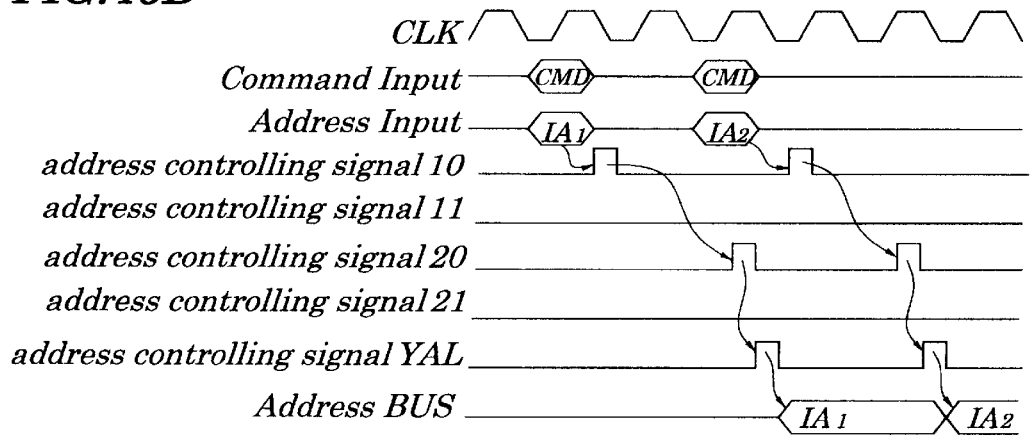

FIG. 46B shows that n=2 and, when an address controlling signal 10 is inputted by inputting of a first command and an address controlling signal 20 is inputted with a delay of 2 clocks, an address IA1 is held by the signal holding circuit SH, and in response to an address controlling signal YAL, an address IA1 is outputted from the burst counter circuit BC4 on the address bus and, by the second command, an address controlling signal 10 is inputted, and by inputting of an address controlling signal 20 with a delay of 2 clocks, an address IA2 is held by the signal holding circuit SH and, in response to an address controlling signal YAL, an address IA2 is outputted from the burst counter circuit BC4 on the address bus.

Figure 46C:
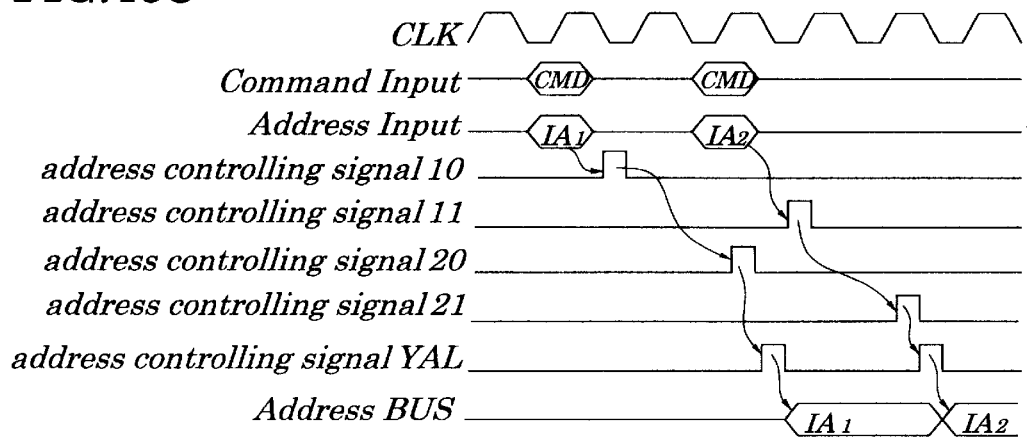

FIG. 46C shows that n=2 and, by inputting of an address controlling signal 10 induced by a first command and by inputting of an address controlling signal 20 with a delay of 2 clocks, an address IA1 is held by the signal holding circuit, and an address IA1 is outputted from the burst counter circuit BC4 on an address bus in response to an address controlling signal YAL, and by inputting of an address controlling signal induced by a second command and by inputting of an address controlling signal 21 with a delay of 2 clocks, an address IA2 is held by the signal holding circuit SH and, in response to an address controlling signal YAL, an address IA2 is outputted from the burst counter circuit BC4 on the address bus.

Figure 47A:
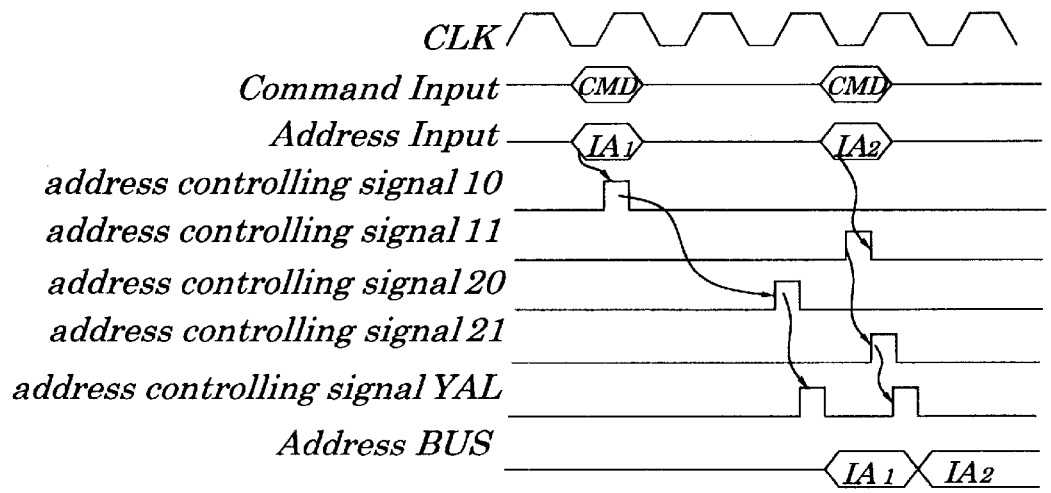
FIGS. 47A and 47B are timing charts showing an example (2) of operations of the burst counter of the semiconductor memory device.
Figure 47B:
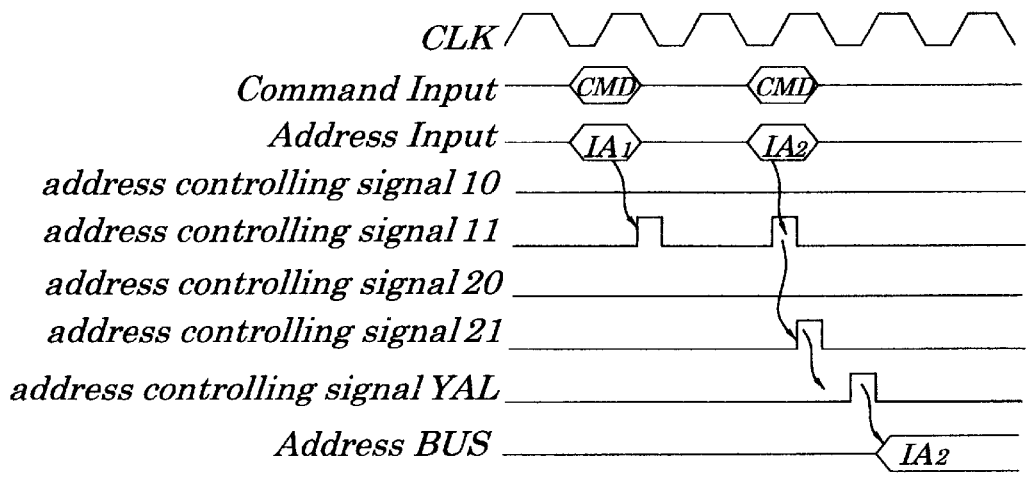

FIGS. 47A and 47B are timing charts showing examples of operations of the burst counter shown in 44A through 44C. FIG. 47A shows that n=2 and by inputting of an address controlling signal 10 induced by a first command and by inputting of an address controlling signal 20 with a delay of 2 clocks, an address IA1 is held by the signal holding circuit SH and, in response to an address controlling signal YAL, an address IA1 is outputted from the burst counter circuit BC4 on the address bus, and by inputting of an address controlling signal 11 induced by a second command and by an immediate inputting of an address controlling signal 21, an address IA2 is held by the signal holding circuit SH and in response to an address controlling signal YAL, an address IA2 is outputted from the burst counter circuit BC4 on the address bus.

FIG. 47B shows that n=2 and, when an address controlling signal 11 is turned on by inputting of a first command and an address controlling signal 11 is also turned on by inputting of a second command, causing a collision to occur between an address controlling signal 21 generated by a first command with a delay of 2 clocks and the address controlling signal 21 generated immediately after the inputting of the first command; however, because a second command is preferentially inputted and an address controlling signal 21 is inputted, an address IA2 is held by the signal holding circuit SH and an address IA2 is outputted by the burst counter circuit BC4 in response to an address controlling signal YAL on an address bus.

Figure 48A:
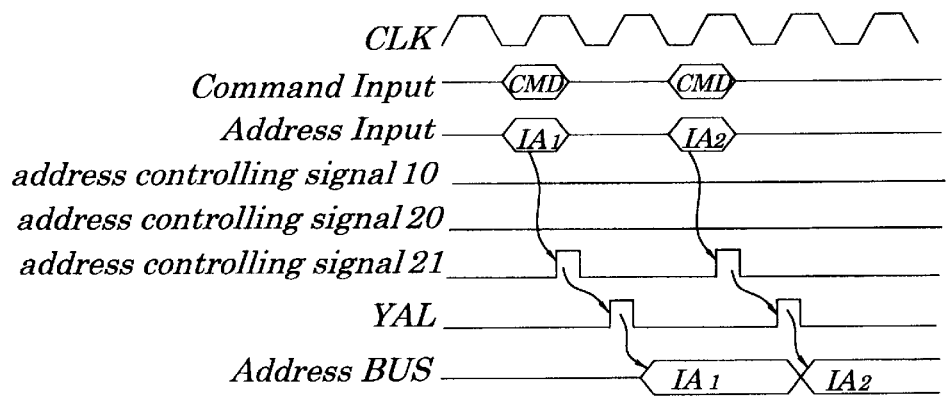
FIGS. 48A through 48C are timing charts showing an example (3) of operations of the burst counter of the semiconductor memory device.
Figure 48B:
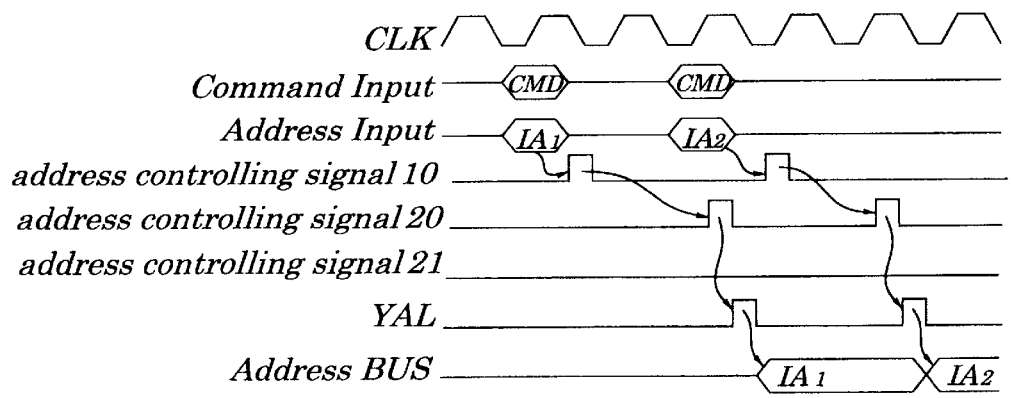
Figure 48C:
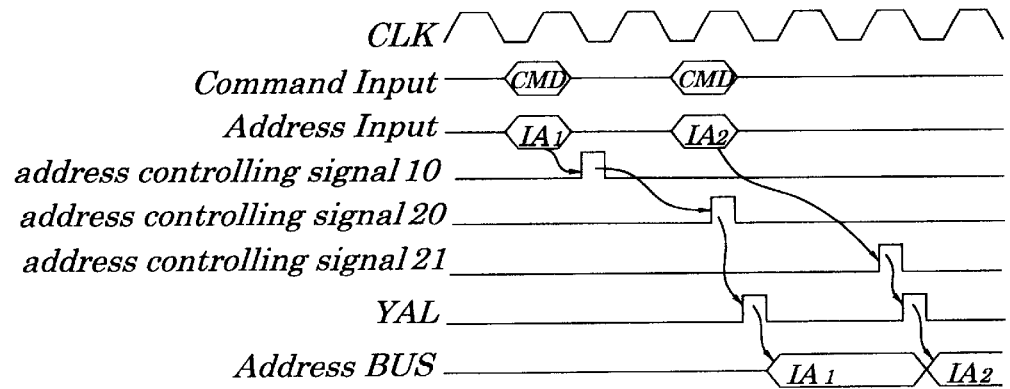

FIGS. 48A through 48C are timing charts showing examples of operations of the burst counter shown in 45A through 45C.

FIG. 48A shows that n=2 and by sequential inputting of addresses IA1 and IA2 into the latching circuit B and by inputting of an address controlling signal 21 induced by inputting of a first command, an address IA1 is held by the signal holding circuit SH and, in response to an address controlling signal YAL, an address IA1 is outputted from the burst counter circuit BC4 on an address bus, and by inputting of an address controlling signal 21 induced by inputting of a second command, an address IA2 is held by the signal holding circuit SH and in response to the address controlling signal YAL an address IA2 is outputted from the burst counter circuit BC4 on the address bus.

FIG. 48B shows that n=2 and by inputting of an address controlling signal 10 induced by inputting of a first command and by inputting of an address controlling signal 20 with a delay of 2 clocks, an address IA1 is held by the signal holding circuit SH and in response to an address controlling signal YAL an address IA1 is outputted from the burst counter circuit BC4 on an address bus, and by inputting of an address controlling signal 10 induced by inputting of a second command and by inputting of an address controlling signal 20 with a delay of 2 clocks, an address IA2 is held by the signal holding circuit SH and in response to an address controlling signal YAL an address IA2 is outputted from the burst counter circuit BC4 on the address bus. In this case, because an address controlling signal 21 is not inputted, an address output is not generated from the latching circuit B.

FIG. 48C shows that n=2 and, by inputting of an address selecting signal 10 in response to a first command and of an address controlling signal 20 with a delay of 2 clocks, an address IA2 stored in a latching circuit is held by a signal holding circuit SH and an address IA1 is outputted from a burst holding circuit in response to an address controlling YAL, and by inputting of an address controlling signal 21 with a delay of 2 clocks after inputting of a second command, the address IA2 stored in the latching circuit is held in the signal holding circuit SH and, in response to an address controlling signal YAL, the address IA2 is outputted from the burst counter circuit BC4 on the address bus.

Figure 49A:
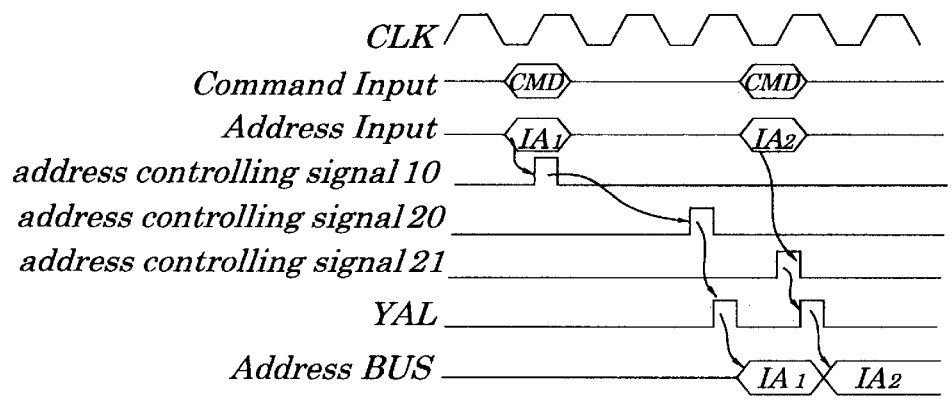
FIGS. 49A and 49B are timing charts showing an example (4) of operations of the burst counter of the semiconductor memory device.
Figure 49B:
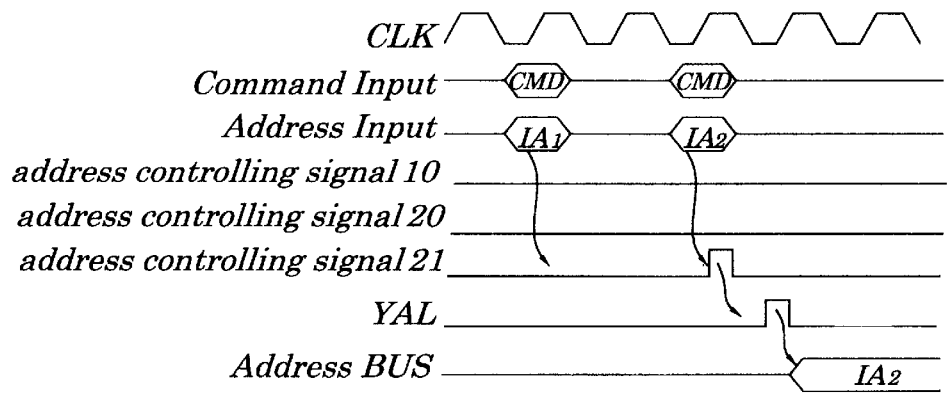

FIGS. 49A through 49C are timing charts showing examples of operations of the burst counter shown in 45A through 45C.

FIG. 49A shows that n=3 and, by inputting of an address selecting signal 10 in response to a first command and of an address controlling signal 20 with a delay of 2 clocks, an address IA1 stored in the latching circuit is held by the signal holding circuit SH and the address IA1 is outputted from the burst counter circuit BC4 in response to an address controlling signal YAL on the address bus and an address selecting signal 21 is outputted in response to a second command, an address IA2 stored in the latching circuit B is held by the signal holding circuit SH and the address IA2 is outputted by the burst counter circuit BC4 on the address bus.

FIG. 49B shows that n=2 and, though a collision occurs between an address controlling signal 21 generated 2 clocks later after inputting of a first command and between the address controlling signal 21 generated immediately after inputting of a second command, the second command is preferentially inputted causing the address controlling signal to be inputted and, as a result, an address IA2 is held by the signal holding circuit SH and an address IA2 is outputted from the burst counter circuit BC4 on the address bus in response to an address controlling signal YAL.

Thus, according to the semiconductor memory device of this embodiment, it is possible to perform holding of two or more addresses and outputting of selected addresses corresponding to kinds of commands with a sufficient operational margin.

Moreover, according to the embodiment, in a semiconductor memory device having various address inputs, flexible selection of addresses and setting of address output timing are possible. Additionally, it is possible to re-arrange captured address inputs in an arbitrary order.

As described above, according to one configuration of the semiconductor memory device of the present invention, a controlling means used to control the timing of operating a memory section and supplying an address to the memory section in response to an external command, is adapted to generate a first controlling signal after a first period following inputting of a write command and a second controlling signal after a second period following inputting of a read command and an operation instructing signal to be fed to the column controlling means in response to the first and second controlling signals; an address outputting means used to generate an address output using an external address inputs to be outputted to the memory section in accordance with a controlling signal fed from the controlling means, is adapted to make an input address delayed by a first period and by a second period and to output the address delayed by the first period as a write address in response to the first controlling signal and to output the address delayed by the second period as a read address in response to the second controlling signal; and a column control means is adapted to start outputting a write operation controlling signal and a read operation controlling signal to be fed to the memory section in response to an operation instructing signal given by the controlling means, thus allowing holding of two or more addresses, selection of outputting of addresses corresponding to kinds of commands with a sufficient operational margin and in a semiconductor memory device having various inputs, flexible selection of addresses and setting of address outputting timing are made possible.

Also, according to another configuration of the semiconductor memory device of the present invention, a controlling means used to control the timing of operating a memory section and supplying an address to the memory section, in response to an external command, is adapted to generate a controlling signal after a first period following inputting of a write command and after a second period following inputting of a read command and to generate a selecting signal which reverses in sign between at the time of inputting of a read command and at the time of inputting of a write command; an address outputting means used to generate an operation instructing signal to be outputted to a column controlling means in accordance with a controlling signal and an address output by external address input to a memory section in accordance with a controlling signal fed from the controlling means, is adapted to make an input address delayed by a first period and by a second period and to select the address delayed by the first period or the address delayed by the second period in response to a selecting signal and to output a write or read address with a timing defined by the controlling signal ; and a column control means is adapted to start outputting a write operation controlling signal and a read operation controlling signal in response to an operational instruction given by the controlling means, thus allowing holding of two or more addresses, selection of outputting of addresses corresponding to kinds of commands with a sufficient operational margin and in a semiconductor memory device having various inputs, flexible selection of addresses and setting of address outputting timing are made possible.

Moreover, according to further configuration of the semiconductor memory device of the present invention, a controlling means used to control the timing of operating a memory section and supplying an address to the memory section, in response to an external command, is adapted to generate a first controlling signal at the time of the occurrence of a write command, a second controlling signal after a first period following inputting of a write command, a third controlling signal at the time of the occurrence of a read command and a fourth controlling signal after the second period following the occurrence of a read command and an operation instructing signal to be fed to a column controlling means in response to the second and fourth controlling signals; an address outputting means used to generate an address output using an external address input to be outputted to the memory section in accordance with a controlling signal fed from a controlling means, is adapted to latch an input address in response to a first controlling signal, to output the latched signal as a write address in response to a second controlling signal, and to latch the input address in response to a third controlling signal and to output the latched signal as a read address in response to a fourth controlling signal; and a column control means is adapted to start outputting a write operation controlling signal and a read operation controlling signal in response to an operation instructing signal given by a controlling means, thus allowing holding of two or more addresses, selection of outputting of addresses corresponding to kinds of commands with a sufficient operational margin and in a semiconductor memory device having various inputs, flexible selection of addresses and setting of address outputting timing are made possible and further the captured address input can be re-arranged in an arbitrary sequence.

Furthermore, according to another configuration of the semiconductor memory device of the present invention, a control means used to control the timing of operating a memory section and supplying an address to the memory section, in response to an external command, is adapted to generate a first controlling signal at the time of the occurrence of a write command, a second controlling signal after a first period following inputting of a write command, a third controlling signal at the time of the occurrence of a read command, a fourth controlling signal after a second period following the occurrence of a read command, a fifth controlling signal at the time of the occurrence of the second and fourth controlling signals, and an operation instructing signal to be fed to a column control means in response to the second and fourth controlling signals; and an address outputting means used to generate an address output using an external address input to be outputted to a memory section in accordance with a controlling signal fed from a controlling means, is adapted to latch an input address in response to a first controlling signal and hold it in the signal holding means in response to a second controlling signal and then to latch an input address in response to the third controlling signal and to hold it in the signal holding means in response to the fourth controlling signal, and to output the address held by the signal holding means in response to the fifth controlling signal as a write address or read address; and a column control means is adapted to start outputting a write operation controlling signal and a read operation controlling signal in response to an operation instructing signal given by a controlling means, thus allowing holding of two or more addresses, selection of outputting of addresses corresponding to kinds of commands with a sufficient operational margin and in a semiconductor memory device having various inputs, flexible selection of addresses and setting of address outputting timing are made possible and further the captured address input can be re-arranged in an arbitrary sequence.

It is apparent that the present invention is not limited to the above embodiments but may be changed and modified without departing from the scope and spirit of the invention. For example, in the burst counter of the fourth embodiment shown in FIGS. 45A through 46C, by a branched output from latching circuit groups indicated by an arrow, the timing defined by the address controlling signal 2j may be operated by other not-shown circuit. This is because, in the case of the fourth embodiment, timing is provided by using the address controlling signal YAL to control the address output fed by the burst counter. Moreover, if it is required that, in each embodiment, writing of data by the write command be preferentially performed rather than reading of data by the read command, a node may be connected, in a circuit of the command decoder in each embodiment, to a rear step portion by replacing the node A with the node B or vice versa.

As described above, according to the semiconductor memory device of this embodiment, it is possible to perform holding of two or more addresses and outputting of selected addresses corresponding to kinds of commands with a sufficient operational margin and to provide flexible selection of addresses and setting of address output timing in a semiconductor memory device having various address inputs, which are required in standardization of the DDR-SDRAM.

Additionally, it is possible to re-arrange captured address inputs in an arbitrary order.

Finally, the present application claims the priority based on Japanese Patent Application No. Hei10-307645 filed on Oct. 28, 1998, which is herein incorporated by reference.

What is claimed is:

1. A semiconductor memory device comprising:

a controlling means to control the timing of operating a memory section and supplying an address to said memory section in response to an external command;

an address outputting means to generate an address output using an external address input to be outputted to said memory section in accordance with a controlling signal fed from said controlling means; and a column control means to start outputting a write operation controlling signal and a read operation controlling signal to be fed to said memory section in response to an operation instructing signal given by said controlling means;

whereby said controlling signal comprises a first controlling signal after a first period following an inputting of a read command, and a second controlling signal after a second period following an inputting of a write command and whereby said operation instructing signal to be fed to said column control means is generated in accordance with said first and second controlling signals; and said address outputting means delays an input address by said first and second periods and outputs an address delayed bN, said first period as a read address in accordance with said first controlling signal and said address delayed by said second period as a write address in accordance with said second controlling signal.

2. The semiconductor memory device according to claim 1, wherein said controlling means has a first signal generating means to generate said first controlling signal after said first period following an inputting of a read command in accordance with an external command and a second signal generating means to generate said second controlling signal after said second period following an inputting of a write command in accordance with an external command.

3. The semiconductor memory device according to claim 1, wherein said controlling means is so configured that, when a collision occurs between said first and second controlling signals, said first controlling signal only is outputted preferentially.

4. The semiconductor memory device according to claim 1, wherein said address outputting means is so configured that it has one or more delaying means to make an input address delayed and it makes an input address delayed by said first or second period and selects an output of said delaying means used to make an input address delayed by said first period to read and output it as a read address in accordance with said first controlling signal while selecting an output of said delaying means used to make an input address delayed by said second period to read and output it as a write address in accordance with said second controlling signal.

5. The semiconductor memory device according to claim 1, wherein said address outputting means is so configured that it has a delaying means used to make an input address delayed by said first or second period and it makes an input address delayed by said first period and selects a signal in accordance with a first controlling signal to output it as a read address while making an address input delayed by said second period and selecting a signal in accordance with said second controlling signal to output it as a write address.

6. The semiconductor memory device according to claim 1, wherein said first period is an arbitrary clock period including zero and said second period is an arbitrary clock period being longer by a specified clock period than said first period.

7. The semiconductor memory device according to claim 4, wherein said delaying means is comprised of register circuits holding a signal for one clock period which are connected, in series, by the number of circuits corresponding to said first or second period including zero.

8. The semiconductor memory device according to claim 1, wherein said controlling means is so configured that, when a collision occurs between said first and second controlling signals, said second controlling signal only is outputted preferentially.

9. The semiconductor memory device according to claim 1, wherein said controlling means is so configured that, when a collision occurs between another controlling signal generated in response to a command other than said read command and write command and said first or second controlling signal, said another controlling signal only is outputted preferentially.

10. A semiconductor memory device comprising:

a controlling means to control a timing of operating a memory section and supplying an address to said memory section in response to an external command;

an address outputting means to generate an address output using an external address input to be outputted to said memory section in accordance with a controlling signal fed from said controlling means; and a column control means to start outputting a write operation controlling signal and a read operation controlling signal to be fed to said memory section in response to an operation instructing signal given by said controlling means;

whereby said controlling means generates said controlling signal after a first period following inputting of a read command and after a second period following an inputting of a write command, a selecting signal which reverses in sign between at a time of inputting of a read command and at a time of inputting of a write command and an operation instructing signal to be fed to said column controlling means in accordance with said controlling signal; and said address outputting means makes an input address delayed by first and second periods, selects an address delayed by said first period or second period in accordance with said selecting signal and outputs it as a read address or write address with a timing defined by said controlling signal.

11. The semiconductor memory device according to claim 10, wherein said controlling means has a controlling signal generating means to generate said controlling signal after said first period following an inputting of a read command in accordance with an external command and after said second period following an inputting of a write command in accordance with an external command and a selecting signal generating means to generate a selecting signal which reverses in sign between at a time of inputting of a read command and at a time of inputting of a write command.

12. The semiconductor memory device according to claim 10, wherein said controlling means is so configured that, when a collision occurs between a controlling signal generated in accordance with said write command and a controlling signal generated in accordance with said read command, said controlling signal only is preferentially outputted in accordance with said read command.

13. The semiconductor memory device according to claim 10, wherein said address outputting means is provided with one or more delaying means to make an input address delayed by said first period or by second period and wherein it outputs a signal selected out of outputs including an output of said delaying means used to make said input address delayed by said first period and an output of said delaying means used to make said input address delayed by said second period in accordance with said selecting signal as a read address or a write address with a timing of said controlling signal.

14. The semiconductor memory device according to claim 10, wherein said address outputting means is provided with a delaying means used to make an input address delayed by said first period and by said second period and wherein it generates an output selected, in accordance with said controlling signal, out of signals including a signal obtained by making an input address delayed by said first period or a signal obtained by making an input address delayed by said second period, as a read address or as a write address with a timing of said controlling signal.

15. The semiconductor memory device according to claim 10, wherein said first period is an arbitrary clock period including zero and said second period is an arbitrary clock period being longer by a specified clock period than said first period.

16. The semiconductor memory device according to claim 13, wherein each of said delaying means is comprised of register circuits to hold a signal for one clock period which are connected, in series, by the number of circuits corresponding to said first or second period including zero.

17. The semiconductor memory device according to claim 10, wherein said controlling means is so configured that, when a collision occurs between said first and second controlling signals, said second controlling signal only is outputted preferentially.

18. The semiconductor memory device according to claim 10, wherein said controlling means is so configured that, when a collision occurs between another controlling signal generated in response to a command other than said read command and said write command and said first and second controlling signals, said another controlling signal only is outputted preferentially.

19. A semiconductor memory device comprising:
a controlling means to control a timing of operating a memory section and supplying an address to said memory section in response to an external command;
an address outputting means to generate an address output using an external address input to be outputted to said memory section in accordance with a controlling signal fed from said controlling means; and
a column control means to start outputting a write operation controlling signal and a read operation controlling signal to be fed to said memory section in response to an operation instructing signal given by said controlling means;
whereby said controlling signal comprises a first controlling signal at a time of occurrence of a read command, a second controlling signal after a first period following occurrence of said read command, a third controlling signal at a time of occurrence of a write command, and a fourth controlling signal after a second period following occurrence of said write command, and whereby said operation instructing signal to be fed to said column control means is generated in accordance with said second controlling signal and said fourth controlling signal;
said address outputting means is used to latch an input address in accordance with said first controlling signal, to output a latched signal as a read address in accordance with said second controlling signal, to latch an input address in accordance with said third controlling signal and to output a latched signal as a write address in accordance with a fourth controlling signal.

20. The semiconductor memory device according to claim 19, wherein said controlling means has a first signal generating means to generate said first controlling signal at a time of inputting of a write command in response to an external command, a second signal generating means to generate said second controlling signal after said first period following occurrence of said read command in response to an external command, a third signal generating means to generate said third controlling signal at a time of inputting of a write command in response to an external command, and a fourth signal generating means to generate said fourth controlling signal after said second period following occurrence of said write command in response to an external command.

21. The semiconductor memory device according to claim 19, wherein said controlling means is so configured that, when a collision occurs between said second and fourth controlling signals, said second controlling signal only is outputted preferentially.

22. The semiconductor memory device according to claim 19, wherein said address outputting means contains a first delaying means used to latch an input address in accordance with said first controlling signal and to output a latched signal as a read address in accordance with said second controlling signal and a second delaying means used to latch an input address in accordance with said third controlling signal and to output a latched signal as a write address in accordance with said fourth controlling signal.

23. The semiconductor memory device according to claim 22, wherein said address outputting means is so configured that it is provided with respectively one or more said first delaying means and said second delaying means so as to output a read address and/or write address by using an output of an arbitrary delaying means.

24. The semiconductor memory device according to claim 22, wherein said address outputting means is provided with said first delaying means and said second delaying means used to latch an input address at each time of occurrence of an input address so as to output a read address or a write address in accordance with said second controlling signal or said fourth controlling signal.

25. The semiconductor memory device according to claim 19, wherein said first period is an arbitrary clock period including zero and said second period is an arbitrary clock period being longer by a specified clock period than said first period.

26. The semiconductor memory device according to claim 22, wherein each of delaying means is comprised of a latching circuit used to latch an input signal in response to said first controlling signal or said second controlling signal or to latch an input signal at each time of occurrence of an input signal and to output a latched signal in accordance with said third or fourth controlling signal.

27. The semiconductor memory device according to claim 19, wherein said controlling means is so configured that, when a collision occurs between said second and fourth controlling signals, said fourth controlling signal only is outputted preferentially.

28. The semiconductor memory device according to claim 19, wherein said controlling means is so configured that, when a collision occurs between another controlling signal generated in response to a command other than said read command and said write command and said second and fourth controlling signals, said another controlling signal only is outputted preferentially.

29. A semiconductor memory device comprising:

a controlling means to control a timing of operating a memory section and supplying an address to said memory section in response to an external command;

an address outputting means to generate an address output using an external address input to be outputted to said memory section in accordance with a controlling signal fed from said controlling means; and a column control means to start outputting a write operation controlling signal and a read operation controlling signal to be fed to said memory section in response to an operation instructing signal given by said controlling means;

whereby said controlling signal comprises a first controlling means at a time of occurrence of a read command, a second controlling signal after a first period following occurrence of said read command, a third controlling signal at a time of occurrence of a write command, a fourth controlling signal after a second period following occurrence of said write command, and further a fifth controlling signal at a time of occurrence of said second and fourth controlling signals, and whereby said operation instructing signal to be fed to said column controlling means is generated in accordance with said second and fourth controlling signals;

said address outputting means latches an input address in accordance with said first controlling signal and hold a latched signal in a signal holding means in accordance with said second controlling signal, further latches an input address in accordance with said third controlling signal and holds a latched signal in said signal holding means in accordance with said fourth controlling signal, and then outputs an address held by said signal holding means in accordance with said fifth controlling signal as a read address or a write address.

30. The semiconductor memory device according to claim 29, wherein said controlling means contains a first signal generating means to generate, in response to an external command, said first controlling signal, a second signal generating means to generate said second controlling signal after said first period following occurrence of said read command in response to an external command, a third signal generating means to generate, in response to an external command, said third controlling signal at a time of occurrence of a write command, a fourth signal generating means to generate, in response to an external command, said fourth controlling signal after said second period following occurrence of said write command and a fifth signal generating means to generate a fifth controlling signal at a time of occurrence of said second and fourth controlling signals.

31. The semiconductor memory device according to claim 29, wherein said controlling means is so configured that, when a collision occurs between said second and fourth controlling signals, said second controlling signal only is outputted preferentially.

32. The semiconductor memory device according to claim 29, wherein said address outputting means is provided with a first delaying means used to latch an address input in response to said first controlling signal and to output a latched signal in response to said second controlling signal and a second delaying means used to latch an input address in response to said third controlling signal and to output a latched signal in response to said fourth controlling signal so as to output a read address and a write address by using an output from said first or second delaying means with a timing of said fifth controlling signal.

33. The semiconductor memory device according to claim 32, wherein said address outputting means is so configured that it is provided with respectively one or more said first delaying means and said second delaying means so as to output a read address and/or write address by using an output of an arbitrary delaying means.

34. The semiconductor memory device according to claim 32, wherein said address outputting means is provided with said first and second delaying means used to latch an input address at each time of occurrence of an input address so as to output a read address or a write address in accordance with said second controlling signal or said fourth controlling signal.

35. The semiconductor memory device according to claim 29, wherein said first period is an arbitrary clock period including zero and said second period is an arbitrary clock period being longer by a specified clock period than said first period.

36. The semiconductor memory device according to claim 32, wherein each of delaying means is comprised of a latching circuit used to latch an input signal in response to said first controlling signal or said second controlling signal or to latch an input signal at each time of occurrence of an input signal and to output a latched signal in accordance with said third or fourth controlling signal.

37. The semiconductor memory device according to claim 29, wherein said controlling means is so configured that, when a collision occurs between said second and fourth controlling signals, said fourth controlling signal only is outputted preferentially.

38. The semiconductor memory device according to claim 29, wherein said controlling means is so configured that, when a collision occurs between another controlling signal generated in response to a command other than said read command and said write command and said second and fourth controlling signals, said another controlling signal only is outputted preferentially.

* * * * *

UNITED STATES PATENT AND TRADEMARK OFFICE
CERTIFICATE OF CORRECTION

PATENT NO.    : 6,178,139 B1
DATED         : January 23, 2001
INVENTOR(S)   : Atsunori Hirobe and Kyoichi Nagata It is certified that error appears in the above-identified patent and that said Letters Patent is hereby corrected as shown below:

<u>Column 43, claim 1,</u>
Line 24, change "bN," to -- by --.

Signed and Sealed this

Twenty-sixth Day of March, 2002

*Attest:*

JAMES E. ROGAN
*Attesting Officer*    *Director of the United States Patent and Trademark Office*